(12) United States Patent
Chen et al.

(10) Patent No.: US 11,901,424 B2
(45) Date of Patent: Feb. 13, 2024

(54) SEMICONDUCTOR DEVICE

(71) Applicant: TAIWAN SEMICONDUCTOR MANUFACTURING CO., LTD., Hsinchu (TW)

(72) Inventors: Shih-Cheng Chen, New Taipei (TW); Chun-Hsiung Lin, Hsinchu County (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/853,709

(22) Filed: Jun. 29, 2022

(65) Prior Publication Data

US 2022/0336601 A1    Oct. 20, 2022

Related U.S. Application Data

(62) Division of application No. 16/886,572, filed on May 28, 2020, now Pat. No. 11,380,768.

(51) Int. Cl.
| | | |
|---|---|---|
| *H01L 29/417* | (2006.01) | |
| *H01L 21/762* | (2006.01) | |
| *H01L 21/764* | (2006.01) | |
| *H01L 21/768* | (2006.01) | |
| *H01L 29/40* | (2006.01) | |
| *H01L 21/8238* | (2006.01) | |
| *H01L 23/522* | (2006.01) | |

(52) U.S. Cl.
CPC ...... *H01L 29/41791* (2013.01); *H01L 21/764* (2013.01); *H01L 21/7682* (2013.01); *H01L 21/76232* (2013.01); *H01L 21/76843* (2013.01); *H01L 21/823821* (2013.01); *H01L 21/823871* (2013.01); *H01L 21/823878* (2013.01); *H01L 23/5226* (2013.01); *H01L 29/401* (2013.01)

(58) Field of Classification Search
CPC ....... H01L 29/41791; H01L 21/823821; H01L 21/823871; H01L 21/823418
See application file for complete search history.

(56) References Cited

U.S. PATENT DOCUMENTS

| | | |
|---|---|---|
| 9,105,490 B2 | 8/2015 | Wang et al. |
| 9,209,247 B2 | 12/2015 | Colinge et al. |
| 9,236,267 B2 | 1/2016 | De et al. |
| 9,236,300 B2 | 1/2016 | Liaw |
| 9,406,804 B2 | 8/2016 | Huang et al. |
| 9,412,817 B2 | 8/2016 | Yang et al. |
| 9,412,828 B2 | 8/2016 | Ching et al. |
| 9,443,769 B2 | 9/2016 | Wang et al. |
| 9,472,618 B2 | 10/2016 | Oxland |

(Continued)

*Primary Examiner* — Bac H Au
(74) *Attorney, Agent, or Firm* — Maschoff Brennan

(57) ABSTRACT

A device includes an active region, a gate structure, a source/drain epitaxial structure, an epitaxial layer, a metal alloy layer, a contact, and a contact etch stop layer. The gate structure is across the active region. The source/drain epitaxial structure is over the active region and adjacent the gate structure. The epitaxial layer is over the source/drain epitaxial structure. The metal alloy layer is over the epitaxial layer. The contact is over the metal alloy layer. The contact etch stop layer lines sidewalls of the source/drain epitaxial structure. The metal alloy layer is spaced apart from the contact etch stop layer.

20 Claims, 41 Drawing Sheets

(56) References Cited

U.S. PATENT DOCUMENTS

| | | |
|---|---|---|
| 9,502,265 B1 | 11/2016 | Jiang et al. |
| 9,520,482 B1 | 12/2016 | Chang et al. |
| 9,536,738 B2 | 1/2017 | Huang et al. |
| 9,548,366 B1 | 1/2017 | Ho et al. |
| 9,576,814 B2 | 2/2017 | Wu et al. |
| 9,608,116 B2 | 3/2017 | Ching et al. |
| 9,831,183 B2 | 11/2017 | Lin et al. |
| 9,859,386 B2 | 1/2018 | Ho et al. |
| 10,340,190 B2 | 7/2019 | Lu |
| 10,566,246 B1 | 2/2020 | Wu |
| 10,854,716 B2 | 12/2020 | Wang |
| 10,868,181 B2 | 12/2020 | Li |
| 11,037,924 B2 | 6/2021 | Koh |
| 11,133,416 B2 | 9/2021 | Lin |
| 2016/0064483 A1 | 3/2016 | Kelly |
| 2016/0365426 A1* | 12/2016 | Ching .................. H01L 29/785 |
| 2017/0053916 A1 | 2/2017 | Ching |
| 2017/0287843 A1 | 10/2017 | Wu |
| 2018/0174913 A1 | 6/2018 | More |
| 2018/0315647 A1 | 11/2018 | Wang |
| 2019/0097006 A1* | 3/2019 | Li ..................... H01L 29/66795 |
| 2019/0164835 A1* | 5/2019 | Lu .................... H01L 29/41791 |
| 2019/0165124 A1 | 5/2019 | More |
| 2019/0172752 A1 | 6/2019 | Hsu |
| 2019/0296124 A1 | 9/2019 | Hsu |
| 2019/0333820 A1 | 10/2019 | Chang |
| 2019/0371898 A1 | 12/2019 | Huang |
| 2020/0035549 A1 | 1/2020 | Wu |
| 2020/0098572 A1 | 3/2020 | Wang |
| 2020/0105867 A1* | 4/2020 | Lee ................. H01L 21/823864 |
| 2020/0119180 A1 | 4/2020 | Frougier |

* cited by examiner

M

US 11,901,424 B2

SEMICONDUCTOR DEVICE

PRIORITY CLAIM AND CROSS-REFERENCE

This present application is a divisional application of U.S. patent application Ser. No. 16/886,572, filed on May 28, 2020, now U.S. Pat. No. 11,380,768, issued on Jul. 5, 2022, which is herein incorporated by reference in their entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
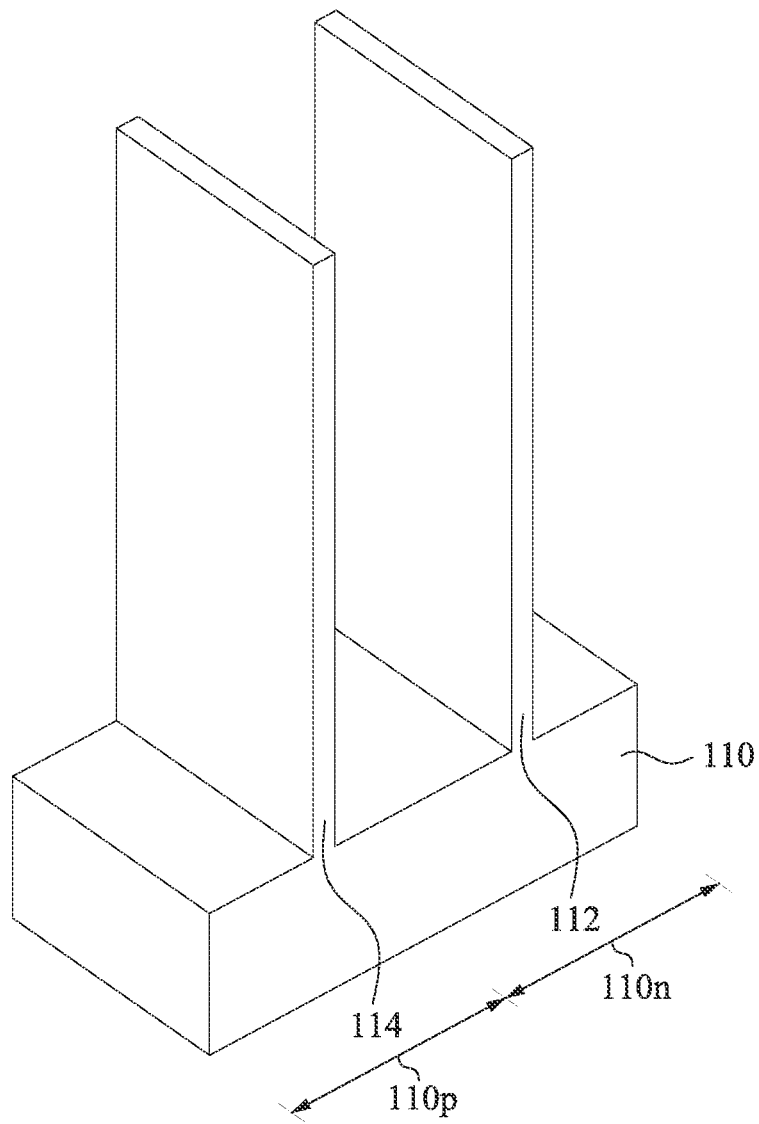
FIGS. 1-23B illustrate a method for manufacturing a semiconductor device at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Some embodiments of the present disclosure relate to semiconductor devices having improved epitaxial and metal alloy structures to improve the contact resistance between source/drain structure and a contact thereon. Although some implementations are illustrated below with regards to FinFETs, it will be appreciated that this concept is not limited to FinFETs, but is also applicable to other types of devices such as MOSFETs, HGAA devices, and the like.

FIGS. 1-23B illustrate a method for manufacturing a semiconductor device at various stages in accordance with some embodiments of the present disclosure. In some embodiments, the semiconductor device shown in FIGS. 1-23B may be intermediate devices fabricated during processing of an integrated circuit (IC), or a portion thereof, that may include static random access memory (SRAM), logic circuits, passive components and/or active components, such as p-type field effect transistors (PFETs), n-type FETs (NFETs), multi-gate FETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

Reference is made to FIG. 1. A substrate 110 is provided. The substrate 110 includes at least one N-type region 110n and at least one P-type region 110p. At least one N-type device will be formed on the N-type region 110n, and at least one P-type device will be formed on the P-type region 110p. For ease of explanation, it is assumed that in FIGS. 1-23B, the substrate 110 includes one N-type region 110n and one P-type region 110p adjacent the N-type region 110n. In some embodiments, the substrate 110 may include silicon (Si). Alternatively, the substrate 110 may include germanium (Ge), silicon germanium (SiGe), gallium arsenide (GaAs) or other appropriate semiconductor materials. In some embodiments, the substrate 110 may include a semiconductor-on-insulator (SOI) structure such as a buried dielectric layer. Also alternatively, the substrate 110 may include a buried dielectric layer such as a buried oxide (BOX) layer, such as that formed by a method referred to as separation by implantation of oxygen (SIMOX) technology, wafer bonding, SEG, or another appropriate method. In various embodiments, the substrate 110 may include any of a variety of substrate structures and materials.

A plurality of semiconductor fins 112 and 114 are respectively formed over the N-type region 110n and the P-type region 110p of the substrate 110. The semiconductor fins 112 and 114 may serve as active regions (e.g., channels and source/drain features) of transistors. It is noted that the numbers of the semiconductor fins 112 and 114 in FIG. 1 are illustrative, and should not limit the claimed scope of the present disclosure. In addition, one or more dummy fins may be disposed adjacent both sides of the semiconductor fins 112 and/or 114 to improve pattern fidelity in patterning processes.

The semiconductor fins 112 and 114 may be formed, for example, by patterning and etching the substrate 110 using photolithography techniques. In some embodiments, a layer of photoresist material (not shown) is deposited over the substrate 110. The layer of photoresist material is irradiated (exposed) in accordance with a desired pattern (the semiconductor fins 112 and 114 in this case) and developed to remove a portion of the photoresist material. The remaining photoresist material protects the underlying material from subsequent processing operations, such as etching. It should be noted that other masks, such as an oxide or silicon nitride mask, may also be used in the etching process. The semiconductor fins 112 and 114 may be made of the same material as the substrate 110 and may continuously extend or protrude from the substrate 110. The semiconductor fins 112 and 114 may be intrinsic, or appropriately doped with an n-type impurity or a p-type impurity.

In some other embodiments, the semiconductor fins 112 and 114 may be epitaxially grown. For example, exposed portions of an underlying material, such as an exposed portion of the substrate 110, may be used in an epitaxial process to form the semiconductor fins 112 and 114. A mask may be used to control the shape of the semiconductor fins 112 and 114 during the epitaxial growth process.

Figure 2:
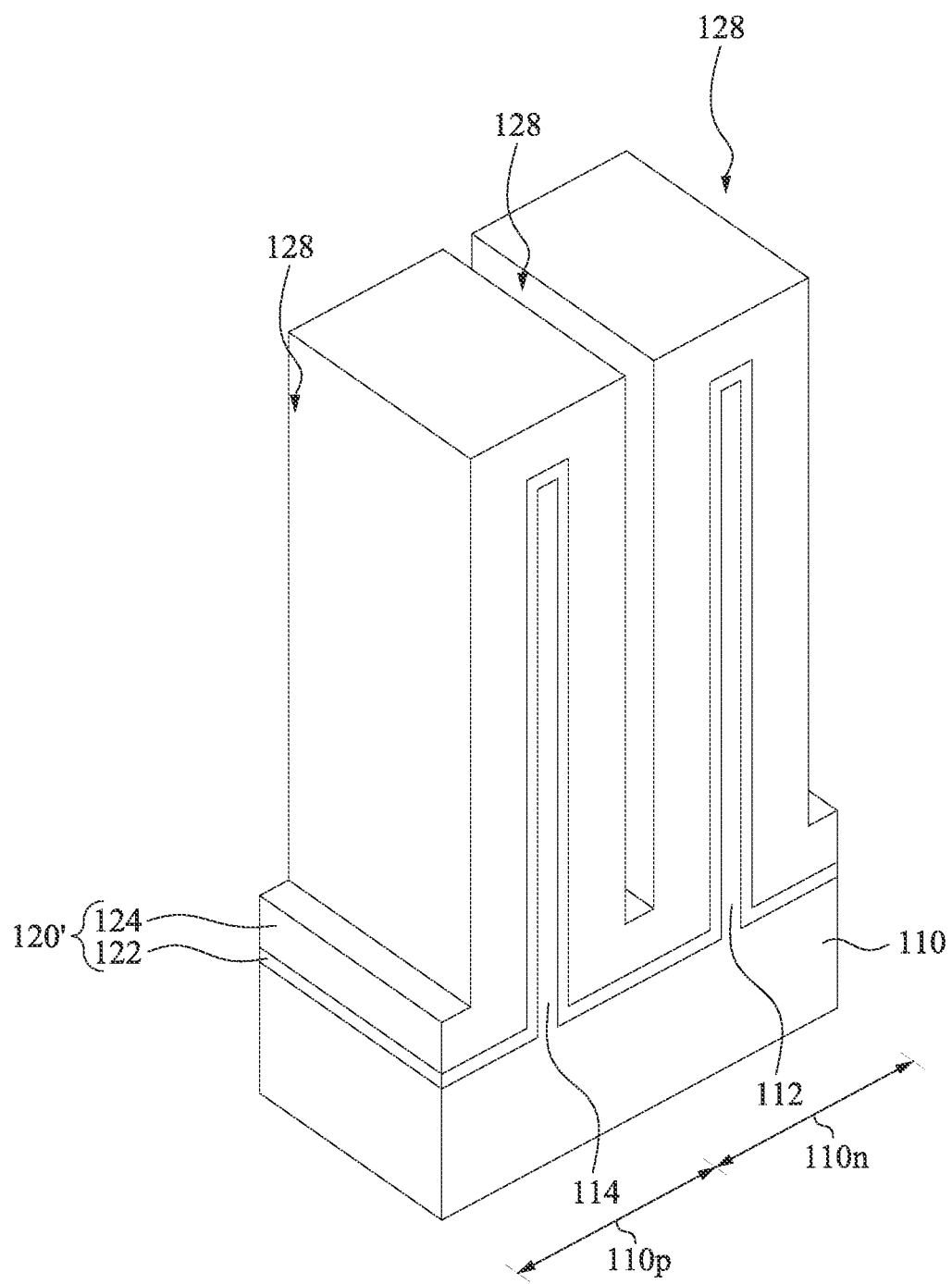

Reference is made to FIG. 2. Spacing layer material 120' is deposited on the exposed sidewalls and top planar surfaces of the semiconductor fins 112 and 114. In some embodiments, the spacing layer material 120' can be made of dielectric materials. In some embodiments, the spacing layer material 120' may be made of a dielectric material such as, for example, spin-on-glass, silicon nitride, silicon oxynitride, FSG, a low-k dielectric material, and/or other suitable insulating material. In some embodiments, the spacing layer material 120' is deposited by an ALD process. In some embodiments, the deposition of the spacing layer material 120' can be done by suitable processes such as, for example, plasma-enhanced ALD (PEALD), CVD, PVD, molecular beam epitaxy (MBE), high density plasma CVD (HDPCVD), metal organic (MOCVD), remote plasma CVD (RPCVD), PECVD, other suitable methods, and/or combinations thereof. The spacing layer material 120' can be deposited between the semiconductor fins 112 and 114 to form openings 128, in accordance with some embodiments. By choosing suitable processing deposition parameters, the openings 128 may be configured to create spaces for the subsequent deposition of self-aligned isolation fins.

In some embodiments, the spacing layer material 120' includes a first liner layer 122 and a second liner layer 124. The first liner layer 122 is in contact with the substrate 110 and may be a dielectric layer, such as silicon oxide, silicon nitride, silicon oxynitride, SiCN, $SiC_xO_yN_z$, or combinations thereof. The second liner layer 124 is on and in contact with the first liner layer 122 and may be a dielectric layer, such as silicon oxide, silicon nitride, silicon oxynitride, SiCN, $SiC_xO_yN_z$, or combinations thereof. The first liner layer 122 and the second liner layer 124 have different materials. For example, the first liner layer 122 is a nitride layer, and the second liner layer 124 is an oxide layer. In some embodiments, the first liner layer 122 is omitted. In some embodiments, the second liner layer 124 is thicker than the first liner layer 122.

Figure 3:
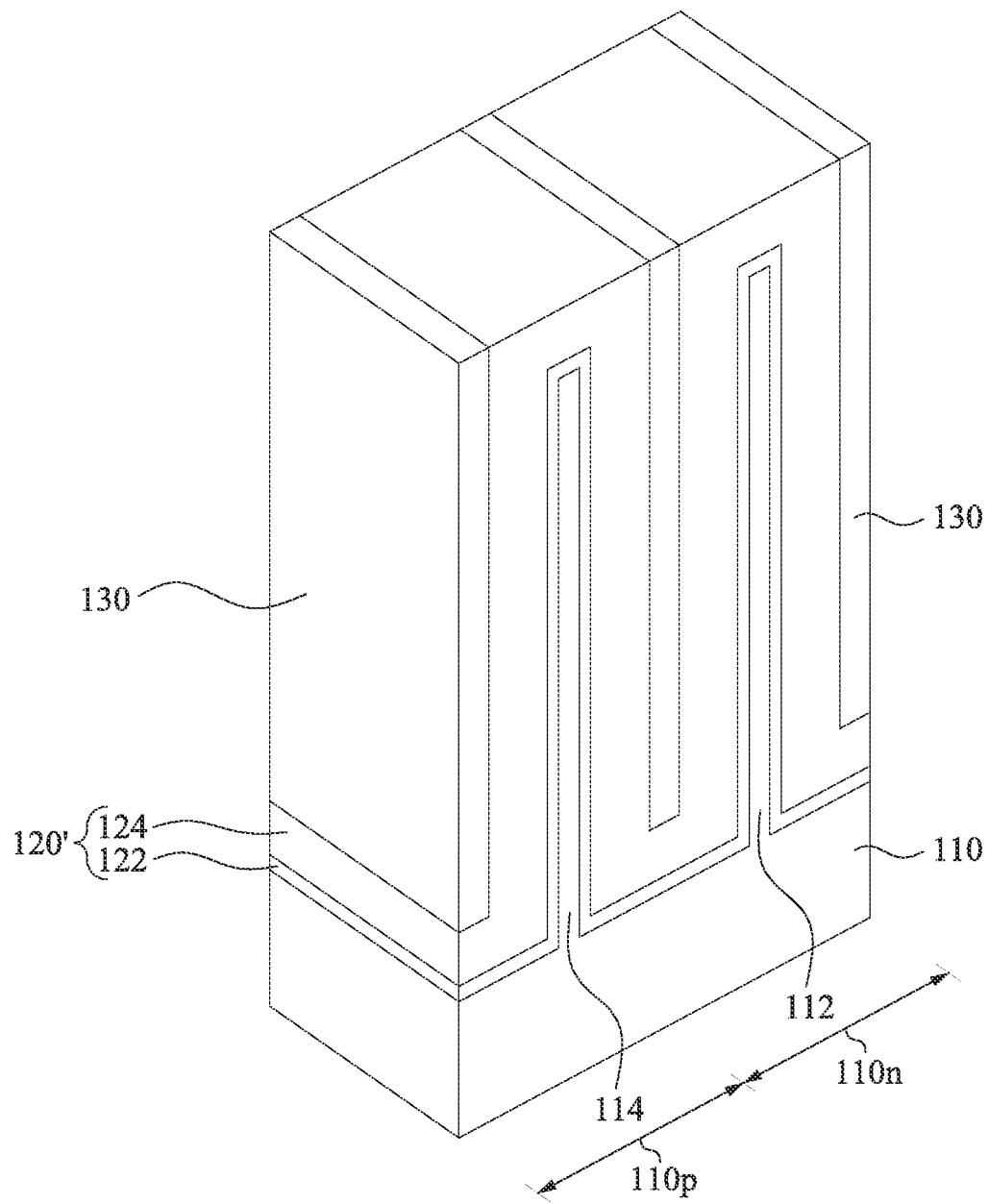

Reference is made to FIG. 3. Self-aligned isolation fins 130 are then formed in the openings 128 (see FIG. 2). In some embodiments, forming the self-aligned isolation fins 130 includes filling the openings 128 with a dielectric fin material. In some embodiments, filling of the openings 128 may be performed by an ALD process. In some embodiments, the openings 128 may be filled by suitable processes such as, for example, ALD, CVD, FCVD, PVD, MBE, HDPCVD, MOCVD, RPCVD, PECVD, other suitable methods, and/or combinations thereof. In some embodiments, the dielectric fin material may be deposited using an FCVD process followed by a subsequent ultra-violet (UV) curing and annealing process. In some embodiments, in-situ doping of carbon and/or nitrogen can be performed to cure or solidify the dielectric fin material during the FCVD process. In some embodiments, the dielectric fin material includes silicon oxynitride (SiON), silicon carbon nitride (SiCN), silicon oxygen carbon nitride (SiOCN), or metal oxides such as, for example, hafnium oxide ($HfO_2$), zirconium oxide ($ZrO_2$), aluminum oxide ($Al_2O_3$), other suitable metal oxides, and/or combinations thereof. In some embodiments, forming the self-aligned isolation fins 130 further includes performing a planarization step (e.g., a CMP step) to remove the excess dielectric materials on the upper surfaces of spacing layer material 120', so that the upper surfaces of the self-aligned isolation fins 130 and the upper surface of spacing layer material 120' are substantially coplanar. The deposition of dielectric fin material forms the self-aligned isolation fins 130 in the openings 128. The self-aligned isolation fins 130 are formed between the semiconductor fins 112 and 114. As the openings 128 are defined and formed prior to the deposition of dielectric fin material, no alignment process is needed when the dielectric fin material fills in the exposed opening 128.

Figure 4:
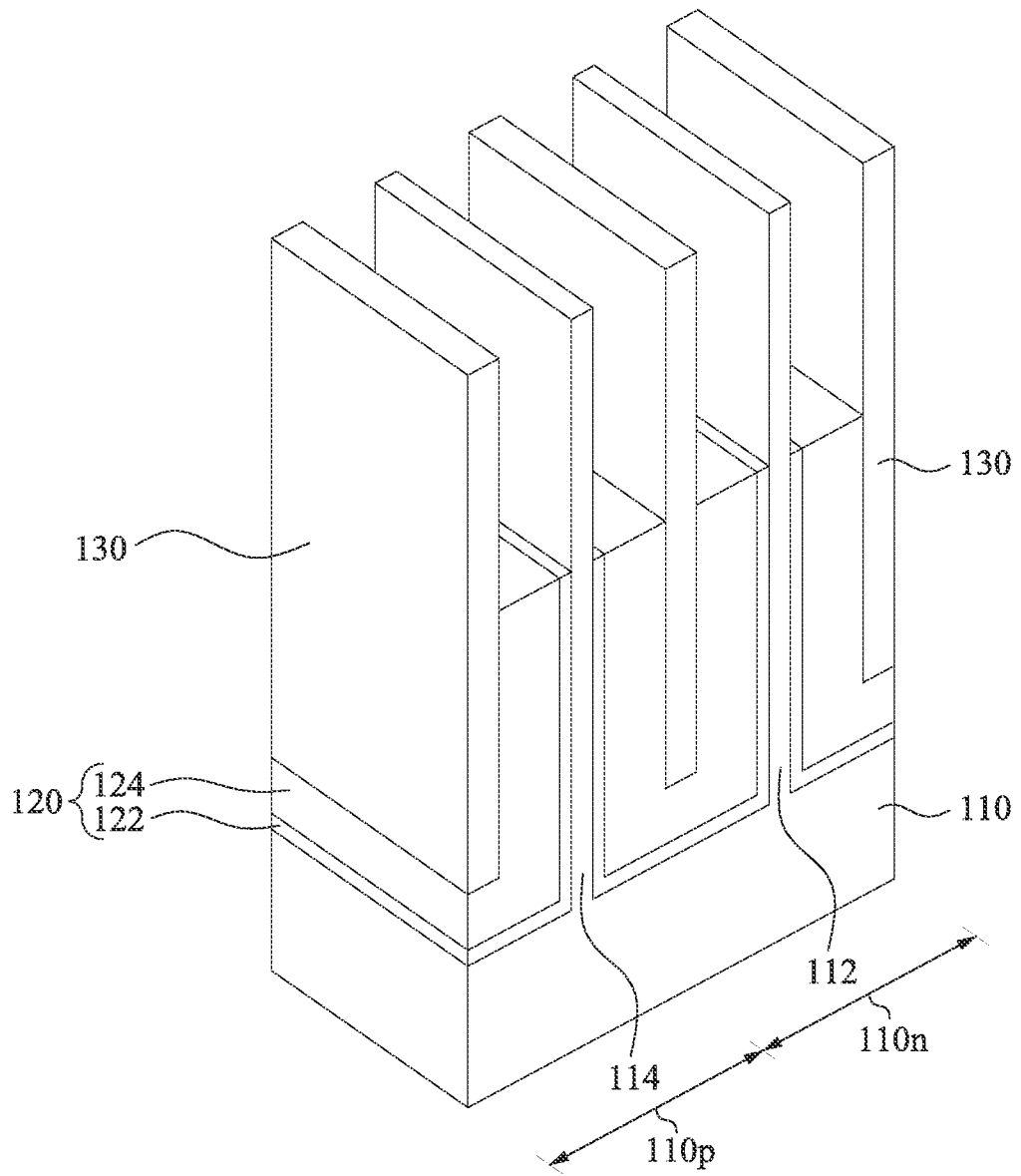

Reference is made to FIG. 4. A planarization process, e.g., a CMP process, is performed on the structure of FIG. 3 to expose the semiconductor fins 112 and 114. The spacing layer material 120' (see FIG. 3) is then etched back such that portions of the semiconductor fins 112 and 114 and the self-aligned isolation fins 130 protrude from the remaining portions of the spacing layer material 120'. The remaining portions of spacing layer material 120' forms spacing layer 120. The spacing layer 120 can be achieved by suitable methods such as, for example, an etch process that has suitable etch selectivity between materials of the spacing layer material 120', the semiconductor fins 112 and 114, and the self-aligned isolation fin 130. For example, the etch process can have a higher etch rate of the spacing layer material 120' than the etch rate of the semiconductor fins 112 and 114 and/or the self-aligned isolation fin 130. In some embodiments, etching rate difference be achieved by adjusting suitable parameters of the etch process such as, for example, etchant gas type, gas flow rate, etching temperature, plasma power, chamber pressure, other suitable parameters, and/or combinations thereof.

Figure 5:
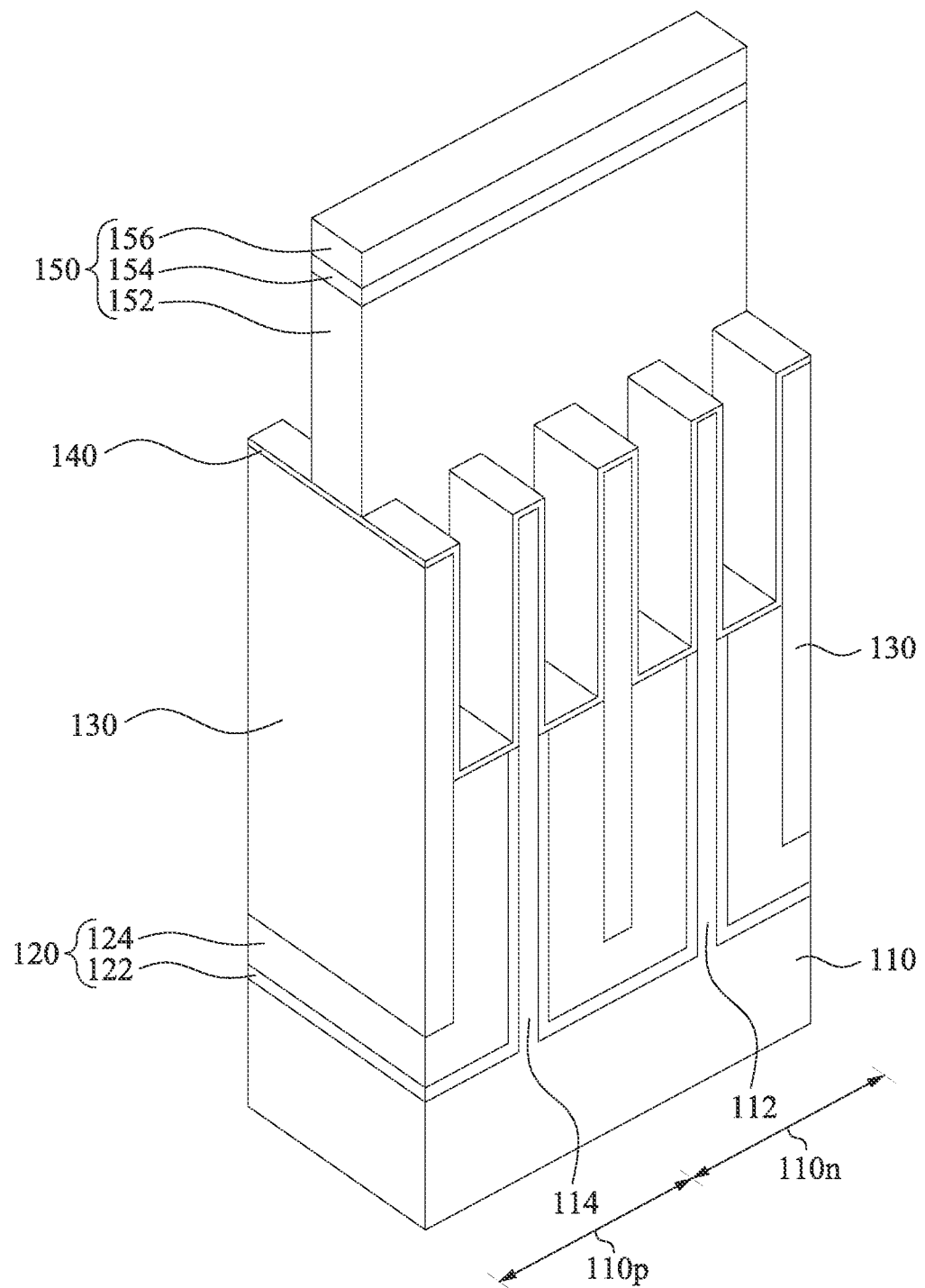

Reference is made to FIG. 5. A sacrificial gate dielectric layer 140 is conformally formed above the structure of FIG. 4. In some embodiments, the sacrificial gate dielectric layer 140 may include silicon dioxide, silicon nitride, a high-κ dielectric material or other suitable material. In various examples, the sacrificial gate dielectric layer 140 may be deposited by an ALD process, a CVD process, a subatmospheric CVD (SACVD) process, a flowable CVD process, a PVD process, or other suitable process. By way of example, the sacrificial gate dielectric layer 140 may be used to prevent damage to the semiconductor fins 112 and 114 by subsequent processing (e.g., subsequent formation of the dummy gate structure).

Subsequently, at least one dummy gate structure 150 is formed above the sacrificial gate dielectric layer 140. The dummy gate structure 150 includes a dummy gate layer 152, a pad layer 154 formed over the dummy gate layer 152, and a mask layer 156 formed over the pad layer 154. Formation of the dummy gate structure 150 includes depositing in sequence a dummy gate layer, a pad layer and a mask layer over the substrate 110, patterning the pad layer and mask layer into patterned pad layer 154 and mask layer 156 using suitable photolithography and etching techniques, followed by patterning the dummy gate layer using the pad layer 154 and the mask layer 156 as masks to form the patterned dummy gate layer 152. As such, the dummy gate layer 152, the pad layer 154, and the mask layer 156 are referred to as the dummy gate structure 150. In some embodiments, the dummy gate layer 152 may be made of polycrystalline-silicon (poly-Si), poly-crystalline silicon-germanium (poly-SiGe), or other suitable materials. The pad layer 154 may be made of silicon nitride or other suitable materials, and the mask layer 156 may be made of silicon dioxide or other suitable materials.

Figure 6:
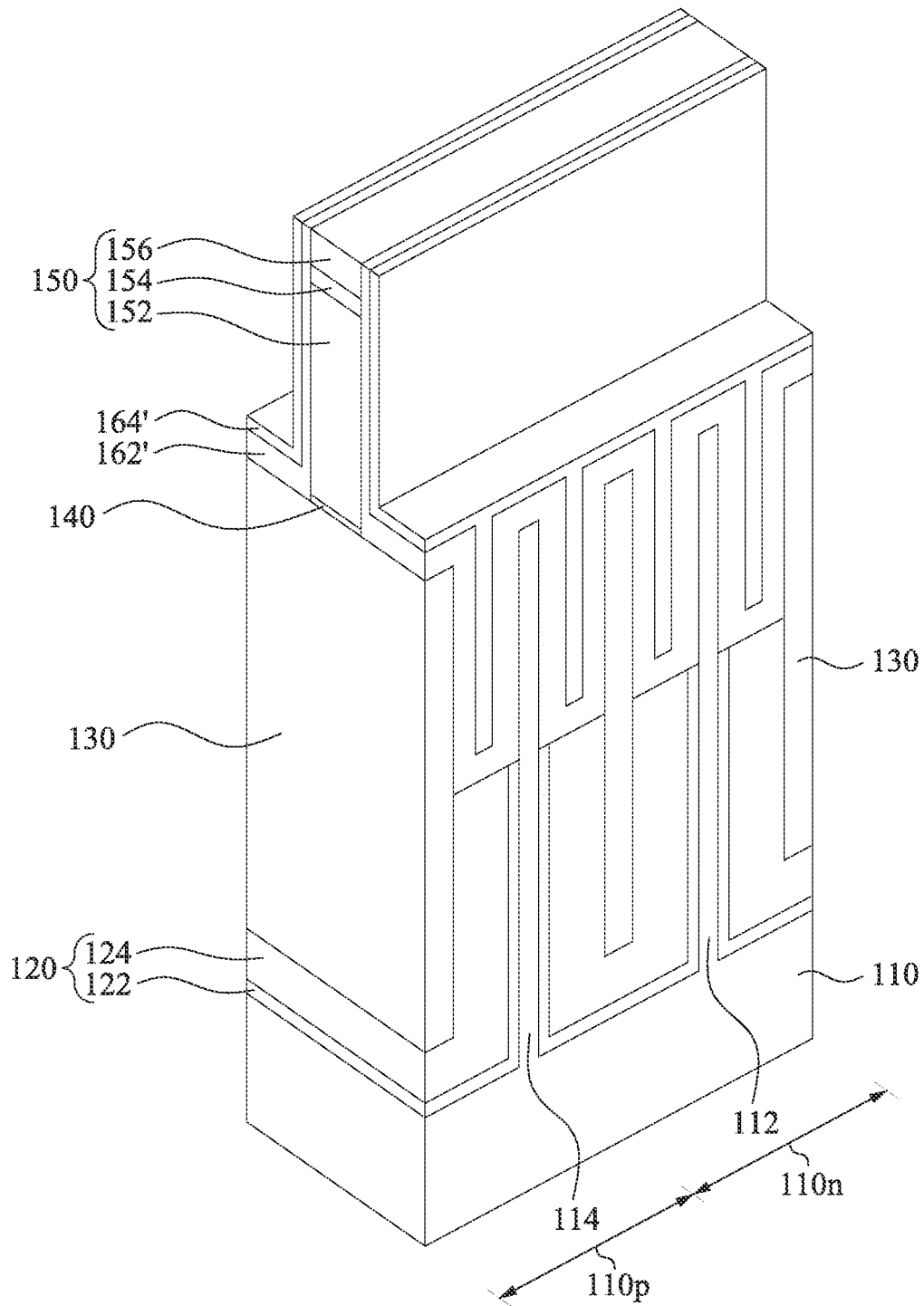

Reference is made to FIG. 6. The sacrificial gate dielectric layer 140 of FIG. 5 is patterned using the dummy gate structure 150 as an etching mask. Subsequently, blanket layers 162' and 164' of insulating materials for gate spacers 160a (see FIG. 7) are conformally formed on the structure of FIG. 5 by using plasma enhanced chemical vapor deposition (PECVD), low-pressure chemical vapor deposition (LPCVD), subatmospheric chemical vapor deposition (SACVD), or the like. The blanket layers 162' and 164' are deposited in a conformal manner so that it is formed to have substantially equal thicknesses on vertical surfaces, such as the sidewalls, horizontal surfaces, and the top of the dummy gate structure 150. In some embodiments, the insulating material of the blanket layers 162' and 164' are silicon nitride-based materials, such as SiN, SiON, SiOCN or SiCN and combinations thereof.

Figure 7:
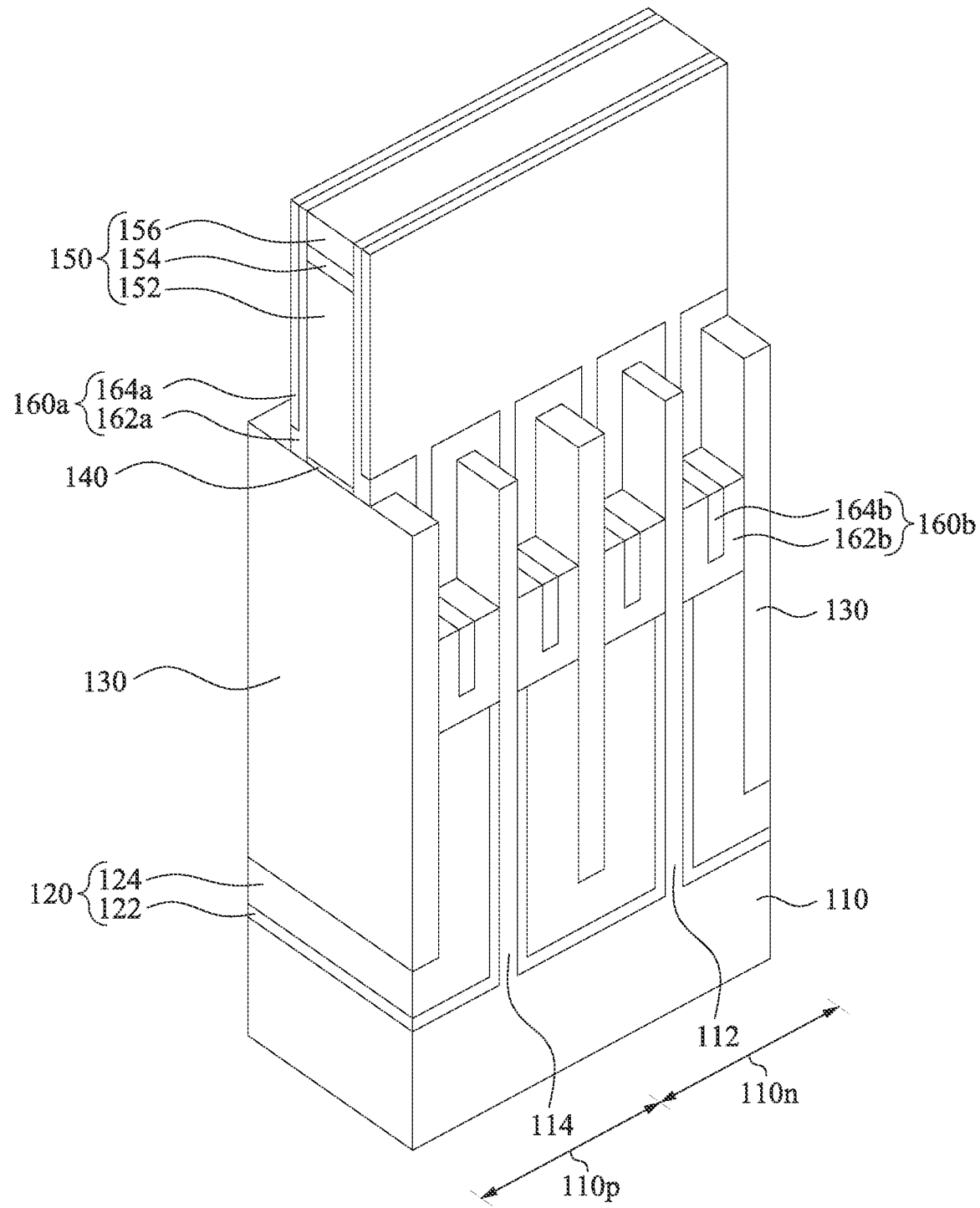

Reference is made to FIG. 7. The blanket layers 162' and 164' (see FIG. 6) are then etched using an anisotropic process to form gate spacers 160a on opposite sidewalls of the dummy gate structure 150 and fin sidewall spacers 160b on opposite sidewalls of the semiconductor fins 112 and 114.

In some embodiments, the gate spacers 160a and the fin sidewall spacers 160b include a seal spacer 162a, 162b and a main spacer 164a, 164b. The seal spacers 162a (162b) may be formed on sidewalls of the dummy gate structure 150 (sidewalls of the semiconductor fins 112 and 114) and the main spacers 164a and 164b are formed on the seal spacers 162a and 162b. In some embodiments, the anisotropic process can be controlled such that no fin sidewall spacers 160b remain on the spacing layer 120. The anisotropic etching performed on the blanket layers 162' and 164' can be, for example, reactive ion etching (RIE). During the anisotropic etching process, most of the insulating material is removed from horizontal surfaces, leaving the dielectric spacer layer on the vertical surfaces such as the sidewalls of the dummy gate structures 150 and the sidewalls of the exposed semiconductor fins 112 and 114.

Figure 8:
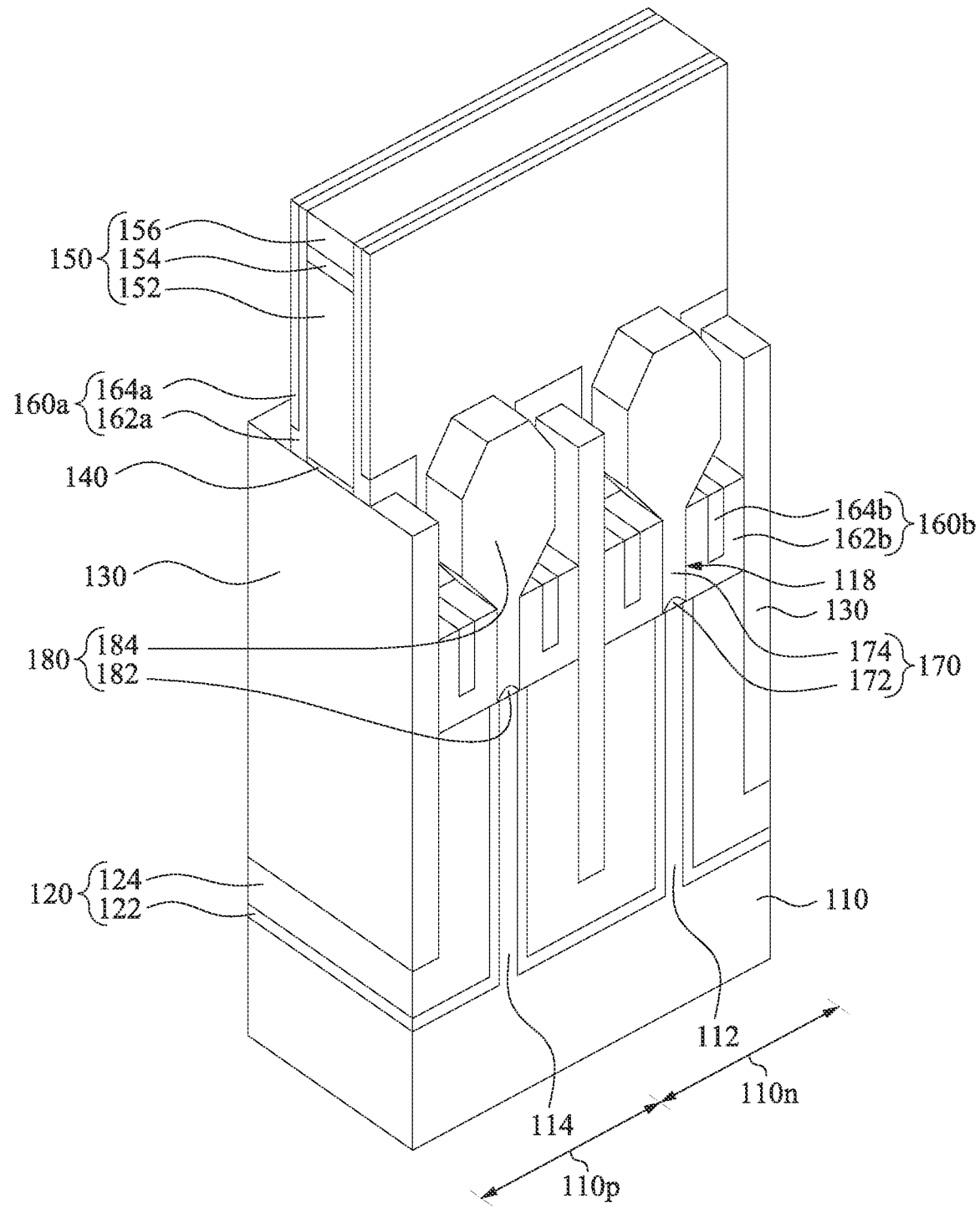

Reference is made to FIG. 8. A plurality of recesses 118 are formed on opposite sides of the dummy gate structure 150 by etching the semiconductor fins 112 and 114. The dummy gate structure 150 and the gate spacers 160a act as etching masks in the formation of the recesses 118. The etching process includes a dry etching process, a wet etching process, or combinations thereof.

Semiconductor materials are then deposited in the recesses 118 to form epitaxial structures 170 and 180 which are referred to as source/drain regions. The epitaxial structures 170 are form above the N-type region 110n, and the epitaxial structures 180 are respectively form above the P-type region 110p. The epitaxial structures 170 and 180 may alternatively be referred to as raised source and drain regions. The semiconductor materials include a single element semiconductor material, such as germanium (Ge) or silicon (Si), compound semiconductor materials, such as gallium arsenide (GaAs), silicon arsenide (SiAs), or aluminum gallium arsenide (AlGaAs), or a semiconductor alloy, such as silicon germanium (SiGe), silicon germanium boron (SiGeB), or gallium arsenide phosphide (GaAsP). The epitaxial structures 170 and 180 have suitable crystallographic orientations (e.g., a (100), (110), or (111) crystallographic orientation). In some embodiments, the epitaxial structures 170 and 180 include source/drain epitaxial structures. In some embodiments, where an N-type device is desired, the epitaxial structures 170 may include an epitaxially grown silicon phosphorus (SiP) or silicon carbon (SiC). In some embodiments, where a P-type device is desired, the epitaxial structures 180 may include an epitaxially grown silicon germanium (SiGe). The epitaxial processes include CVD deposition techniques (e.g., vapor-phase epitaxy (VPE) and/or ultra-high vacuum CVD (UHV-CVD)), molecular beam epitaxy, and/or other suitable processes. Desired p-type or n-type impurities may be, or may not be, doped while the epitaxial process. The doping may be achieved by an ion implantation process, plasma immersion ion implantation (PIII) process, gas and/or solid source diffusion process, other suitable process, or combinations thereof.

In some embodiments, the epitaxial structure 170 includes a first epitaxial layer 172 and a second epitaxial layer 174. The first epitaxial layer 172 is in direct contact with the recessed portion of the semiconductor fin 112, and the second epitaxial layer 174 is above the first epitaxial layer 172. The first and second epitaxial layers 172 and 174 are crystalline semiconductor layers, such as Si, SiC, SiCP, and SiP, having different lattice constants from each other and from the semiconductor fin 112. When SiC, SiP and/or SiCP are used, the C or P concentration of the first epitaxial layer 172 is different from that of the second epitaxial layer 174. In some embodiments, a Group III-V semiconductor layer is used for at least one of the first and second epitaxial layers 172 and 174. In some other embodiments, only one or two of the first and second epitaxial layers 172 and 174 is formed, and in some other embodiments, more epitaxial layers are formed. For example, a third epitaxial structure may be formed above and wrap around the second epitaxial layer 174.

Similarly, the epitaxial structure 180 may include a first epitaxial layer 182 and a second epitaxial layer 184. The first epitaxial layer 182 is in direct contact with the recessed portion of the semiconductor fin 114, and the second epitaxial layer 184 is above the first epitaxial layer 182. The first and second epitaxial layers 182 and 184 are crystalline semiconductor layers, such as Si, Ge, and SiGe, having different lattice constants from each other and from the semiconductor fin 114. When Si, Ge, and SiGe are used, the Ge atomic concentration of the first epitaxial layer 182 is different from that of the second epitaxial layer 184. In some embodiments, a Group III-V semiconductor layer is used for at least one of the first and second epitaxial layers 182 and 184. In some other embodiments, only one or two of the first and second epitaxial layers 182 and 184 is formed, and in some other embodiments, more epitaxial layers are formed. For example, a third epitaxial structure may be formed above and wrap around the second epitaxial layer 184.

Figure 9:
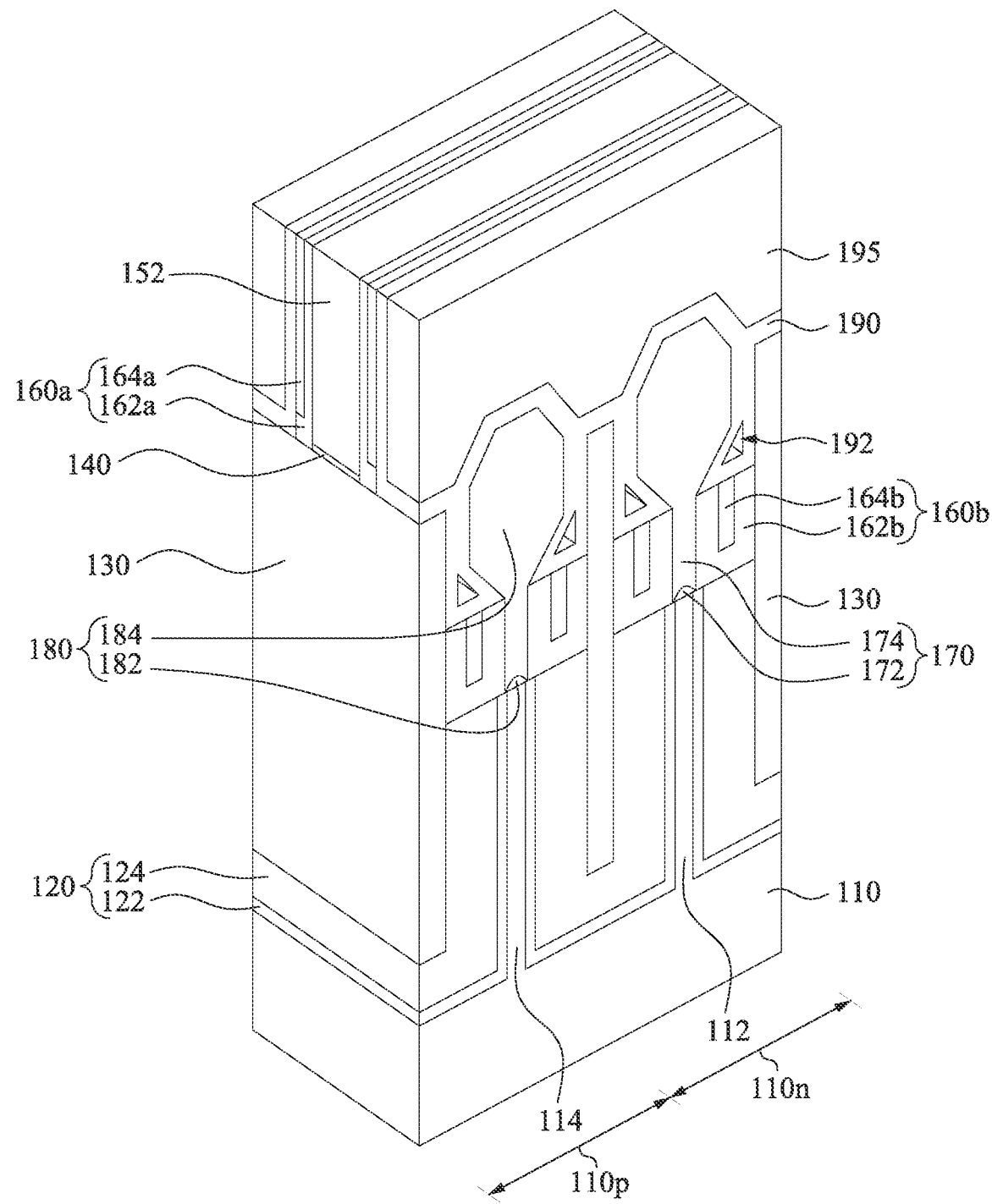

Reference is made to FIG. 9. A contact etch stop layer (CESL) 190 is conformally formed over the structure of FIG. 8. In some embodiments, the CESL 190 can be a stressed layer or layers. In some embodiments, the CESL 190 has a tensile stress and is formed of $Si_3N_4$. In some other embodiments, the CESL 190 includes materials such as oxynitrides. In yet some other embodiments, the CESL 190 may have a composite structure including a plurality of layers, such as a silicon nitride layer overlying a silicon oxide layer. The CESL 190 can be formed using plasma enhanced CVD (PECVD), however, other suitable methods, such as low pressure CVD (LPCVD), atomic layer deposition (ALD), and the like, can also be used. In some embodiments, at least one bottom air gap 192 may be formed under the epitaxial structures 170 and/or 180 and defined by the CESL 190.

An interlayer dielectric (ILD) 195 is then formed on the CESL 190. The ILD 195 may be formed by chemical vapor deposition (CVD), high-density plasma CVD, spin-on, sputtering, or other suitable methods. In some embodiments, the ILD 195 includes silicon oxide. In some other embodiments, the ILD 195 may include silicon oxy-nitride, silicon nitride, compounds including Si, O, C and/or H (e.g., silicon oxide, SiCOH and SiOC), a low-k material, or organic materials (e.g., polymers). After the ILD 195 is formed, a planarization operation, such as CMP, is performed, so that the pad layer 154 and the mask layer 156 (see FIG. 8) are removed and the dummy gate layer 152 is exposed.

Figure 10:
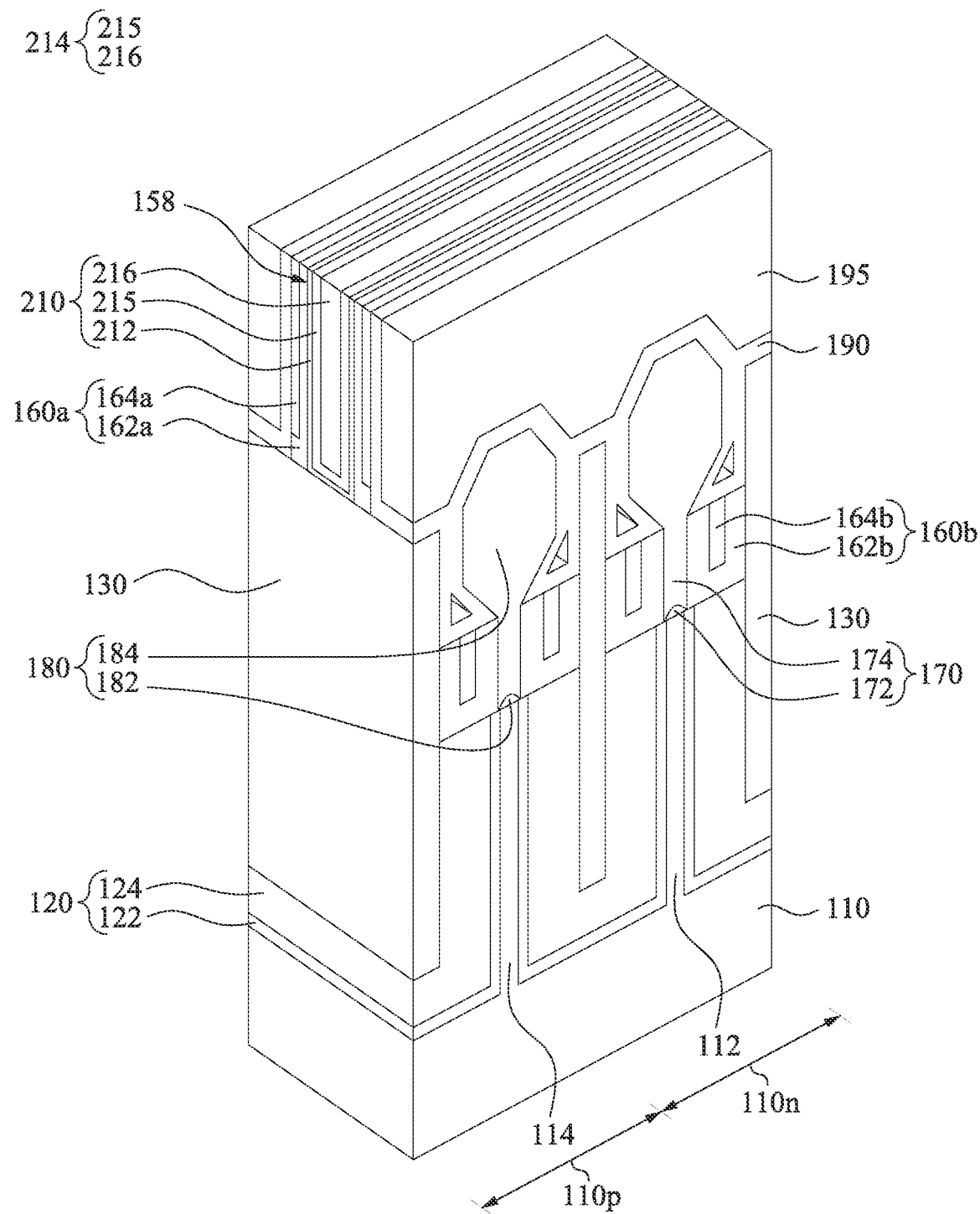

Reference is made to FIG. 10. Subsequently and optionally, a replacement gate (RPG) process scheme is employed. In the RPG process scheme, a dummy polysilicon gate (the dummy gate structure 150 in FIG. 8 in this case) is formed in advance and is replaced later by a metal gate. In some embodiments, the dummy gate structure 150 is removed to form a gate trench 158 with the gate spacers 160a as its sidewalls. In some other embodiments, the sacrificial gate dielectric layer 140 (see FIG. 9) is removed as well. The dummy gate structure 150 (and the sacrificial gate dielectric layer 140) may be removed by dry etching, wet etching, or a combination of dry and wet etching.

A gate dielectric layer 212 is formed in the gate trench 158, and at least one metal layer is formed in the gate trench 158 and on the gate dielectric layer 212. Subsequently, a chemical mechanical planarization (CMP) process is performed to planarize the metal layer and the gate dielectric layer 212 to form a metal gate structure 210 in the gate trench 158. The metal gate structure 210 across the semiconductor fins 112 and 114. The metal gate structure 210 includes the gate dielectric layer 212 and a metal gate electrode 214 over the gate dielectric layer 212. In some embodiments, the gate dielectric layer 212 includes a high-k material (k is greater than 7) such as hafnium oxide ($HfO_2$), zirconium oxide ($ZrO_2$), lanthanum oxide ($La_2O_3$), hafnium aluminum oxide ($HfAlO_2$), hafnium silicon oxide ($HfSiO_2$), aluminum oxide ($Al_2O_3$), or other suitable materials. In some embodiments, the gate dielectric layer 212 may be formed by performing an ALD process or other suitable process. The metal gate electrode 214 may include metal layers 215, e.g., work function metal layer(s) and capping layer(s), a fill layer(s) 216, and/or other suitable layers that are desirable in a metal gate stack. The work function metal layer 215 may include an n-type and/or a p-type work function metal. Exemplary n-type work function metals include Ti, Ag, TaAl, TaAlC, TiAlN, TaC, TaCN, TaSiN, Mn, Zr, other suitable n-type work function materials, or combinations thereof. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. The work function metal layer 215 may have multiple layers. The work function metal layer(s) 215 may be deposited by CVD, PVD, electroplating and/or other suitable processes. In some embodiments, the capping layer may include refractory metals and their nitrides (e.g., TiN, TaN, $W_2N$, TiSiN, and TaSiN). The capping layer may be deposited by PVD, CVD, metal-organic chemical vapor deposition (MOCVD) ALD, or the like. In some embodiments, the fill layer 216 may include tungsten (W). The fill layer 216 may be deposited by ALD, PVD, CVD, or another suitable process.

Figure 11A:
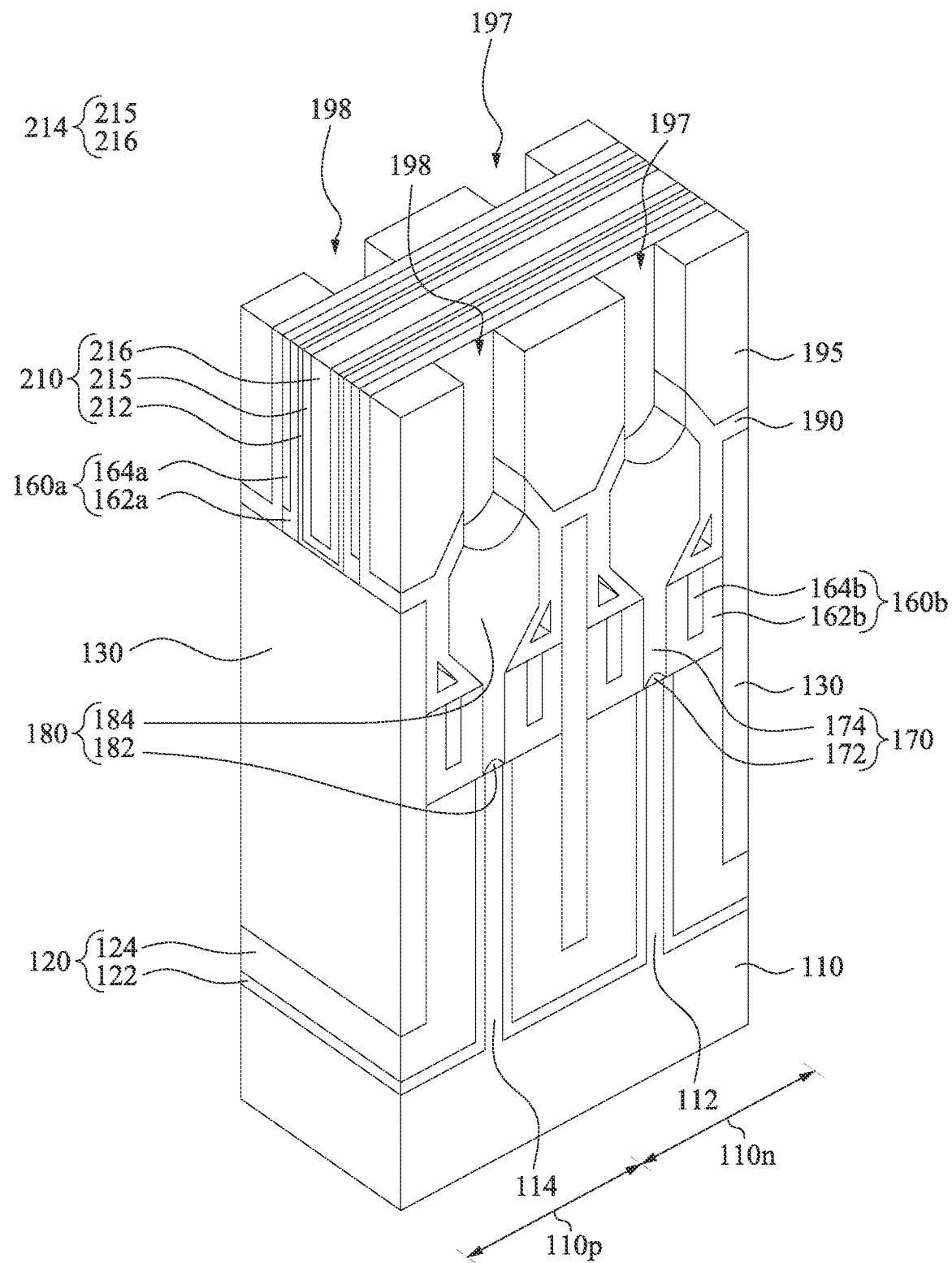
Figure 11B:
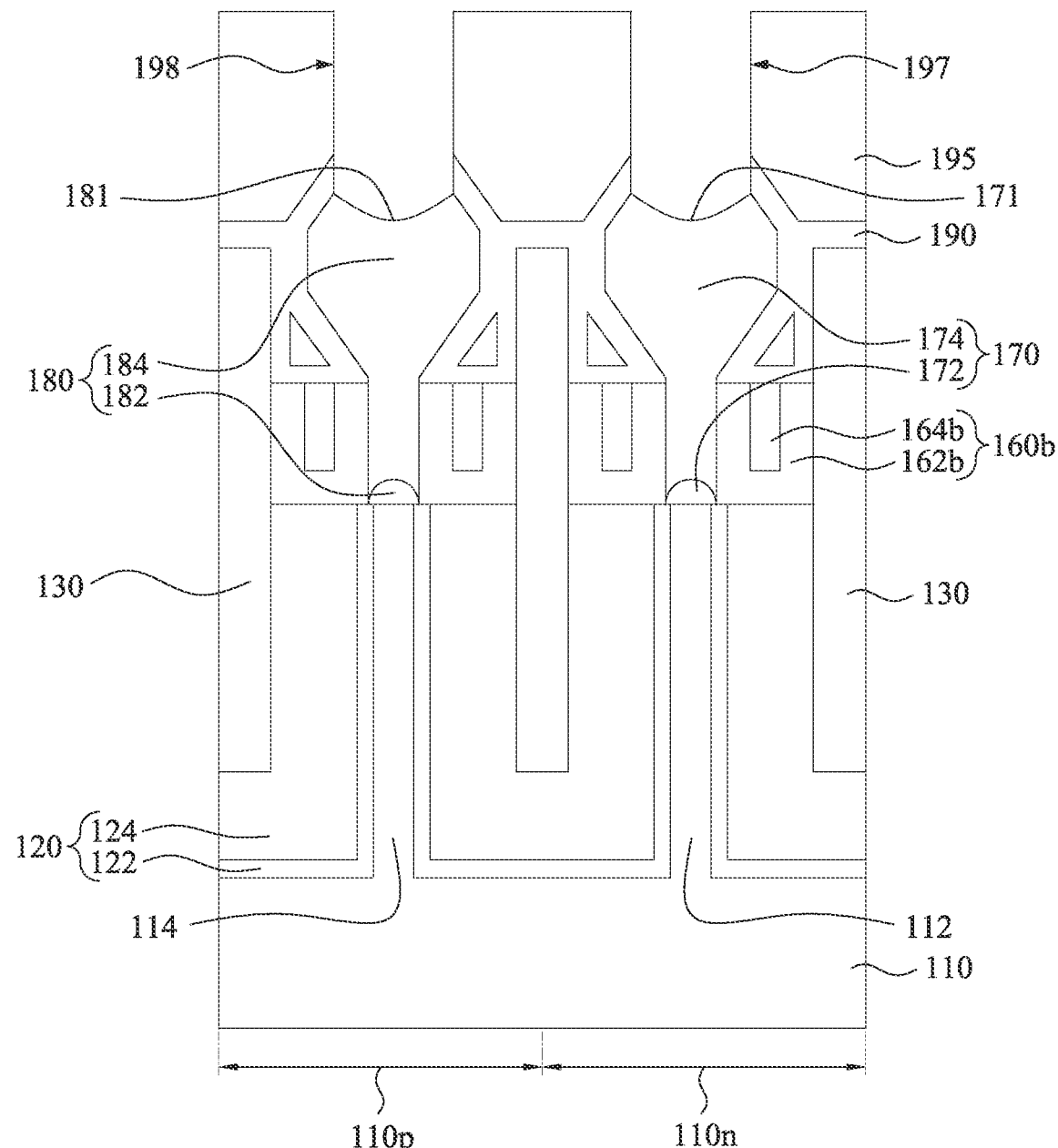

Reference is made to FIGS. 11A and 11B, where FIG. 11B is a side view of the semiconductor device in FIG. 11A. The ILD 195 and the CESL 190 are then etched to form openings 197 and 198 by various methods, including a dry etch, a wet etch, or a combination of dry etch and wet etch. The openings 197 and 198 extend substantially vertically through the ILD 195 and the CESL 190. The opening 197 is formed above the epitaxial structure 170 and exposes the epitaxial structure 170, and the opening 198 is formed above the epitaxial structure 180 and exposes the epitaxial structure 180. While the etching process, portions of the epitaxial structures 170 and 180 are removed, such the top surfaces 171 and 181 of the epitaxial structures 170 and 180 are concave.

Figure 12:
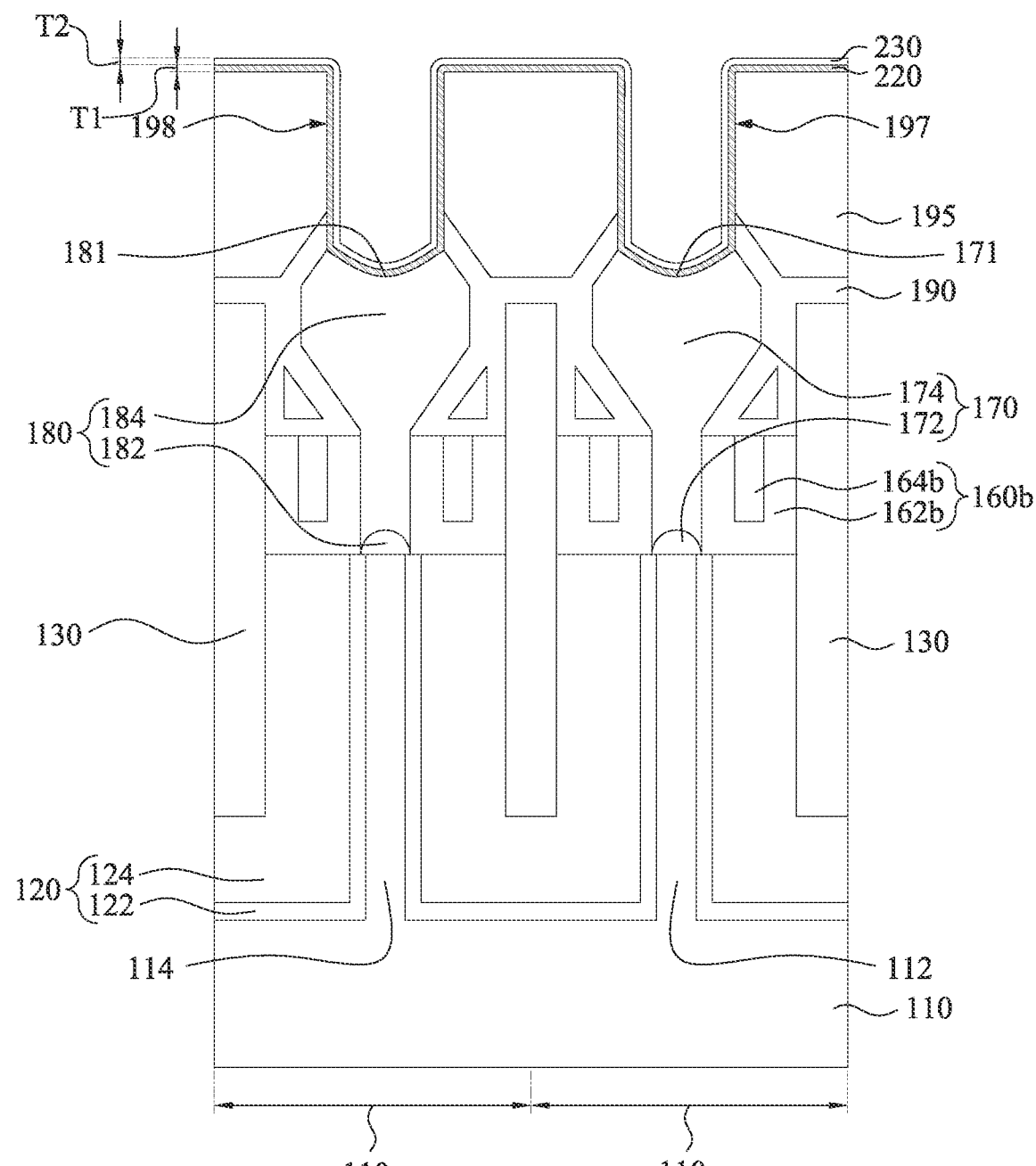

Reference is made to FIG. 12. A first mask layer 220 is conformally formed above the structure of FIG. 11B. That is, the first mask layer 220 lines the inner sidewalls of the CESL 190 and ILD 195 and the top surfaces 171 and 181 of the epitaxial structures 170 and 180. In some embodiments, the first mask layer 220 is a dielectric layer such as a metal oxide layer. In some embodiments, the first mask layer 220 includes a high-k material (k is greater than 7) such as aluminum oxide ($Al_2O_3$), zirconium oxide ($ZrO_2$, $Zr_2O_3$), hafnium oxide ($HfO_2$), lanthanum oxide ($La_2O_3$), hafnium aluminum oxide ($HfAlO_2$), hafnium silicon oxide ($HfSiO_2$), or other suitable materials. In some embodiments, the first mask layer 220 may be formed by performing an ALD process or other suitable process. In some embodiments, the first mask layer 220 has a thickness T1 in a range of about 3 nm to about 5 nm. If the thickness T1 of the first mask layer 220 is greater than about 5 nm, the deposition window for the following formed epitaxial layer 240 (see FIG. 15) may be small; if the thickness T1 of the first mask layer 220 is less than about 3 nm, the first mask layer 220 may be completely removed during the surface cleaning process described in FIG. 15, and the top surface 171 of the epitaxial structure 170 is exposed.

Subsequently, a second mask layer 230 is optionally formed above the first mask layer 220. The first and second mask layers 220 and 230 include different materials. For example, the second mask layer 230 is free from metal. The second mask layer 230 may be a low-k dielectric layer, such as silicon oxide, silicon nitride, silicon oxynitride, or combinations thereof. In some embodiments, the second mask layer 230 may be formed by performing an ALD process or other suitable process. In some embodiments, the second mask layer 230 has a thickness T2 in a range of about 3 nm to about 5 nm. If the thickness T2 of the second mask layer 230 is greater than about 5 nm, the deposition window for the following formed epitaxial layer 240 (see FIG. 15) may be small; if the thickness T2 of the second mask layer 230 is less than about 3 nm, the second mask layer 230 may not protect the first mask layer 220 during the following surface cleaning process as described in FIG. 15.

Figure 13:
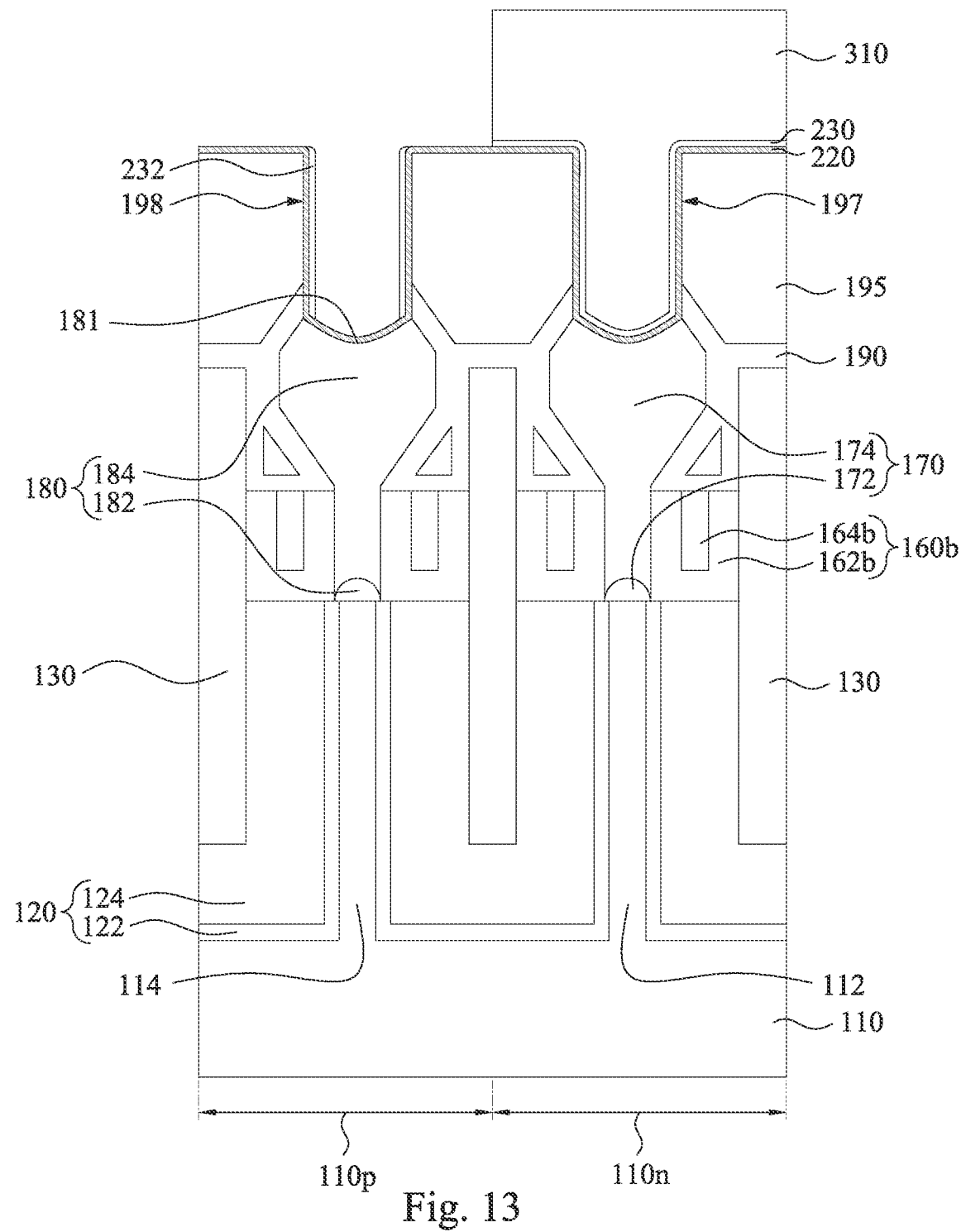

Reference is made to FIG. 13. A first photoresist layer 310 is formed above the N-type region 110n of the substrate 110. The first photoresist layer 310 is formed by spin-on coating or other suitable technique. Other operations, such as baking, may follow the coating of the first photoresist layer 310. The first photoresist layer 310 exposes a portion of the second mask layer 230 above the P-type region 110p.

Subsequently, a directional etching process is performed on the portion of the second mask layer 230 above the P-type region 110p to remove the horizontal portions of the second mask layer 230. The directional etching process may have suitable etch selectivity between materials of the first and second mask layers 220 and 230. For example, the etch process can have a higher etch rate of the second mask layer 230 than the etch rate of the first mask layer 220. In some embodiments, the etching selectivity of the first mask layer 220 to the second mask layer 230 is greater than about 10, e.g., in a range of about 10 to about 50. In some embodiments, etching rate difference be achieved by adjusting suitable parameters of the etch process such as, for example, etchant gas type, gas flow rate, etching temperature, plasma power, chamber pressure, other suitable parameters, and/or combinations thereof. The remaining vertical portions of the second mask layer 230 above the P-type region 110p form first spacers 232 on the sidewalls of the opening 198. Further, a portion of the first mask layer 220 above the top surface 181 of the epitaxial structure 180 is exposed by the first spacers 232.

Figure 14:
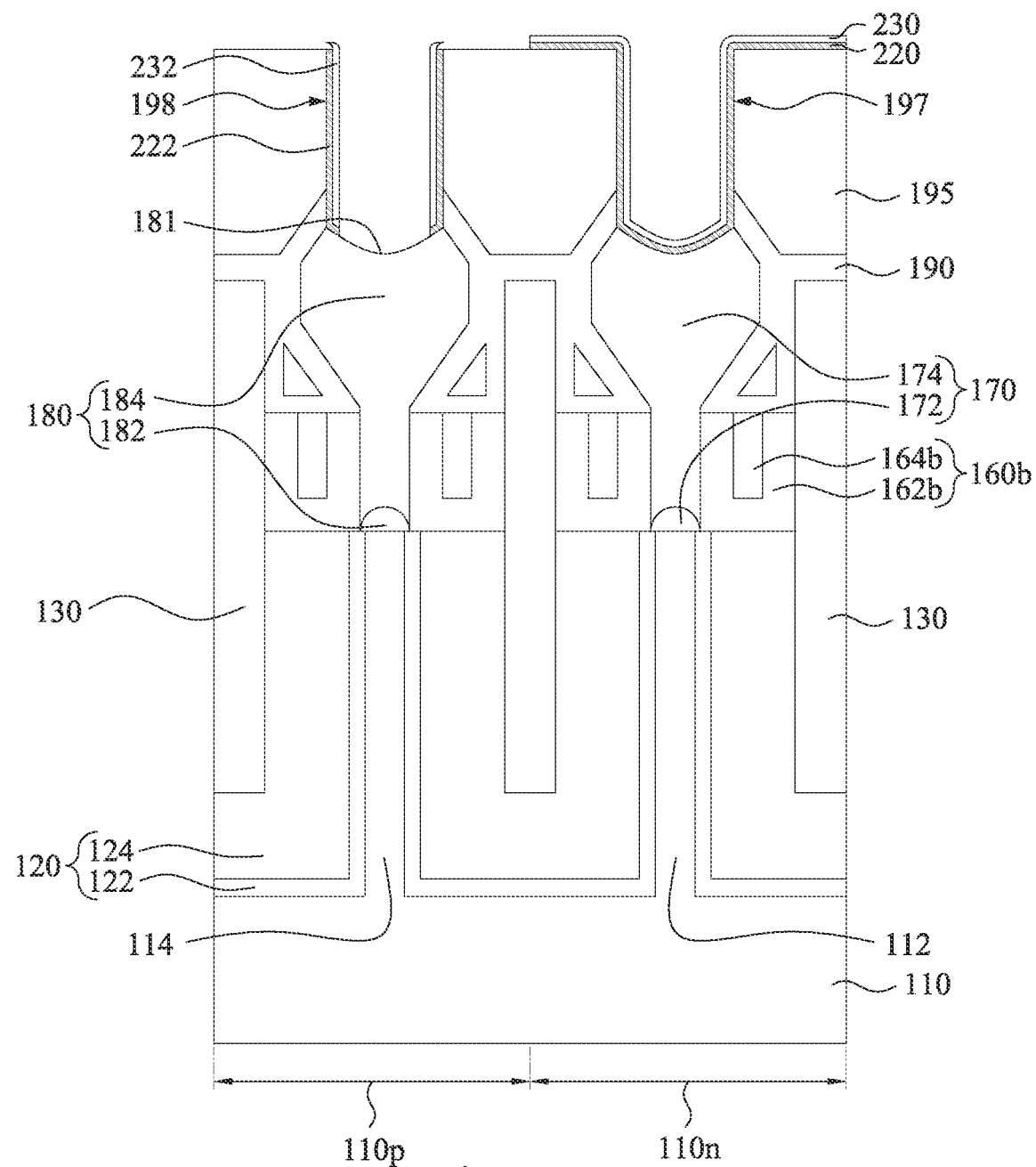

Reference is made to FIG. 14. After the formation of the first spacers 232, the first photoresist layer 310 (see FIG. 13) is removed from the N-type region 110n of the substrate 110 by an appropriate process, such as etching or ashing process. In some embodiments, the second mask layer 230 is configured to be a protection layer for protecting the first mask layer 220 from being removed during the removal of the first photoresist layer 310. In some other embodiments, the second mask layer 230 can be omitted if the removal process us an etching process that has suitable etch selectivity between materials of the first mask layer 220 and the first photoresist layer 310.

Subsequently, a portion of the first mask layer 220 exposed by the second mask layer 230 or the first spacers 232 is removed by using the second mask layer 230 and the first spacers 232 as etching masks. The removal process may be an etching process that has suitable etch selectivity between materials of the first and second mask layers 220 and 230 and the ILD 195. For example, the etch process can have a higher etch rate of the first mask layer 220 than the etch rate of the second mask layer 230 and the etch rate of ILD 195. As such, the etch process does not damage the ILD 195 (and the CESL 190). In some embodiments, etching rate difference be achieved by adjusting suitable parameters of the etch process such as, for example, etchant gas type, gas flow rate, etching temperature, plasma power, chamber pressure, other suitable parameters, and/or combinations thereof. As such, the top surface 181 of the epitaxial structure 180 is exposed by the first mask layer 220. Further, the remaining vertical portions of the first mask layer 220 above the P-type region 110p form second spacers 222 on the sidewalls of the opening 198.

Figure 15:
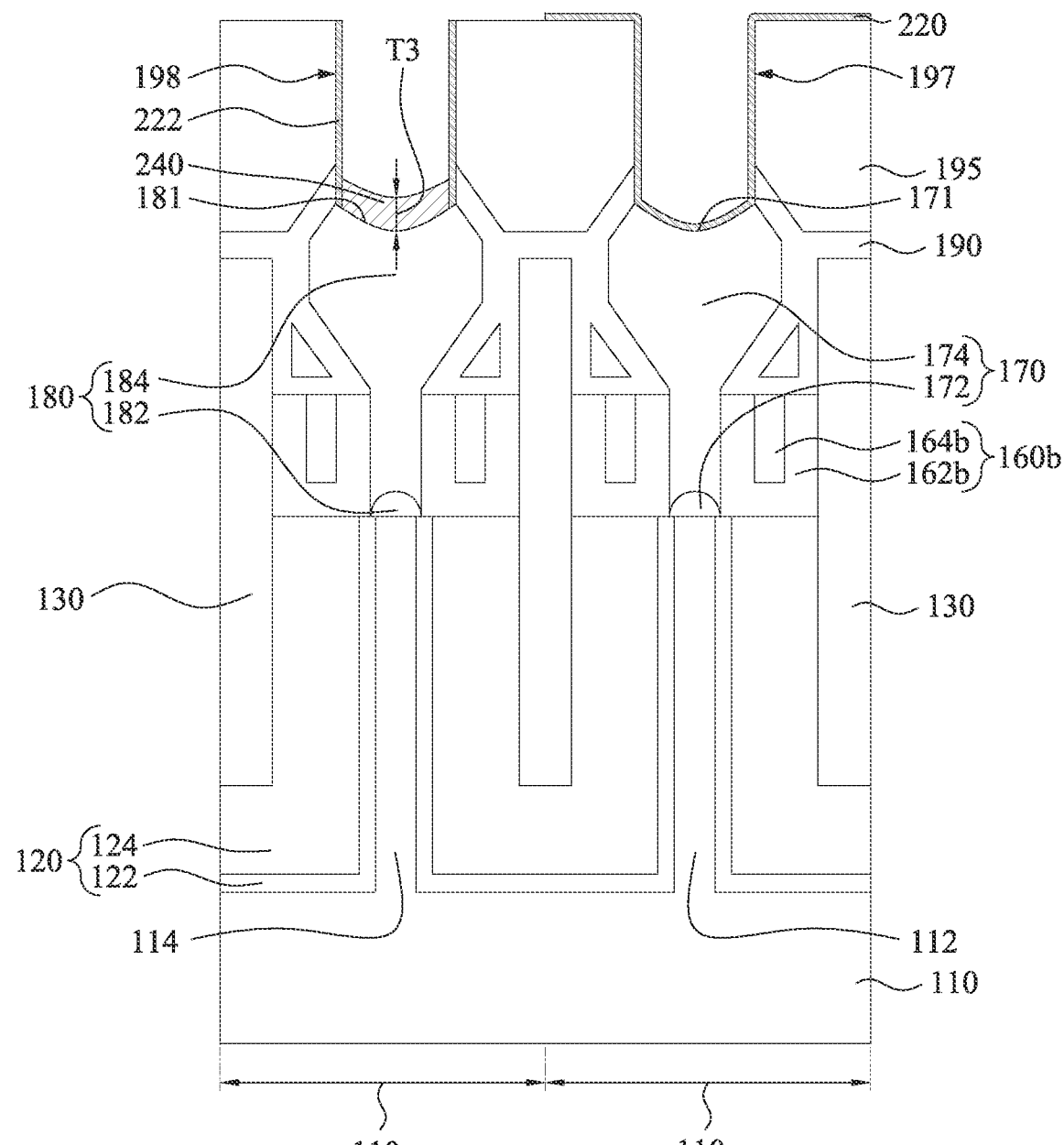

Reference is made to FIG. 15. A surface cleaning process is performed on the structure of FIG. 14 for removing native oxides on the top surface 181 of the epitaxial structure 180. The second mask layer 230 and the first spacers 232 (see FIG. 14) are also removed during this surface cleaning process. As such, the remaining first mask layer 220 and the second spacers 222 are exposed. In some embodiments, the surface cleaning process removes portions of the remaining first mask layer 220 and the second spacers 222, such that the thicknesses of the remaining first mask layer 220 and the second spacers 222 are reduced. In some other embodiments, the second mask layer 230 can be omitted if the surface cleaning process barely removes the first mask layer 220 and the second spacers 222. The second spacers 222 expose the top surface 181 of the epitaxial structure 180 while the remaining first mask layer 220 covers the top surface 171 of the epitaxial structure 170.

An epitaxial layer 240 is then formed above the top surface 181 of the epitaxial structure 180. The epitaxial layer 240 includes a single element semiconductor material, such as germanium (Ge) or silicon (Si), compound semiconductor materials, such as gallium arsenide (GaAs) or aluminum gallium arsenide (AlGaAs), or a semiconductor alloy, such as silicon germanium (SiGe) or gallium arsenide phosphide (GaAsP). In some embodiments, where a P-type device is desired, the epitaxial layer 240 may include an epitaxially grown silicon germanium (SiGe). The epitaxial processes include CVD deposition techniques (e.g., vapor-phase epitaxy (VPE) and/or ultra-high vacuum CVD (UHV-CVD)), molecular beam epitaxy, and/or other suitable processes. Desired p-type impurities may be, or may not be, doped while the epitaxial process. The doping may be achieved by an ion implantation process, plasma immersion ion implantation (PIII) process, gas and/or solid source diffusion process, other suitable process, or combinations thereof. In some embodiments, the epitaxial layer 240 may have a material substantially the same as the second epitaxial layer 184 of the epitaxial structure 180. In some embodiments, a thickness T3 of the epitaxial layer 240 is about 5 nm to about 10 nm. If the thickness T3 of the epitaxial layer 240 is less than about 5 nm, the epitaxial layer 240 may be totally consumed during the formation of the first metal alloy layer 285 (see FIG. 22); if the thickness T3 of the epitaxial layer 240 is greater than about 10 nm, a resistance between a contact 290b (see FIGS. 23A and 23B) and the epitaxial structure 180 is increased.

Figure 16:
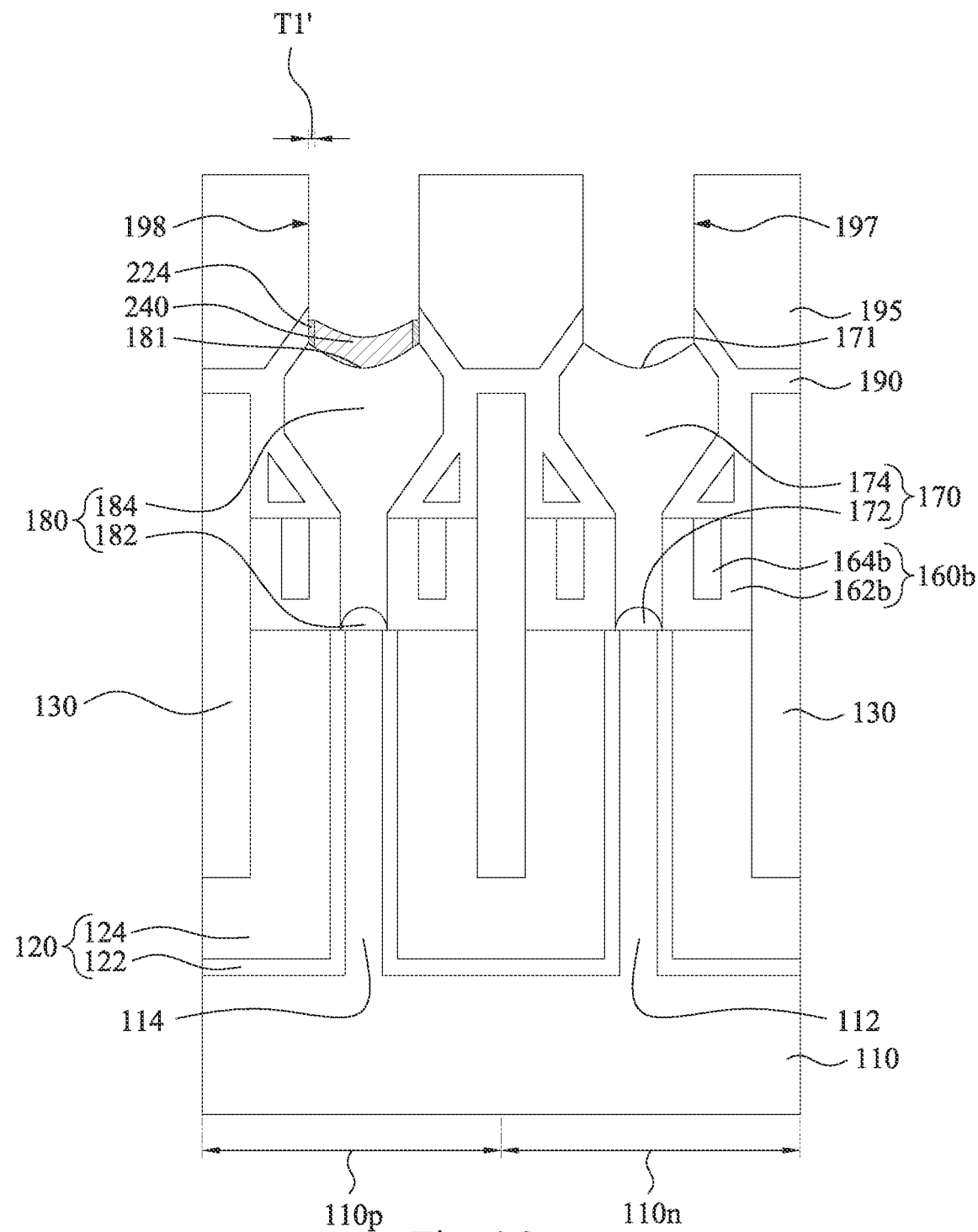

Reference is made to FIG. 16. The remaining first mask layer 220 and the second spacers 222 (see FIG. 15) are removed using an etching process, such that the sidewalls of the ILD 195 and the top surface 171 of the epitaxial structure 170 are exposed. On the other hand, since portions of the second spacers 222 are sandwiched between the CESL 190 and the epitaxial layer 240, these portions of the second spacers 222 may not be removed and form (dielectric) residues 224 between the CESL 190 (or the ILD 195) and the epitaxial layer 240. Hence, the epitaxial layer 240 is spaced apart from the CESL 190 and the ILD 195. In some embodiments, the residues 224 have a thickness T1' in a range of about 0.5 nm to about 4.5 nm.

Figure 17:
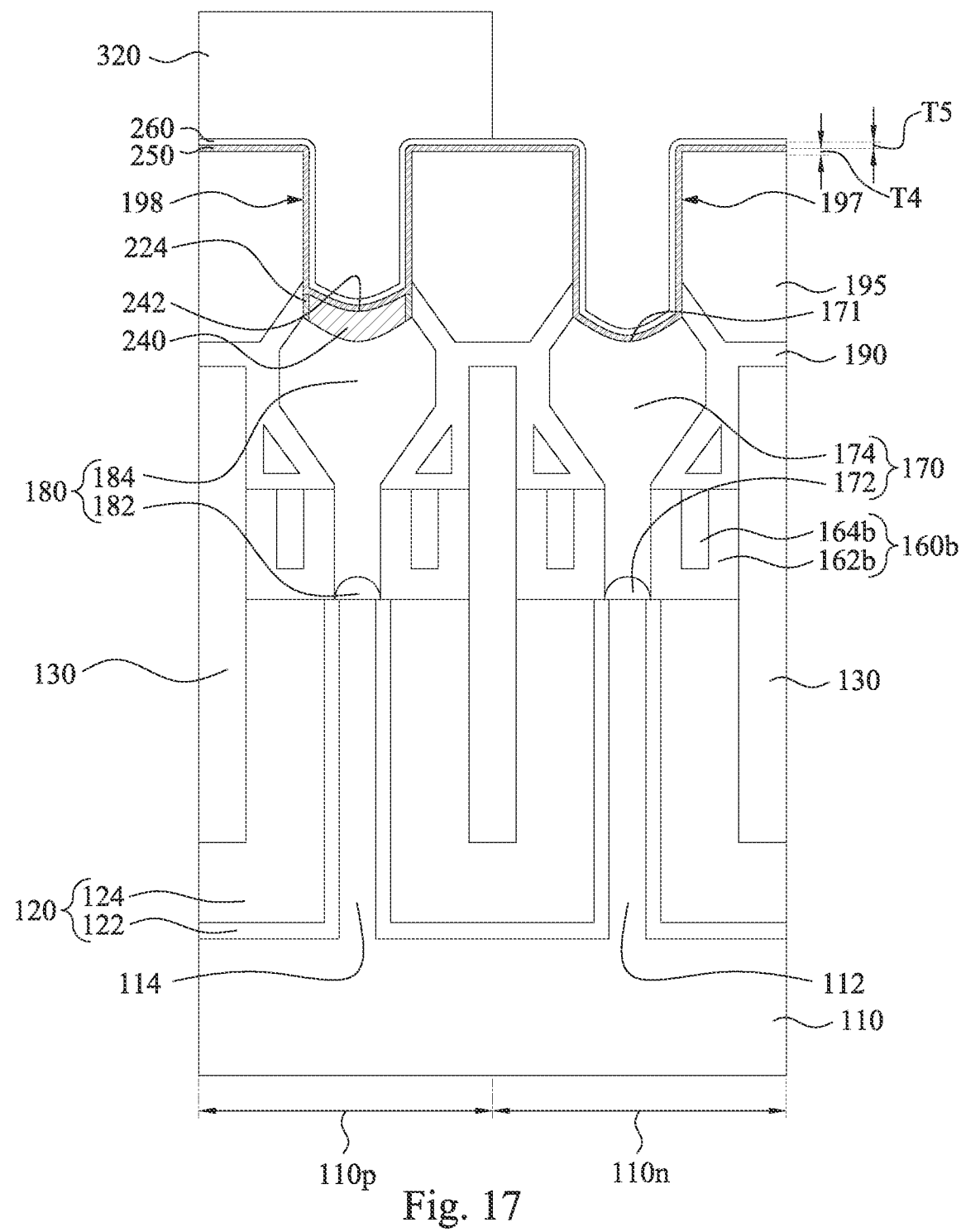

Reference is made to FIG. 17. A third mask layer 250 is formed above the structure of FIG. 16. That is, the third mask layer 250 lines the inner sidewalls of the CESL 190 and ILD 195, the top surface 242 of the epitaxial layer 240, and the top surface 171 of the epitaxial structure 170. In some embodiments, the third mask layer 250 is a dielectric layer such as a metal oxide layer. In some embodiments, the third mask layer 250 includes a high-k material (k is greater than 7) such as aluminum oxide ($Al_2O_3$), zirconium oxide ($ZrO_2$, $Zr_2O_3$), hafnium oxide ($HfO_2$), lanthanum oxide ($La_2O_3$), hafnium aluminum oxide ($HfAlO_2$), hafnium silicon oxide ($HfSiO_2$), or other suitable materials. In some embodiments, the third mask layer 250 may be formed by performing an ALD process or other suitable process. In some embodiments, the third mask layer 250 has a thickness T4 in a range of about 3 nm to about 5 nm. If the thickness T4 of the third mask layer 250 is greater than about 5 nm, the deposition window for the following formed epitaxial layer 270 (see FIG. 20) may be small; if the thickness T4 of the third mask layer 250 is less than about 3 nm, the third mask layer 250 may be completely removed during the surface cleaning process described in FIG. 20, and the top surface 242 of the epitaxial layer 240 is exposed.

Subsequently, a fourth mask layer 260 is optionally formed above the third mask layer 250. The third and fourth mask layers 250 and 260 include different materials. For example, the fourth mask layer 260 is free from metal. The fourth mask layer 260 may be a low-k dielectric layer, such as silicon oxide, silicon nitride, silicon oxynitride, or combinations thereof. In some embodiments, the fourth mask layer 260 may be formed by performing an ALD process or other suitable process. In some embodiments, the fourth mask layer 260 has a thickness T5 in a range of about 3 nm to about 5 nm. If the thickness T5 of the fourth mask layer 260 is greater than about 5 nm, the deposition window for the following formed epitaxial layer 270 (see FIG. 20) may be small; if the thickness T5 of the fourth mask layer 260 is less than about 3 nm, the fourth mask layer 260 may not protect the first mask layer 250 during the following surface cleaning process as described in FIG. 20.

A second photoresist layer 320 is then formed above the P-type region 110p of the substrate 110. The second photoresist layer 320 is formed by spin-on coating or other suitable technique. Other operations, such as baking, may follow the coating of the second photoresist layer 320. The second photoresist layer 320 exposes a portion of the fourth mask layer 260 above the N-type region 110n.

Figure 18:
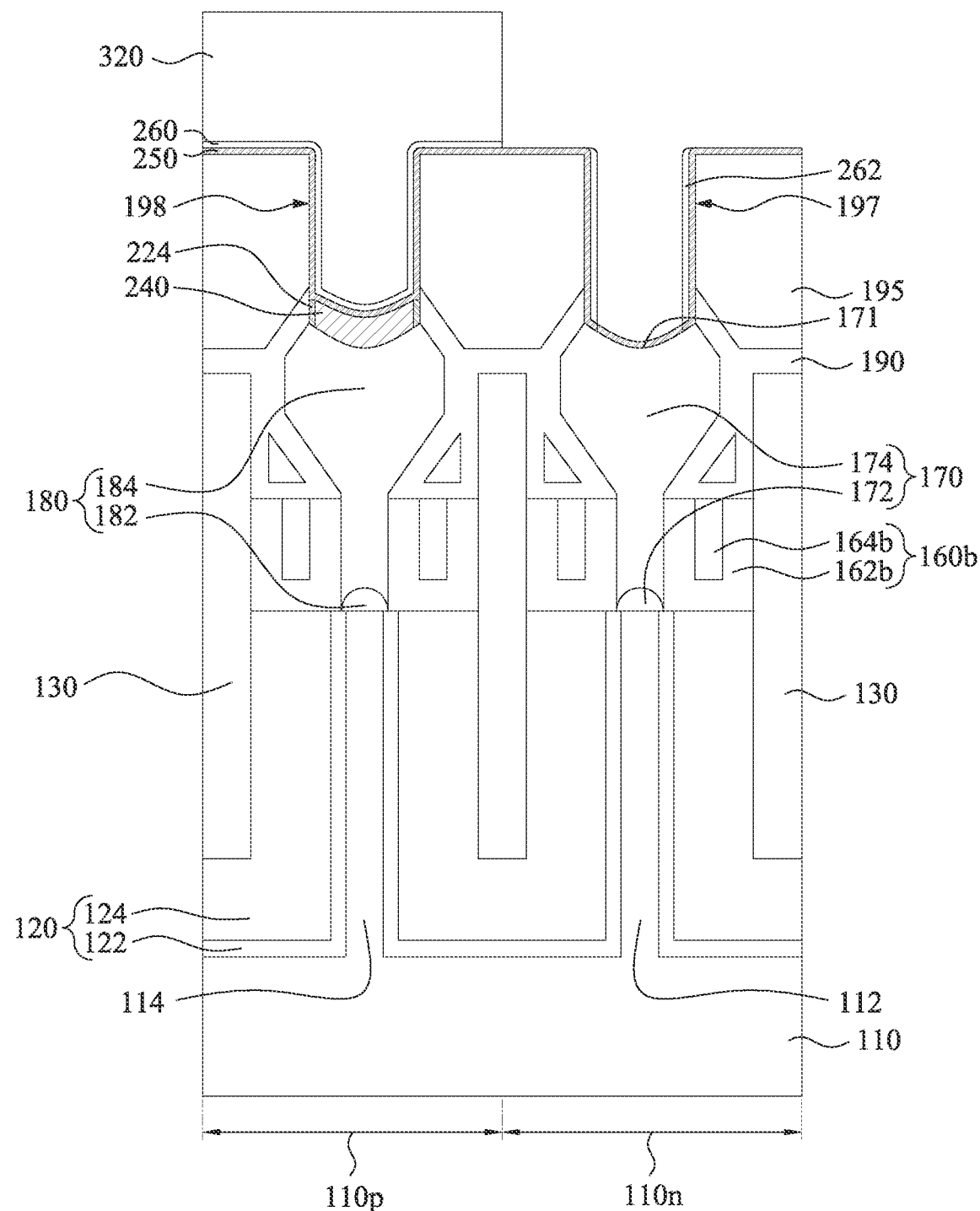

Reference is made to FIG. 18. A directional etching process is performed on the portion of the fourth mask layer 260 above the N-type region 110n to remove the horizontal portions of the fourth mask layer 260. The directional etching process may have suitable etch selectivity between materials of the third and fourth mask layers 250 and 260. For example, the etch process can have a higher etch rate of the fourth mask layer 260 than the etch rate of the third mask layer 250. In some embodiments, the etching selectivity of the third mask layer 250 to the fourth mask layer 260 is greater than about 10, e.g., in a range of about 10 to about 50. In some embodiments, etching rate difference be achieved by adjusting suitable parameters of the etch process such as, for example, etchant gas type, gas flow rate, etching temperature, plasma power, chamber pressure, other suitable parameters, and/or combinations thereof. The remaining vertical portions of the fourth mask layer 260 above the N-type region 110n form third spacers 262 on the sidewalls of the opening 197. Further, a portion of the third mask layer 250 above the top surface of the epitaxial structure 170 is exposed by the third spacers 262.

Figure 19:
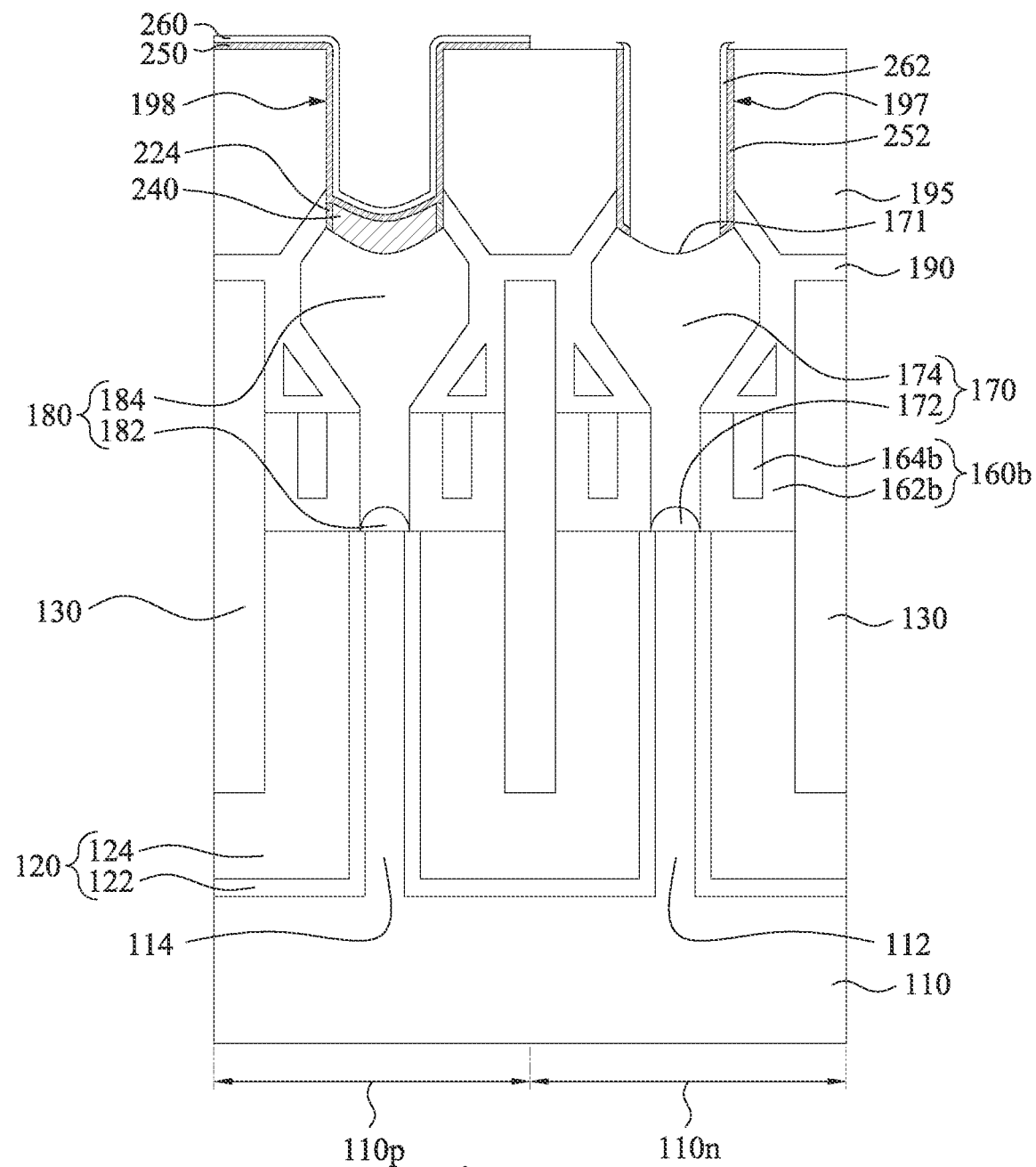

Reference is made to FIG. 19. After the formation of the third spacers 262, the second photoresist layer 320 (see FIG. 18) is removed from the P-type region 110p of the substrate 110 by an appropriate process, such as etching or ashing process. In some embodiments, the fourth mask layer 260 is configured to be a protection layer for protecting the third mask layer 250 from being removed during the removal of the second photoresist layer 320. In some other embodiments, the fourth mask layer 260 can be omitted if the removal process us an etching process that has suitable etch selectivity between materials of the third mask layer 250 and the second photoresist layer 320.

Subsequently, a portion of the third mask layer 250 exposed by the fourth mask layer 260 or the third spacers 262 is removed by using the fourth mask layer 260 and the third spacers 262 as etching masks. The removal process may be an etching process that has suitable etch selectivity between materials of the third and fourth mask layers 250 and 260 and the ILD 195. For example, the etch process can have a higher etch rate of the third mask layer 250 than the etch rate of the fourth mask layer 260 and the etch rate of ILD 195. As such, the etch process does not damage the ILD 195 (and the CESL 190). In some embodiments, etching rate difference be achieved by adjusting suitable parameters of the etch process such as, for example, etchant gas type, gas flow rate, etching temperature, plasma power, chamber pressure, other suitable parameters, and/or combinations thereof. As such, the top surface 171 of the epitaxial structure 170 is exposed by the third mask layer 250. Further, the remaining vertical portions of the third mask layer 250 above the N-type region 110n form fourth spacers 252 on the sidewalls of the opening 197.

Figure 20:
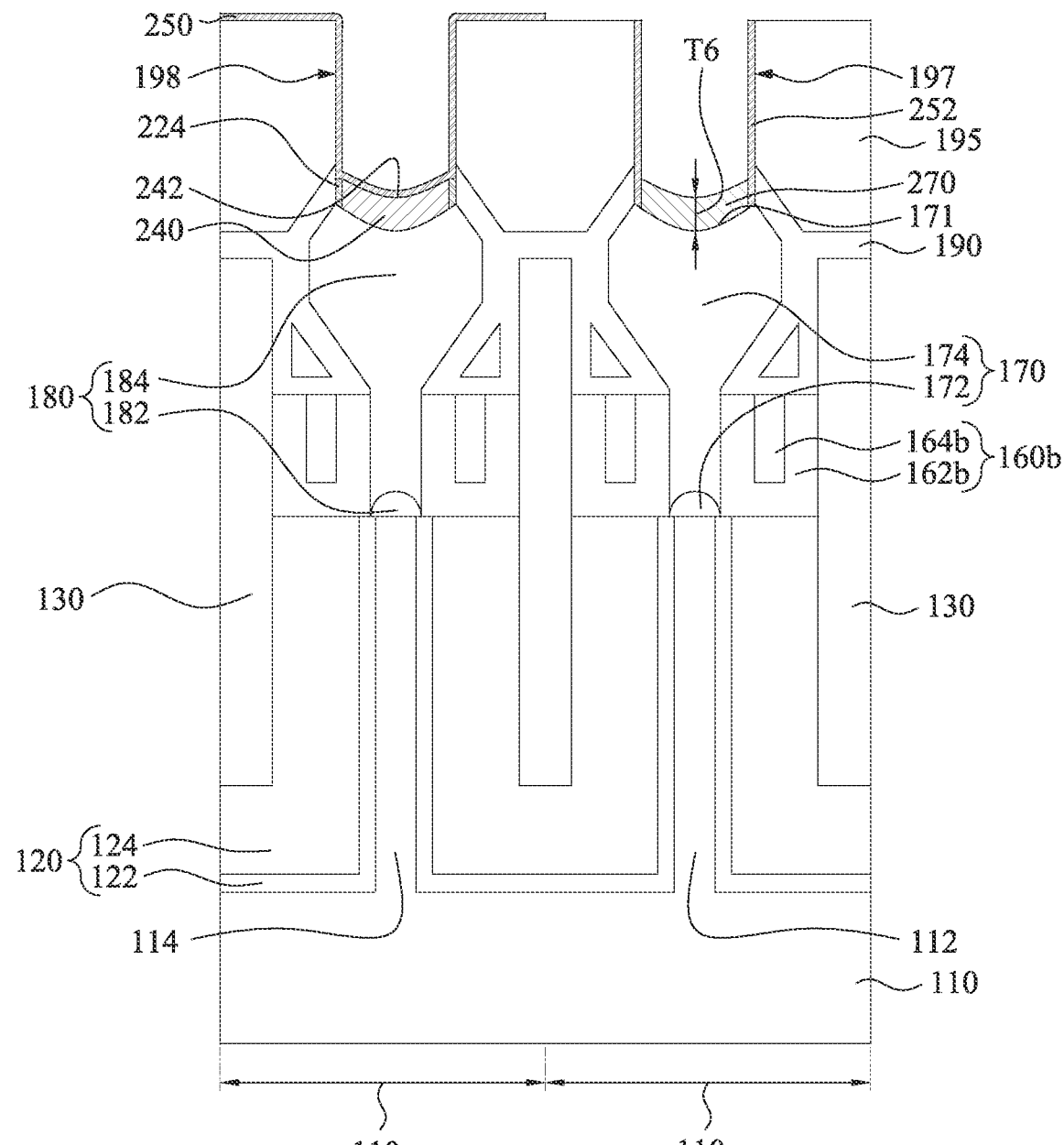

Reference is made to FIG. 20. Another surface cleaning process is performed on the structure of FIG. 19 for removing native oxides on the top surface 171 of the epitaxial structure 170. The fourth mask layer 260 and the third spacers 262 (see FIG. 19) are also removed during this surface cleaning process. In some other embodiments, the fourth mask layer 260 can be omitted if the surface cleaning process barely removes the third mask layer 250 and the fourth spacers 252. As such, the remaining third mask layer 250 and the fourth spacers 252 are exposed. In some embodiments, the surface cleaning process removes portions of the remaining third mask layer 250 and the fourth spacers 252, such that the thicknesses of the remaining third mask layer 250 and the fourth spacers 252 are reduced. In some other embodiments, the fourth mask layer 260 can be omitted if the surface cleaning process barely removes the third mask layer 250 and the fourth spacers 252. The fourth spacers 252 expose the top surface 171 of the epitaxial structure 170 while the remaining third mask layer 250 covers the top surface 242 of the epitaxial layer 240.

An epitaxial layer 270 is then formed above the top surface 171 of the epitaxial structure 170. The epitaxial layer 270 includes a single element semiconductor material, such as germanium (Ge) or silicon (Si), compound semiconductor materials, such as gallium arsenide (GaAs) or aluminum gallium arsenide (AlGaAs), or a semiconductor alloy, such as silicon germanium (SiGe) or gallium arsenide phosphide (GaAsP). In some embodiments, where an N-type device is desired, the epitaxial structures 170 may include an epitaxially grown silicon phosphorus (SiP) or silicon carbon (SiC). The epitaxial processes include CVD deposition techniques (e.g., vapor-phase epitaxy (VPE) and/or ultra-high vacuum CVD (UHV-CVD)), molecular beam epitaxy, and/or other suitable processes. Desired n-type impurities may be, or may not be, doped while the epitaxial process. The doping may be achieved by an ion implantation process, plasma immersion ion implantation (PIII) process, gas and/or solid source diffusion process, other suitable process, or combinations thereof. In some embodiments, the epitaxial layer 270 may have a material substantially the same as the second epitaxial layer 174 of the epitaxial structure 170. In some embodiments, a thickness T6 of the epitaxial layer 270 is about 5 nm to about 10 nm. If the thickness T6 of the epitaxial layer 270 is less than about 5 nm, the epitaxial layer 270 may be totally consumed during the formation of the second metal alloy layer 280 (see FIG. 22); if the thickness T6 of the epitaxial layer 270 is greater than about 10 nm, a resistance between a contact 290*a* (see FIGS. 23A and 23B) and the epitaxial structure 170 is increased.

Figure 21:
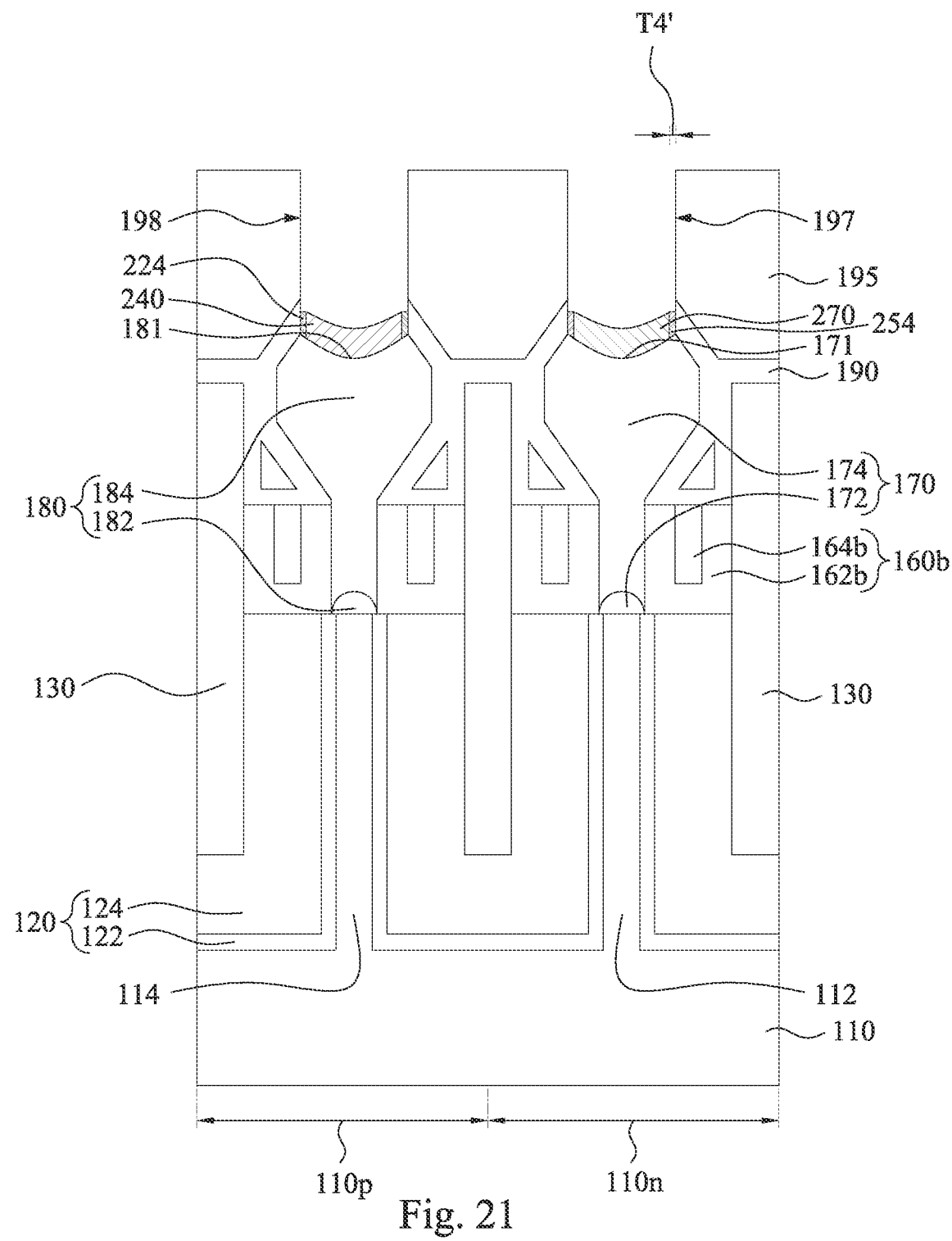

Reference is made to FIG. 21. The remaining third mask layer 250 and the fourth spacers 252 (see FIG. 20) are removed using an etching process, such that the sidewalls of the ILD 195 and the top surface 242 of the epitaxial layer 240 are exposed. On the other hand, since portions of the fourth spacers 252 are sandwiched between the CESL 190 and the epitaxial layer 270, these portions of the fourth spacers 252 may not be removed and form (dielectric) residues 254 between the CESL 190 (or the ILD 195) and the epitaxial layer 270. Hence, the epitaxial layer 270 is spaced apart from the CESL 190 and the ILD 195. In some embodiments, the residues 254 have a thickness T4' in a range of about 0.5 nm to about 4.5 nm.

Figure 22:
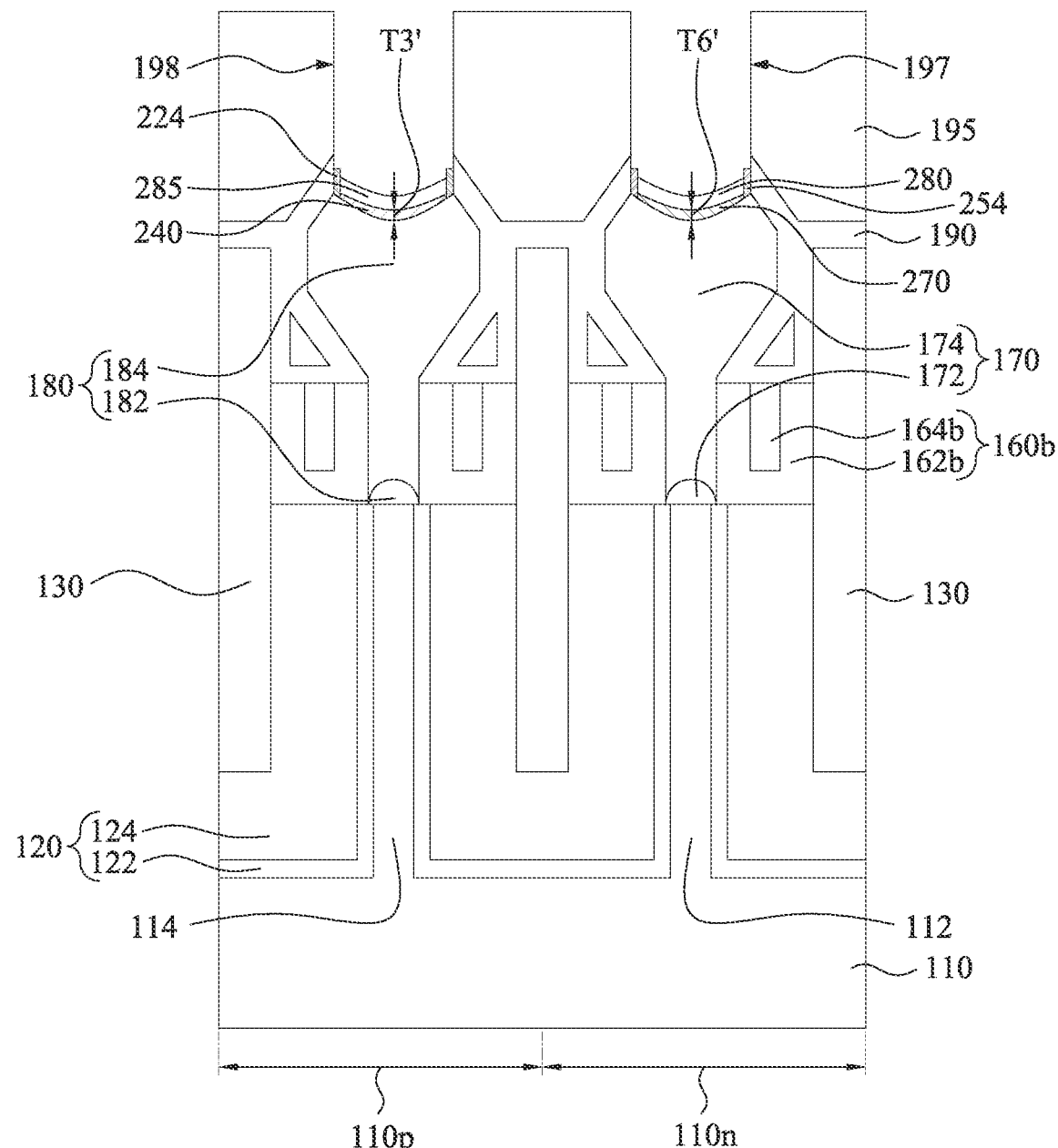

Reference is made to FIG. 22. A first metal alloy layer 280 and a second metal alloy layer 285 are respectively formed above the epitaxial layer 270 and the epitaxial layer 240. The first metal alloy layer 280 and the second metal alloy layer 285, which may be silicide layers, are respectively formed in the openings 197 and 198 and over the exposed epitaxial layer 270 and the exposed epitaxial layer 240 by a self-aligned silicide (salicide) process. The silicide process converts the surface portions of the epitaxial layer 270 and the epitaxial layer 240 into the silicide contacts. Silicide processing involves deposition of a metal that undergoes a silicidation reaction with silicon (Si). In order to form silicide contacts on the epitaxial layer 270 and the epitaxial layer 240, a metal material is blanket deposited on the epitaxial layer 270 and the epitaxial layer 240. After heating the wafer to a temperature at which the metal reacts with the silicon of the epitaxial layer 270 and the epitaxial layer 240 to form contacts, unreacted metal is removed. The silicide contacts remain over the epitaxial layer 270 and the epitaxial layer 240, while unreacted metal is removed from other areas. The silicide layer may include a material selected from titanium silicide, cobalt silicide, nickel silicide, platinum silicide, nickel platinum silicide, erbium silicide, palladium silicide, combinations thereof, or other suitable materials. In some embodiments, the first metal alloy layer 280 and the second metal alloy layer 285 may include germanium.

In some embodiments, after the formation of the first metal alloy layer 280 and the second metal alloy layer 285, portions of the epitaxial layer 270 and the epitaxial layer 240 are consumed such that the thickness thereof are reduced. In some embodiments, each of the first metal alloy layer 280 and the second metal alloy layer 285 has a thickness T3' (T6') in a range of about 1 nm to about 2 nm. If the thickness T3' (T6') is lower than about 1 nm or greater than about 2 nm, a resistance between a contact 290*b* (290*a*) (see FIGS. 23A and 23B) and the epitaxial structure 180 (170) is increased.

Figure 23A:
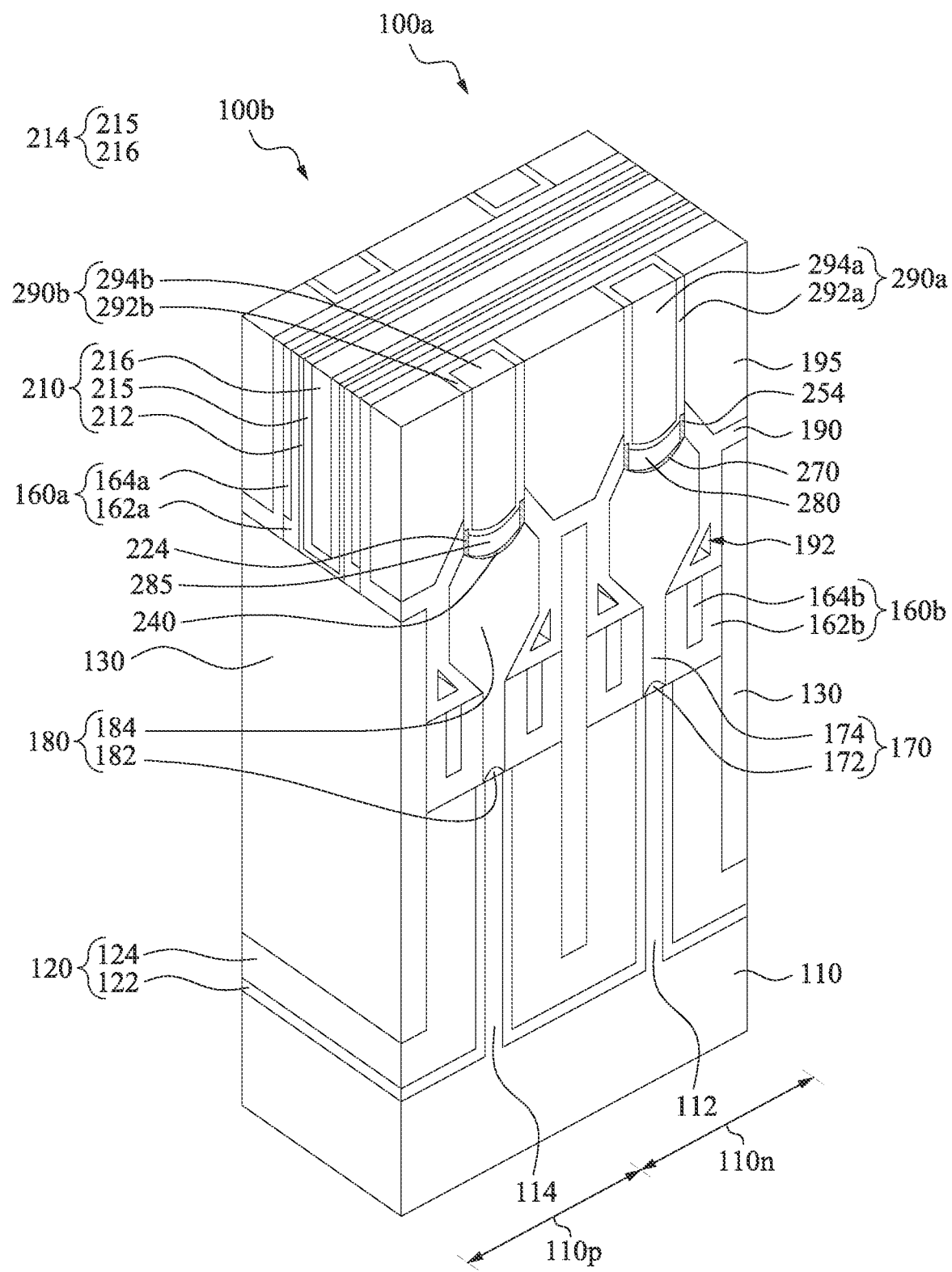
Figure 23B:
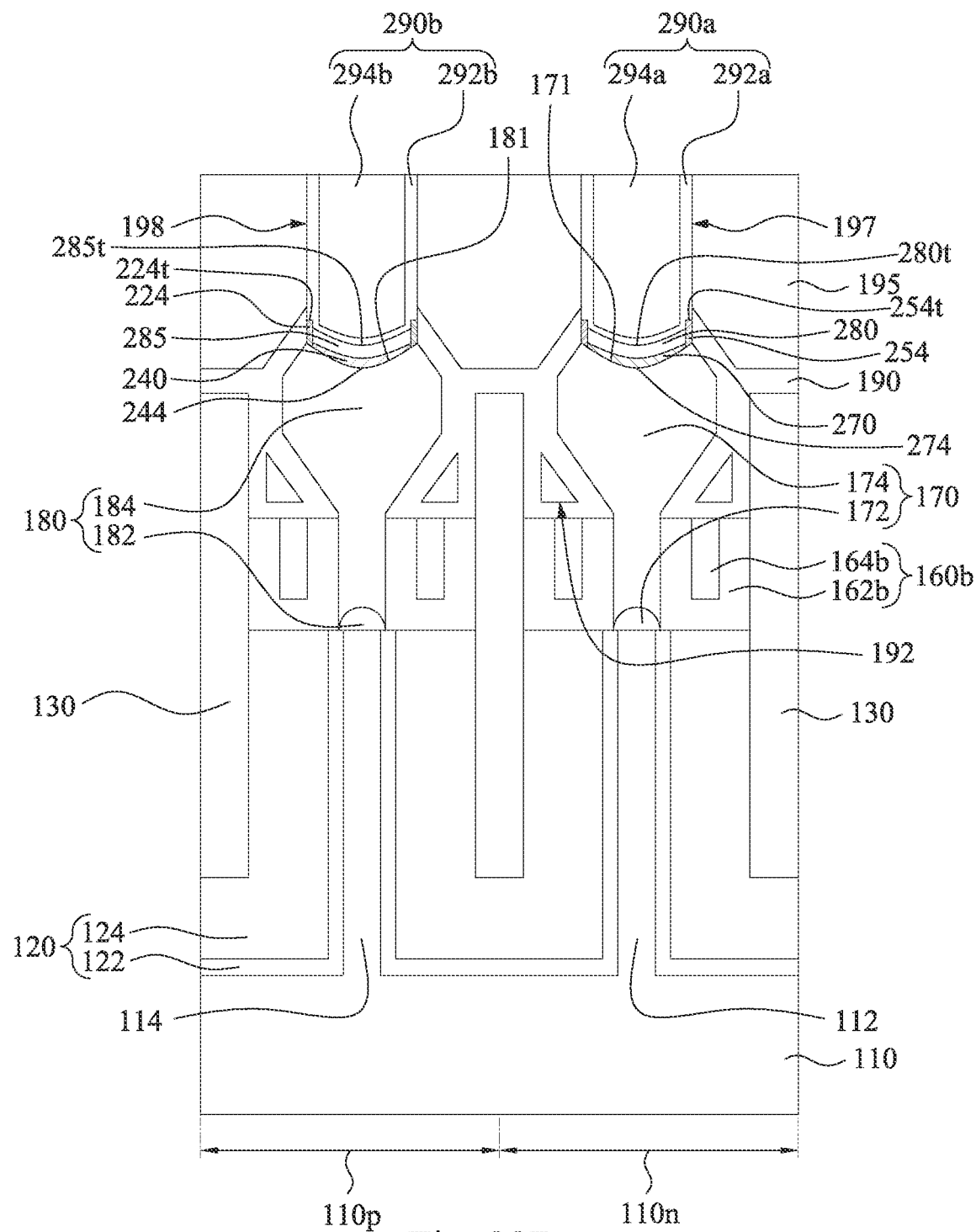

Reference is made to FIGS. 23A and 23B, where FIG. 23B is a side view of the semiconductor device of FIG. 23A. Barrier layers 292*a* and 292*b* are respectively formed on the first metal alloy layer 280 and the second metal alloy layer 285 and respectively in the openings 197 and 198. The barrier layer 292*a* (292*b*) can improve the adhesion between the first metal alloy layer 280 (the second metal alloy layer 285) and a material formed thereon (such as filling material 294*a* (294*b*)). The barrier layers 292*a* and 292*b* may include metal nitride materials. For example, the barrier layers 292*a* and 292*b* include Ti, TiN, or combination thereof. In some embodiments, the barrier layers 292*a* and 292*b* include a single layer or multiple layers. For a multiple-layer configuration, the layers include different compositions of metal nitride from each other. For example, the barrier layers 292*a* and 292*b* has a metal layer including Ti and a metal nitride layer including TiN.

Filling materials 294*a* and 294*b* are respectively formed in the openings 197 and 198 and over the barrier layers 292*a* and 292*b*. The filling materials 294*a* and 294*b* are electrically connected to the epitaxy structures 170 and 180. In some embodiments, metal materials can be filled in the openings, and excessive portions of the metal materials and the barrier layer are removed by performing a CMP process to form the filling materials 294*a* and 294*b* and the barrier layer 292*a* and 292*b*. The filling materials 294*a* and 294*b* can be made of tungsten, aluminum, copper, or other suitable materials. The filling material 294*a* (294*b*) and the barrier layer 292*a* (292*b*) are referred to as contact 290*a* (290*b*).

In FIGS. 23A and 23B, the semiconductor device includes transistors 100*a* and 100*b*. The transistor 100*a* is an N-type transistor, and the transistor 100*b* is a P-type transistor. The transistor 100*a* includes the epitaxial structures 170 serve as source/drain features of the transistor 100*a*. The transistor 100*a* further includes isolation structure (i.e., the CESL 190 and the ILD 195) above the epitaxial structures 170. The CESL 190 is conformal to the sidewalls of the epitaxial structures 170, and the ILD 195 is above the CESL 190. In some embodiments, some of the bottom air gaps 192 are defined by the CESL 190 and formed under the epitaxial structure 170.

The epitaxial layer 270 is above the epitaxial structure 170, and the first metal alloy layer 280 is above the epitaxial layer 270. The epitaxial layer 270 and the first metal alloy layer 280 are both spaced apart from the CESL 190. For example, residues 254 are between and in direct contact with the epitaxial layer 270 and the CESL 190 and also between the first metal alloy layer 280 and the CESL 190. In some embodiments, a topmost surface 254*t* of the residue 254 is higher than a topmost surface 280*t* of the first metal alloy layer 280. In other words, the residue 254 protrudes from the first metal alloy layer 280.

The transistor 100*a* further includes the contact 290*a*. The barrier layer 292*a* of the contact 290*a* is in direct contact with the first metal alloy layer 280 and the residues 254. In some embodiments, top portions of the residues 254 are embedded in the barrier layer 292*a*. In some embodiments, a width of the contact 290*a* is greater than a width of the first metal alloy layer 280. The width of the contact 290*a* is also greater than a width of the epitaxial layer 270. The width of the contact 290a is less than a width of the second epitaxial layer 174 of the epitaxial structure 170. Further, the top surface 171 of the epitaxial structure 170 is wider than a bottom surface 274 of the epitaxial layer 270.

Similarly, the transistor 100b includes the epitaxial structures 180 serve as source/drain features of the transistor 100b. The isolation structure (i.e., the CESL 190 and the ILD 195) are above the epitaxial structures 180. The CESL 190 is conformal to the sidewalls of the epitaxial structures 180, and the ILD 195 is above the CESL 190. In some embodiments, the some of the bottom air gaps 192 are defined by the CESL 190 and formed under the epitaxial structure 180.

The epitaxial layer 240 is above the epitaxial structure 180, and the second metal alloy layer 285 is above the epitaxial layer 270. The epitaxial layer 240 and the second metal alloy layer 285 are both spaced apart from the CESL 190. For example, residues 224 are between and in direct contact with the epitaxial layer 240 and the CESL 190 and also between the second metal alloy layer 285 and the CESL 190. In some embodiments, a topmost surface 224t of the residue 224 is higher than a topmost surface 285t of the second metal alloy layer 285. In other words, the residue 224 protrudes from the second metal alloy layer 285.

The transistor 100b further includes the contact 290b. The barrier layer 292b of the contact 290b is in direct contact with the second metal alloy layer 285 and the residues 224. In some embodiments, top portions of the residues 224 are embedded in the barrier layer 292b. In some embodiments, a width of the contact 290b is greater than a width of the second metal alloy layer 285. The width of the contact 290b is also greater than a width of the epitaxial layer 240. The width of the contact 290b is less than a width of the second epitaxial layer 184 of the epitaxial structure 180. Further, the top surface 181 of the epitaxial structure 180 is wider than a bottom surface 244 of the epitaxial layer 240.

The epitaxial structures 170 and 180 are high activations and have high doping concentrations during the operations in FIG. 8. However, some high-temperature processes, such as the formation of the ILD 195, reduce the doping concentrations of the epitaxial structures 170 and 180 also lower the activations thereof. As such, the contact resistance may be increased if the contacts 290a and 290b are in direct contact with the epitaxial structures 170 and 180. In FIGS. 23A and 23B, the epitaxial layers 240 and 270 remain high activations and have high doping concentrations since they are formed after the high-temperature processes. The epitaxial layers 240 and 270 can improve the contact resistance between the contact 290a (290b) and the epitaxial structures 170 (180).

Figure 24:
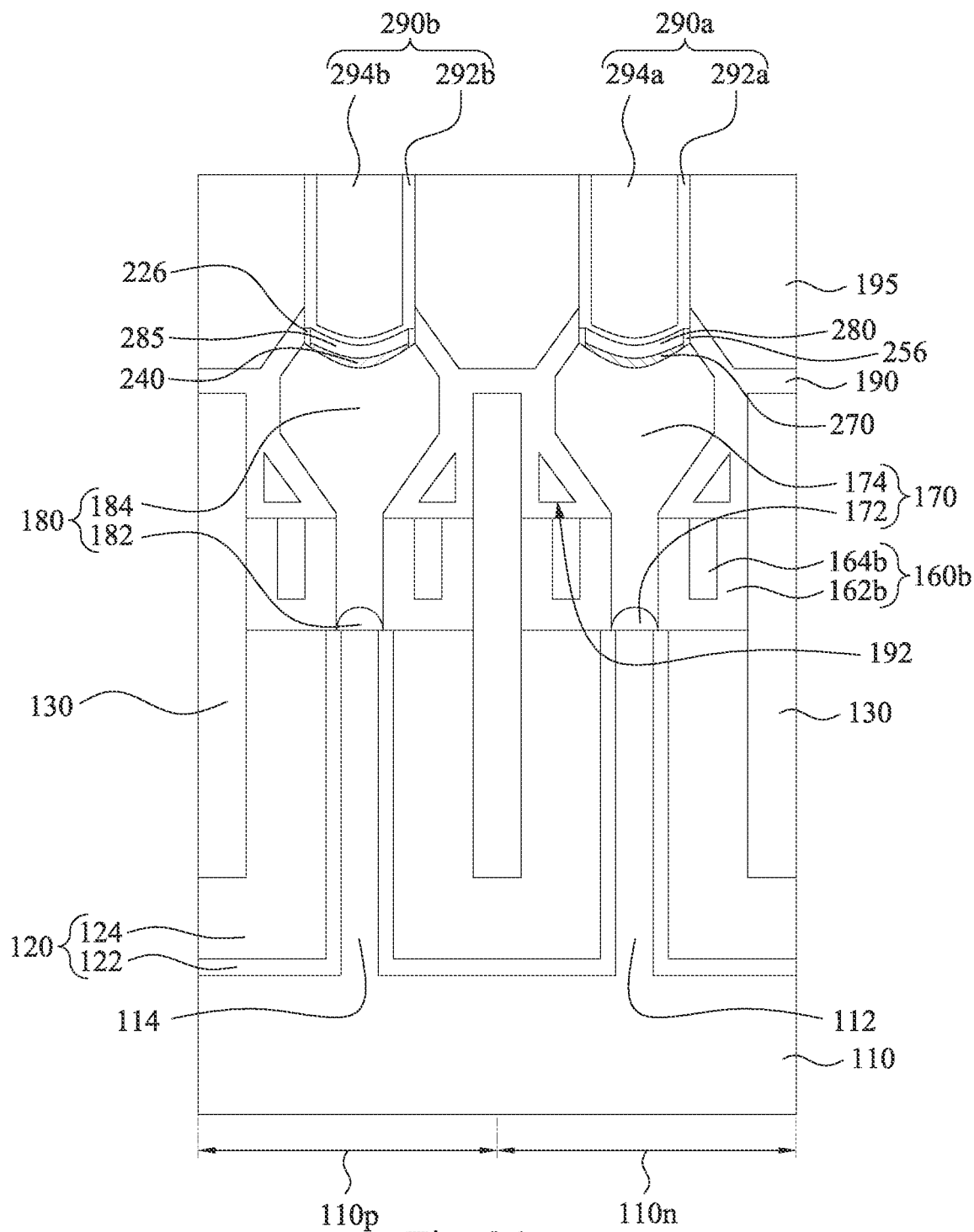
FIGS. 24 and 25 are side views of semiconductor devices in accordance with some embodiments of the present disclosure.
Figure 25:
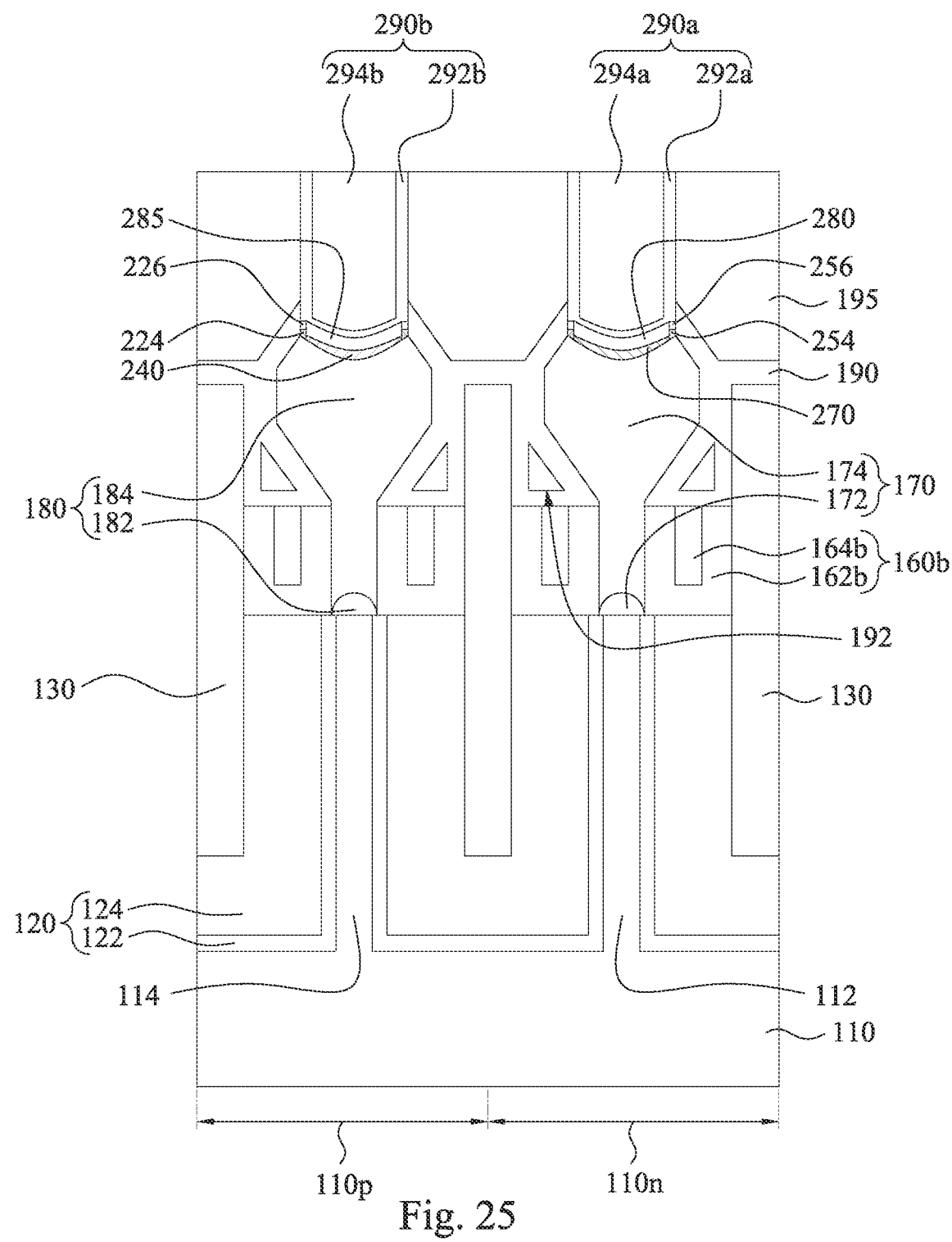

FIGS. 24 and 25 are side views of semiconductor devices in accordance with some embodiments of the present disclosure. The difference between the semiconductor devices in FIGS. 24, 25, and 23B pertains to the presence of the residues 224 and/or 254. In some embodiments, as shown in FIG. 24, the second spacers 222 (see FIG. 15) and/or the fourth spacers 252 (see FIG. 20) are completely removed, such that top air gaps 226 are formed on the epitaxial structure 180 and/or top air gaps 256 are formed on the epitaxial structure 170. In still some other embodiments, as shown in FIG. 25, top air gaps 226 (and/or 256) are formed above the residues 224 (and/or 254). Other relevant structural details of the semiconductor devices in FIGS. 24 and 25 are all the same as or similar to the semiconductor devices in FIGS. 23A and 23B, and, therefore, a description in this regard will not be repeated hereinafter.

FIGS. 26-36B illustrate a method for manufacturing a semiconductor device at various stages in accordance with some embodiments of the present disclosure. In some embodiments, the semiconductor device shown in FIGS. 26-36B may be intermediate devices fabricated during processing of an integrated circuit (IC), or a portion thereof, that may include static random access memory (SRAM), logic circuits, passive components and/or active components, such as p-type field effect transistors (PFETs), n-type FETs (NFETs), multi-gate FETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

Figure 26:
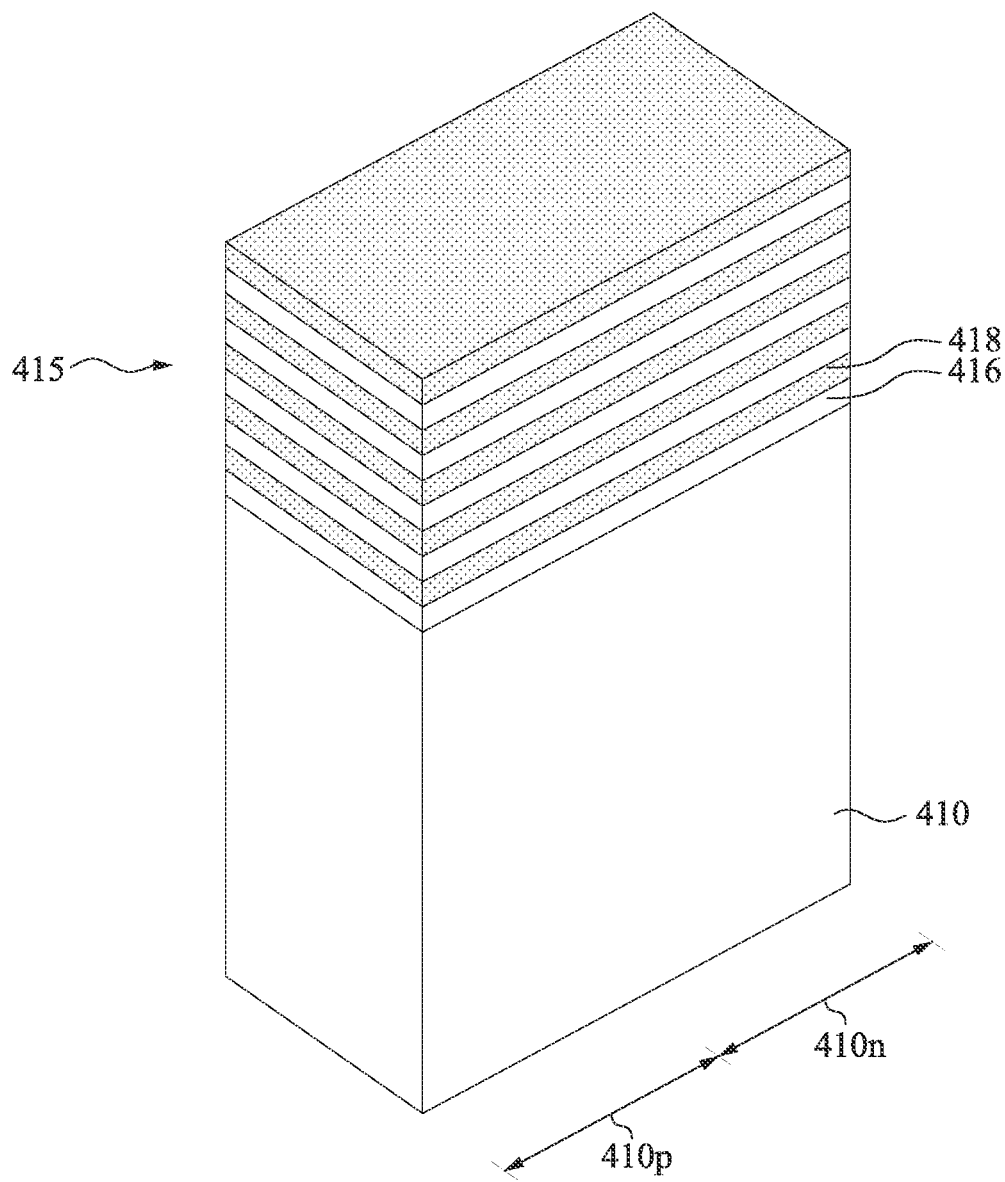
FIGS. 26-36B illustrate a method for manufacturing a semiconductor device at various stages in accordance with some embodiments of the present disclosure.

Reference is made to FIG. 26. A substrate 410, which may be a part of a wafer, is provided. The substrate 410 includes at least one N-type region 410n and at least one P-type region 410p. At least one N-type device will be formed on the N-type region 410n, and at least one P-type device will be formed on the P-type region 410p. For ease of explanation, it is assumed that in FIGS. 26-36B, the substrate 410 includes one N-type region 410n and one P-type region 410p adjacent the N-type region 410n. In some embodiments, the substrate 410 may include silicon (Si). Alternatively, the substrate 410 may include germanium (Ge), silicon germanium (SiGe), gallium arsenide (GaAs) or other appropriate semiconductor materials. In some embodiments, the substrate 410 may include a semiconductor-on-insulator (SOI) structure such as a buried dielectric layer. Also alternatively, the substrate 410 may include a buried dielectric layer such as a buried oxide (BOX) layer, such as that formed by a method referred to as separation by implantation of oxygen (SIMOX) technology, wafer bonding, SEG, or another appropriate method. In various embodiments, the substrate 410 may include any of a variety of substrate structures and materials.

A stacked structure 415 is formed on the substrate 410 through epitaxy, such that the stacked structure 415 forms crystalline layers. The stacked structure 415 includes first semiconductor layers 416 and second semiconductor layers 418 stacked alternately. The first semiconductor layers 416 and the second semiconductor layers 418 are made of materials having different lattice constants, and may include one or more layers of Si, Ge, SiGe, GaAs, InSb, GaP, GaSb, InAlAs, InGaAs, GaSbP, GaAsSb or InP. In some embodiments, the first semiconductor layers 416 and the second semiconductor layers 418 are made of Si, a Si compound, SiGe, Ge or a Ge compound. In FIG. 26, five layers of the first semiconductor layer 416 and five layers of the second semiconductor layer 418 are disposed. However, the number of the layers are not limited to five, and may be as small as 1 (each layer) and in some embodiments, 2-10 layers of each of the first and second semiconductor layers are formed. By adjusting the numbers of the stacked layers, a driving current of the GAA FET device can be adjusted.

In some embodiments, the first semiconductor layers 416 can be SiGe layers having a germanium atomic percentage greater than zero. In some embodiments, the germanium percentage of the first semiconductor layers 416 is in the range between about 20 percent and about 30 percent. In some embodiments, the thickness of the first semiconductor layers 416 is in the range between about 10 nm and about 20 nm.

In some embodiments, the second semiconductor layers 418 may be pure silicon layers that are free from germanium. The second semiconductor layers 418 may also be substantially pure silicon layers, for example, with a germanium atomic percentage lower than about 1 percent. Furthermore, the second semiconductor layers 418 may be intrinsic, which are not doped with p-type and n-type impurities. In some embodiments, the thickness of the second semiconductor layers 418 is in the range between about 10 nm and about 20 nm.

Figure 27:
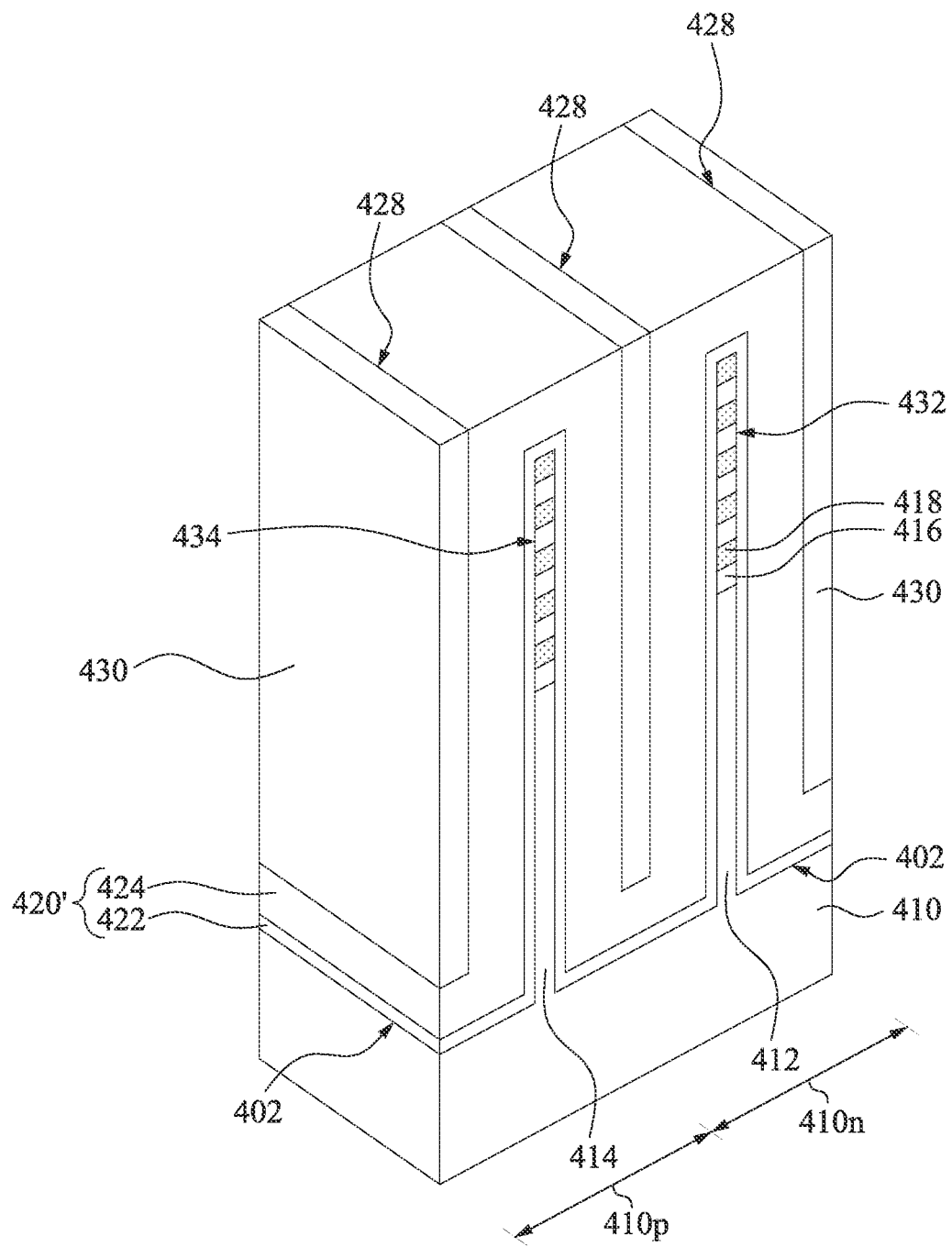

Reference is made to FIG. 27. The stacked structure 415 (see FIG. 26) is patterned into fin structures 432 and 434 and trenches 402. The fin structures 432 and 434 may serve as active regions (e.g., channels and source/drain features) of transistors. The number of the fin structures 432 and 434 is not limited to, and may be as small as one and three or more. In some embodiments, one or more dummy fin structures are formed on both sides of the fin structures 432 and 434 to improve pattern fidelity in the patterning operations.

The trenches 402 extend into the substrate 410, and have lengthwise directions substantially parallel to each other. The trenches 402 form base portions 412 and 414 in the substrate 410, where the base portions 412 and 414 protrude from the substrate 410, and the fin structures 432 and 434 are respectively formed above the base portions 412 and 414 of the substrate 410.

Spacing layer material 420' is deposited on the exposed sidewalls and top planar surfaces of the fin structures 432 and 434. In some embodiments, the spacing layer material 420' includes a liner layer 422 and a second liner layer 424. The spacing layer material 420' can be deposited between the fin structures 432 and 434 to form openings 428, in accordance with some embodiments. The manufacturing processes and/or materials of the spacing layer material 420' is similar to or the same as the spacing layer material 120' shown in FIG. 2, and, therefore, a description in this regard will not be repeated hereinafter.

Subsequently, Self-aligned isolation fins 430 are then formed in the openings 428. In some embodiments, forming the self-aligned isolation fins 430 further includes performing a planarization step (e.g., a CMP step) to remove the excess dielectric materials on the upper surfaces of spacing layer material 420', so that the upper surfaces of the self-aligned isolation fins 430 and the upper surface of spacing layer material 420' are substantially coplanar. The manufacturing processes and/or materials of the self-aligned isolation fins 430 is similar to or the same as the self-aligned isolation fins 130 shown in FIG. 3, and, therefore, a description in this regard will not be repeated hereinafter.

Figure 28:
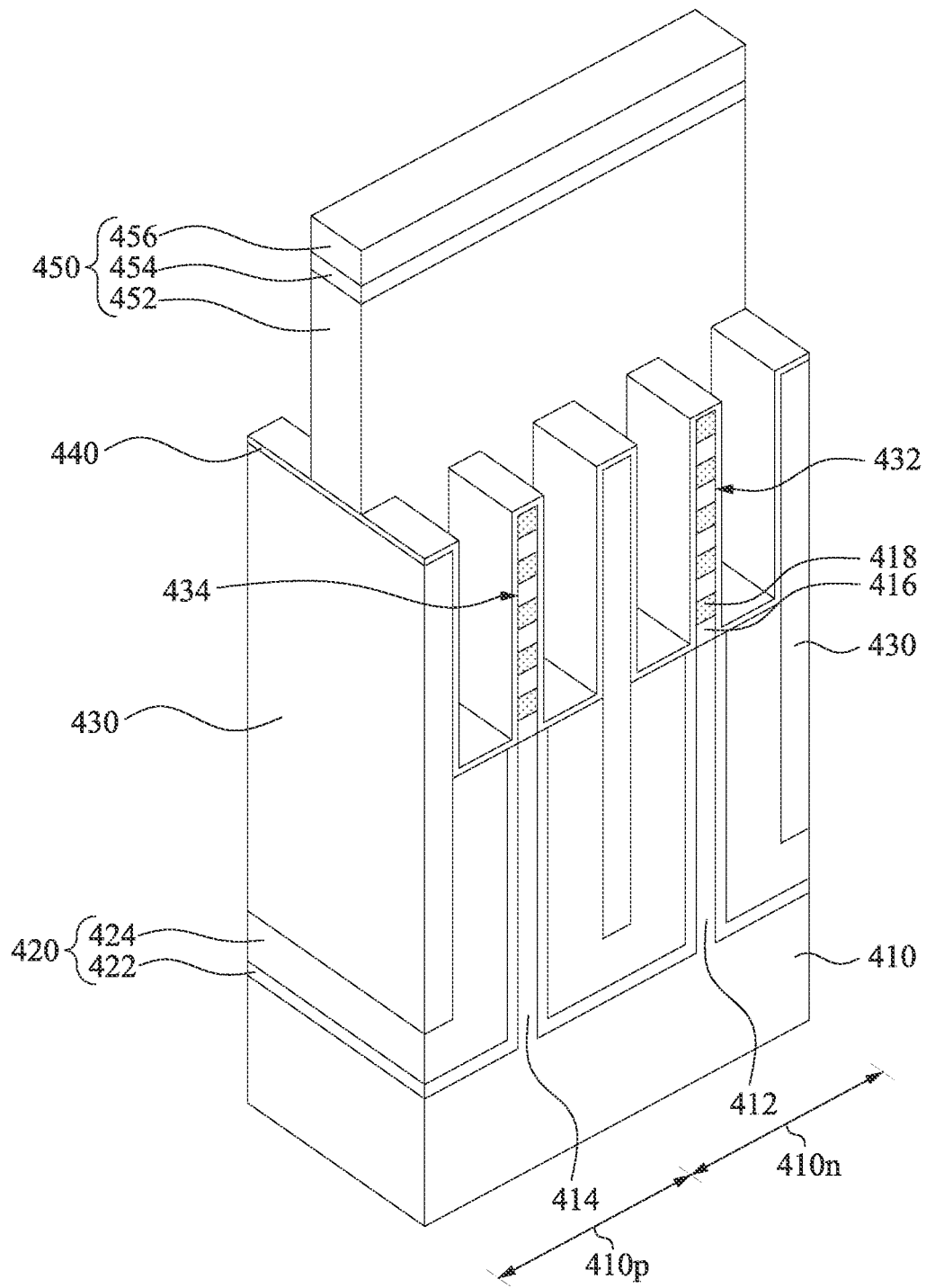

Reference is made to FIG. 28. A planarization process, e.g., a CMP process, is performed on the structure of FIG. 27 to expose the fin structures 432 and 434. The spacing layer material 420' (see FIG. 27) is then etched back such that portions of the fin structures 432 and 434 and the self-aligned isolation fins 430 protrude from the remaining portions of the spacing layer material 420'. The remaining portions of spacing layer material 420' forms spacing layer 420. The manufacturing processes of the spacing layer 420 are similar to or the same as the spacing layer 120 shown in FIG. 4, and, therefore, a description in this regard will not be repeated hereinafter.

Subsequently, a sacrificial gate dielectric layer 440 is conformally formed above the fin structures 432 and 434, the self-aligned isolation fins 430, and the spacing layer 420. At least one dummy gate structure 450 is formed above the sacrificial gate dielectric layer 440. The dummy gate structure 450 includes a dummy gate layer 452, a pad layer 454 formed over the dummy gate layer 452, and a mask layer 456 formed over the pad layer 454. The manufacturing processes of the sacrificial gate dielectric layer 440 and the dummy gate structure 450 are similar to or the same as the sacrificial gate dielectric layer 140 and the dummy gate structure 150 shown in FIG. 5, and, therefore, a description in this regard will not be repeated hereinafter.

Figure 29:
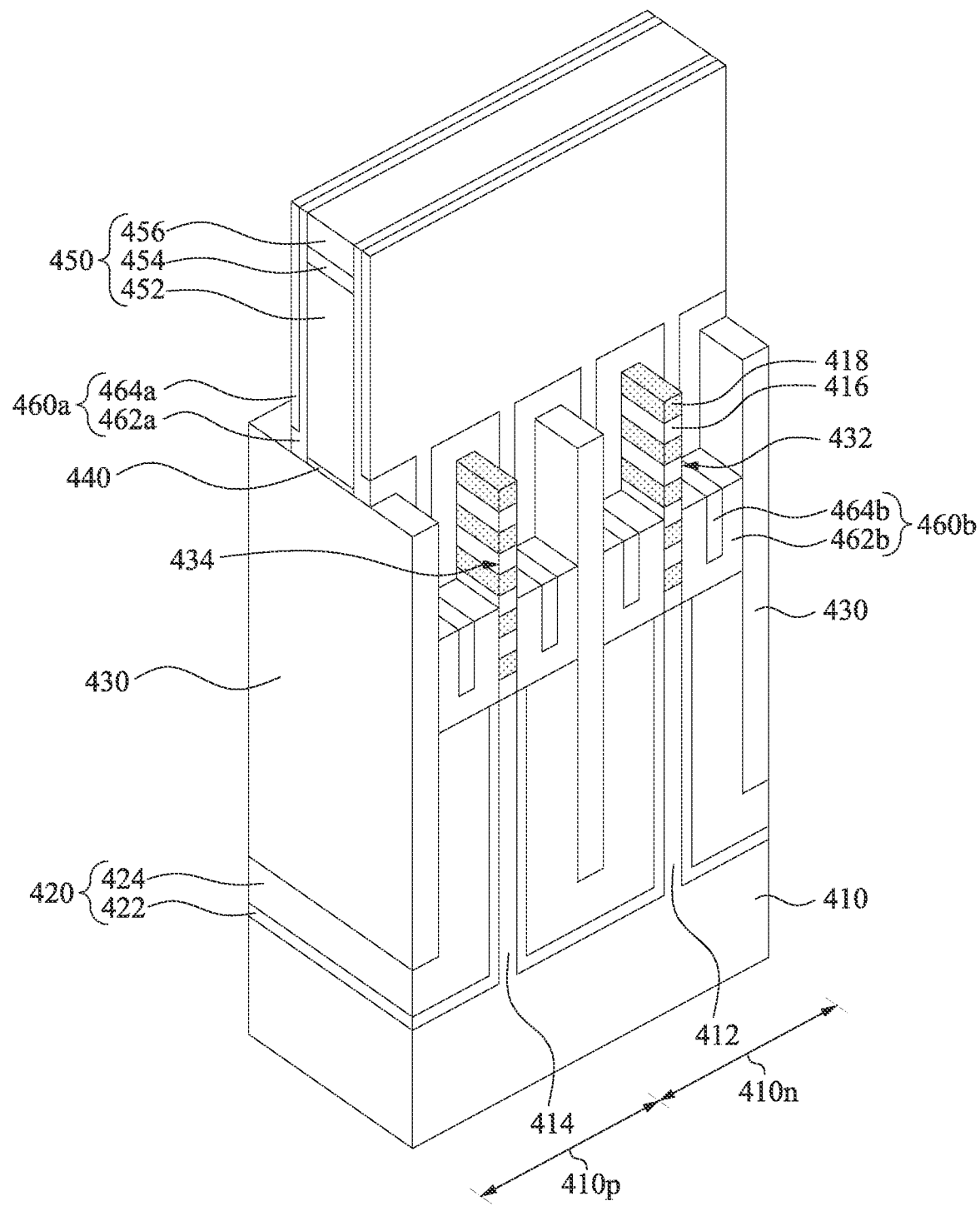

Reference is made to FIG. 29. Gate spacers 460a are formed on opposite sidewalls of the dummy gate structure 450 and fin sidewall spacers 460b are formed on opposite sidewalls of the fin structures 432 and 434. The manufacturing processes of the gate spacers 460a and the fin sidewall spacers 460b are similar to or the same as the gate spacers 160a and the fin sidewall spacers 160b shown in FIG. 7, and, therefore, a description in this regard will not be repeated hereinafter.

Figure 30:
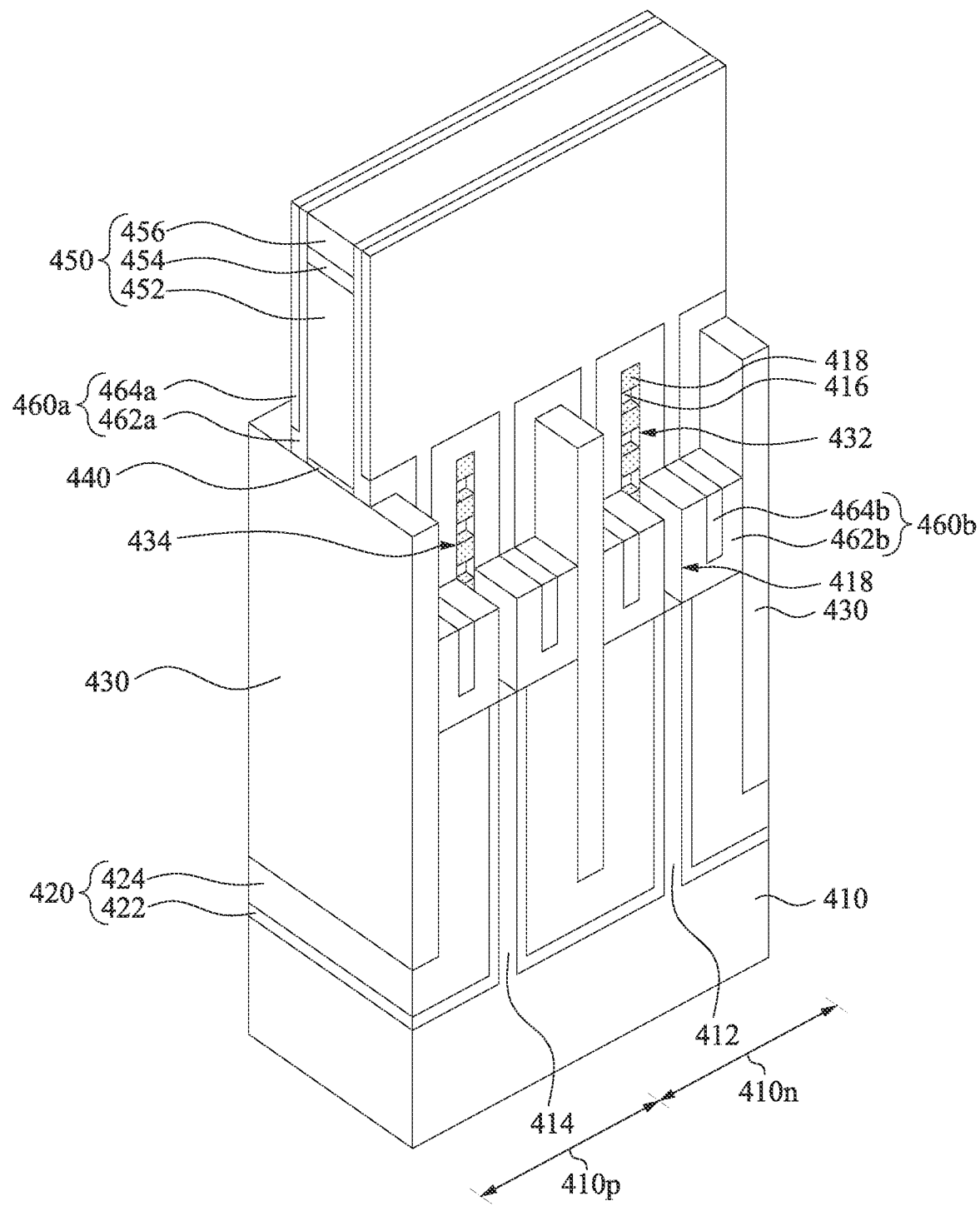

Reference is made to FIG. 30. The exposed portions of the fin structures 432 and 434 are removed by using a strained source/drain (SSD) etching process. The SSD etching process may be performed in a variety of ways. In some embodiments, the SSD etching process may be performed by a dry chemical etch with a plasma source and a reaction gas. The plasma source may be an inductively coupled plasma (ICR) etch, a transformer coupled plasma (TCP) etch, an electron cyclotron resonance (ECR) etch, a reactive ion etch (RIE), or the like and the reaction gas may be a fluorine-based gas (such as $SF_6$, $CH_2F_2$, $CH_3F$, $CHF_3$, or the like), chloride ($Cl_2$), hydrogen bromide (HBr), oxygen ($O_2$), the like, or combinations thereof. In some other embodiments, the SSD etching process may be performed by a wet chemical etch, such as ammonium peroxide mixture (APM), $NH_4OH$, TMAH, combinations thereof, or the like. In yet some other embodiments, the SSD etch step may be performed by a combination of a dry chemical etch and a wet chemical etch.

Subsequently, the first semiconductor layers 416 are horizontally recessed (etched) so that the second semiconductor layers 418 laterally extend past opposite end surfaces of the first semiconductor layers 416. In some embodiments, end surfaces of the first semiconductor layers 416 may be substantially vertically aligned with the side surfaces of the sacrificial gate electrode layer 440.

Figure 31:
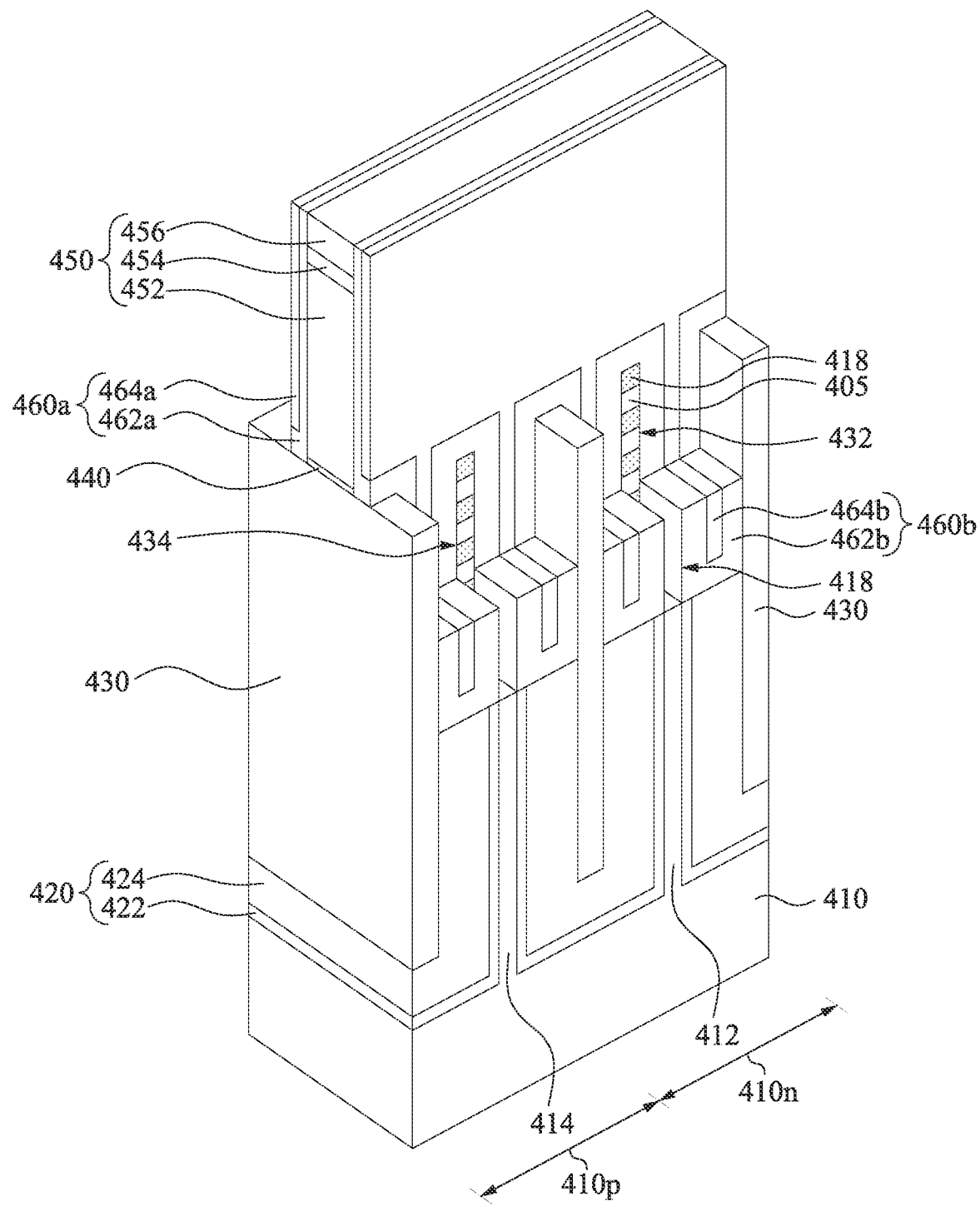

Reference is made to FIG. 31. After the first semiconductor layers 416 (see FIG. 30) are horizontally recessed, inner spacers 405 are formed on the recessed surfaces of the first semiconductor layers 416, as shown in FIG. 31. Formation of the inner spacer 405 includes depositing an inner spacer material layer (e.g., silicon nitride), followed by etching back the inner spacer material layer by an anisotropic etching process, to remove the inner spacer material layer from the substrate 410. In some embodiments, the inner spacers 405 include insulating material such as silicon nitride or the like. The thickness of the inner spacer 405 on the recessed surface of the first semiconductor layers 412 is in a range from about 5 nm to about 10 nm, in some embodiments.

Figure 32:
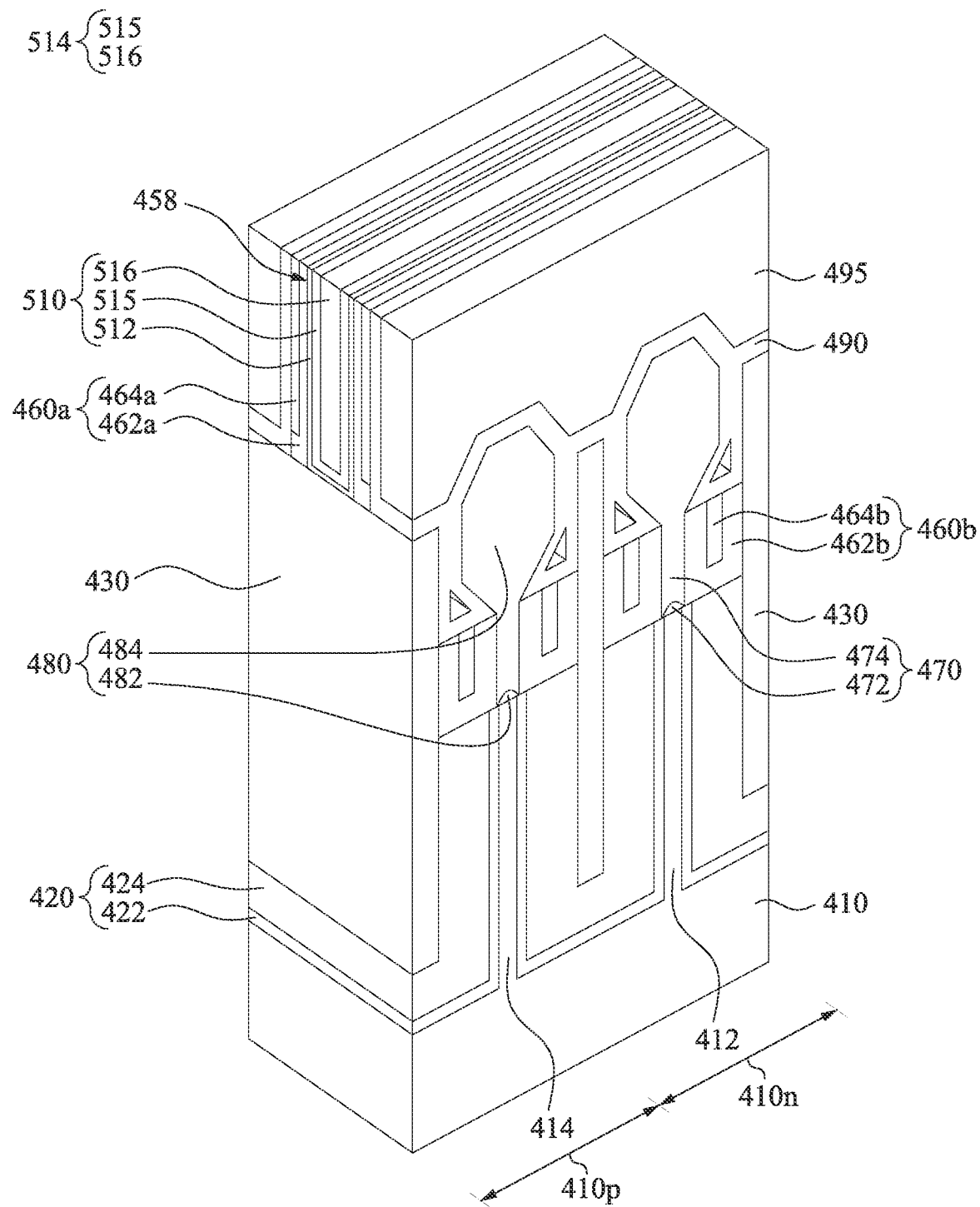

Reference is made to FIG. 32. Epitaxial structures 470 and 480, which are referred to as source/drain regions, are epitaxially grown from the exposed recessed fin structures 432 and 434 (see FIG. 31) between the fin sidewall spacers 460b. In some embodiments, the epitaxial structure 470 includes a first epitaxial layer 472 and a second epitaxial layer 474, and the epitaxial structure 480 includes a first epitaxial layer 482 and a second epitaxial layer 484. The manufacturing processes of the epitaxial structures 470 and 480 are similar to or the same as the epitaxial structures 170 and 180 shown in FIG. 8, and, therefore, a description in this regard will not be repeated hereinafter.

A contact etch stop layer (CESL) 490 is conformally formed over the epitaxial structures 470 and 480, and an interlayer dielectric (ILD) 495 is then formed on the CESL 490. The manufacturing processes of the CESL 490 and the ILD 495 are similar to or the same as the CESL 490 and the ILD 495 shown in FIG. 9, and, therefore, a description in this regard will not be repeated hereinafter.

Subsequently, a replacement gate (RPG) process scheme is employed. The dummy gate structure 450 (see FIG. 31) and the first semiconductor layers 416 (see FIG. 30) are replaced with a metal gate structure 510. The metal gate structure 510 includes a gate dielectric layer 512 and a metal gate electrode 514 over the gate dielectric layer 512. The metal gate electrode 514 may include metal layers 515, e.g., work function metal layer(s) and capping layer(s), a fill layer(s) 516, and/or other suitable layers that are desirable in a metal gate stack. The manufacturing processes of the metal gate structure 510 are similar to or the same as the metal gate structure 210 shown in FIG. 10, and, therefore, a description in this regard will not be repeated hereinafter.

Figure 33A:
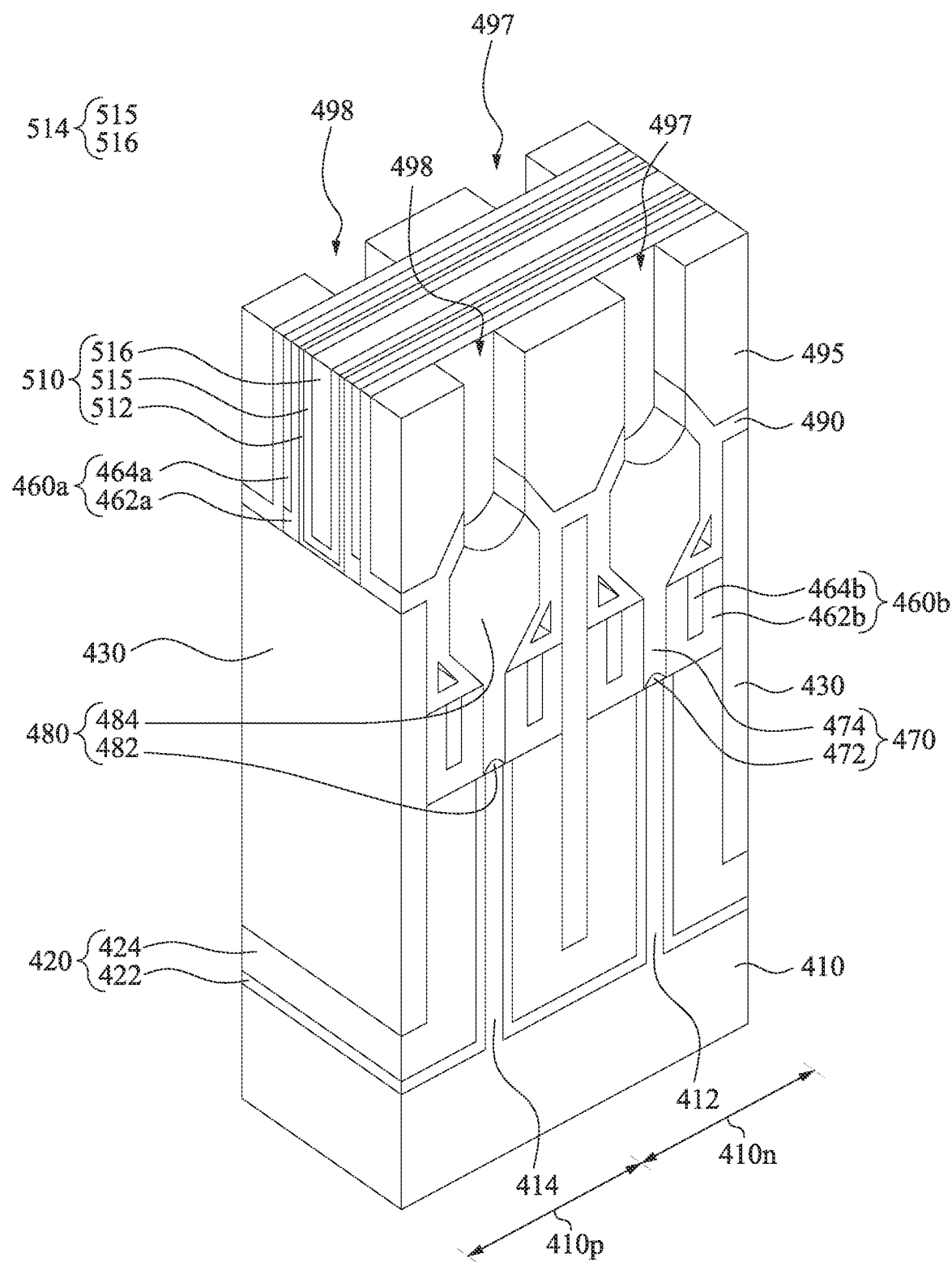
Figure 33B:
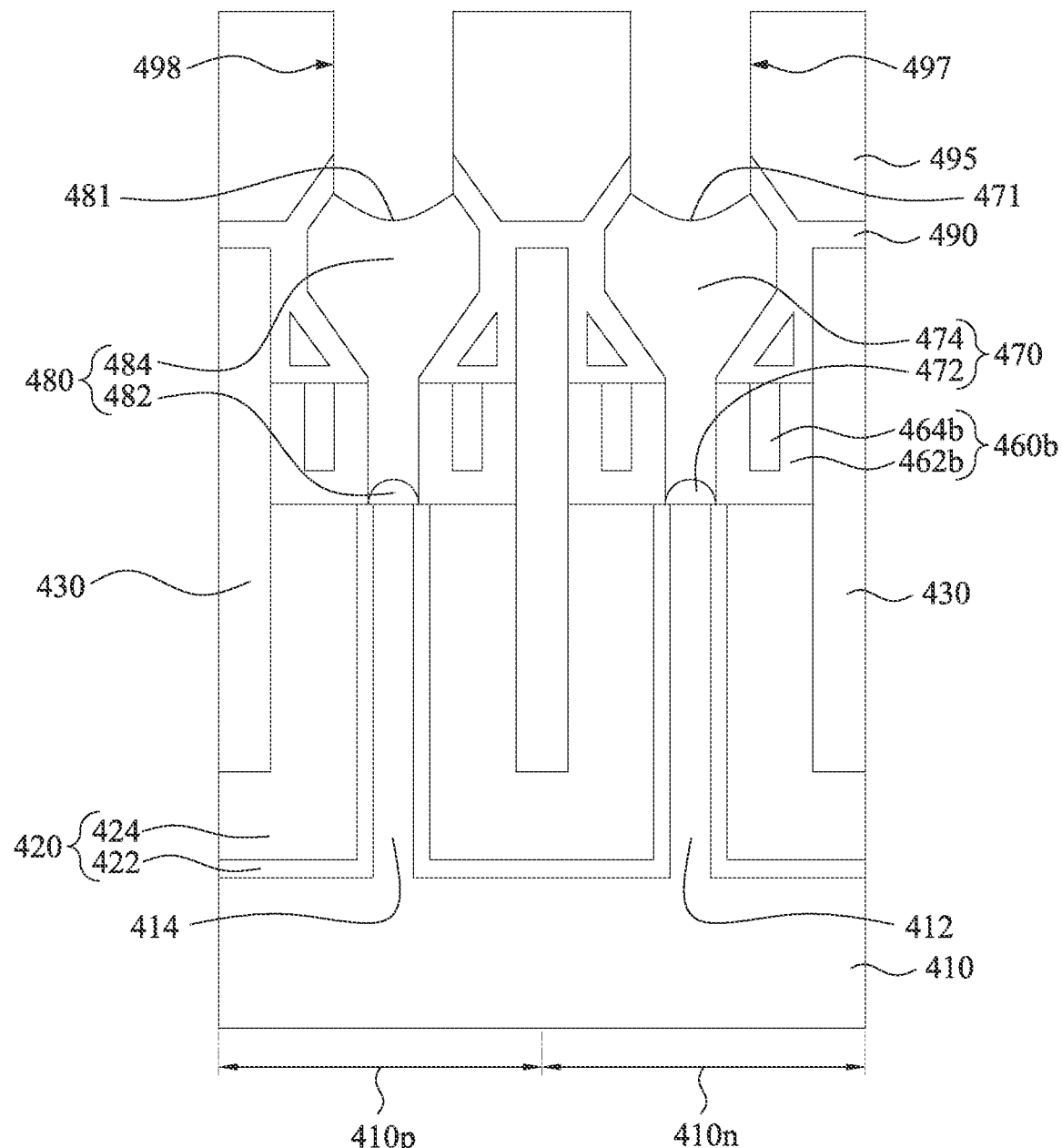

Reference is made to FIGS. 33A and 33B, where FIG. 33B is a side view of the semiconductor device in FIG. 33A. The ILD 495 and the CESL 490 are then etched to form openings 497 and 498. The manufacturing processes of the openings 497 and 498 are similar to or the same as the openings 197 and 198 shown in FIGS. 11A and 11B, and, therefore, a description in this regard will not be repeated hereinafter.

Figure 34:
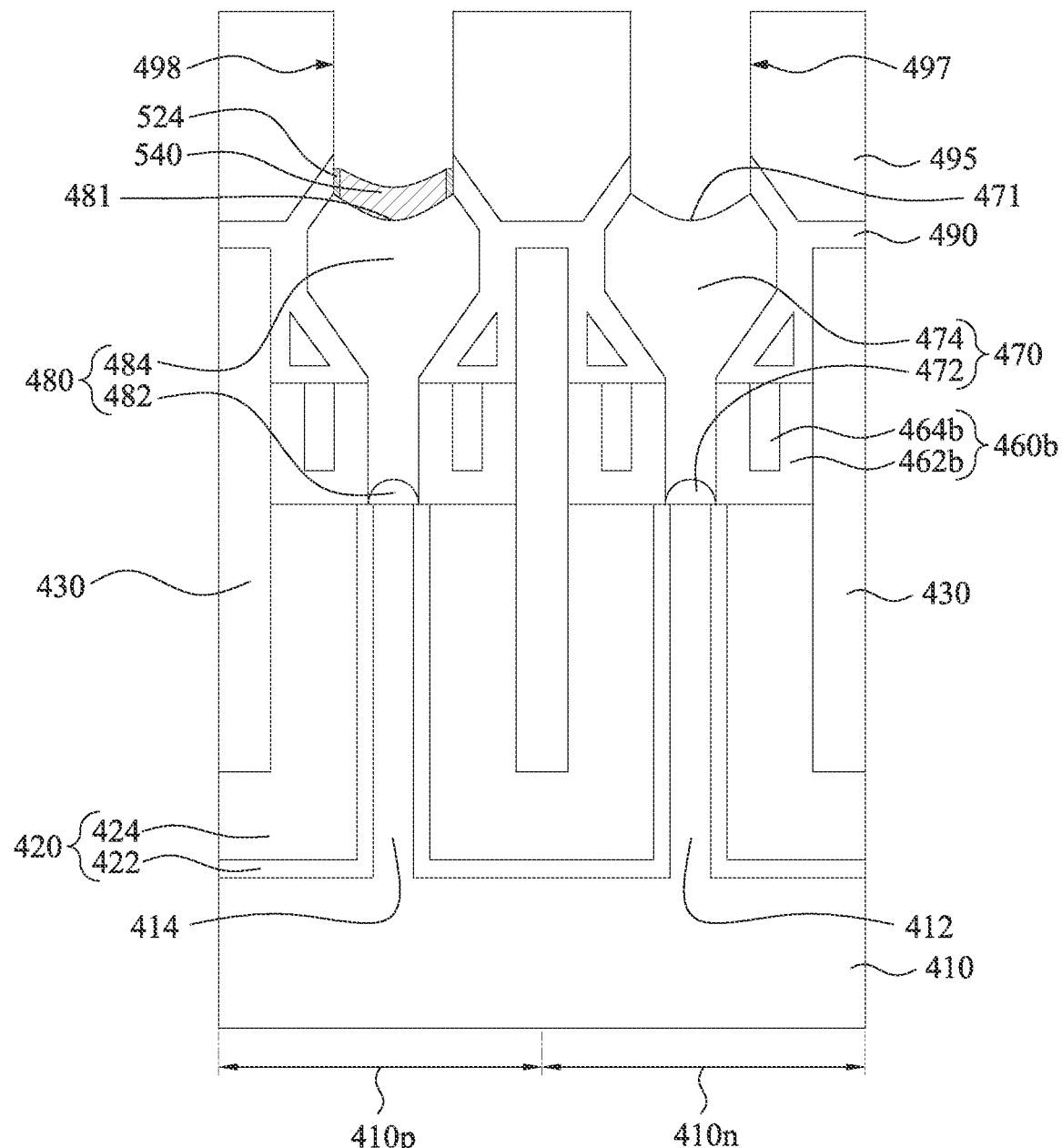

Reference is made to FIG. 34. An epitaxial layer 540 is formed above the top surface 481 of the epitaxial structure 480. In some embodiments, the formation of the epitaxial layer 540 is similar to the formation of the epitaxial layer 240 shown in FIG. 16. For example, similar to FIGS. 12-16, a first mask layer and a second mask layer are formed in the openings 497 and 498. The second mask layer is patterned to form first spacers on sidewalls of the opening 498. The first mask layer is patterned using the first spacers as etching masks to form second spacers on the sidewalls of the opening 498, such that the top surface 481 of the epitaxial structure 480 is exposed. The first spacers are removed, and the epitaxial layer 540 is formed above the epitaxial structure 480. The second spacers are then removed. In some embodiments, residues 524 are formed between the epitaxial layers 540 and the isolation structure (i.e., the CESL 190 and/or the ILD 195) as shown in FIG. 34. In some other embodiments, the second spacers are completely removed, such that top air gaps are formed between the epitaxial layers 540 and the isolation structure (i.e., the CESL 190 and/or the ILD 195) similar to the structure shown in FIG. 24. In still some other embodiments, top air gaps are formed above the residues 524 similar to the structure shown in FIG. 25. Materials, configurations, dimensions, processes and/or operations regarding the epitaxial layer 540 are similar to or the same as the epitaxial layer 240 of FIG. 16.

Figure 35:
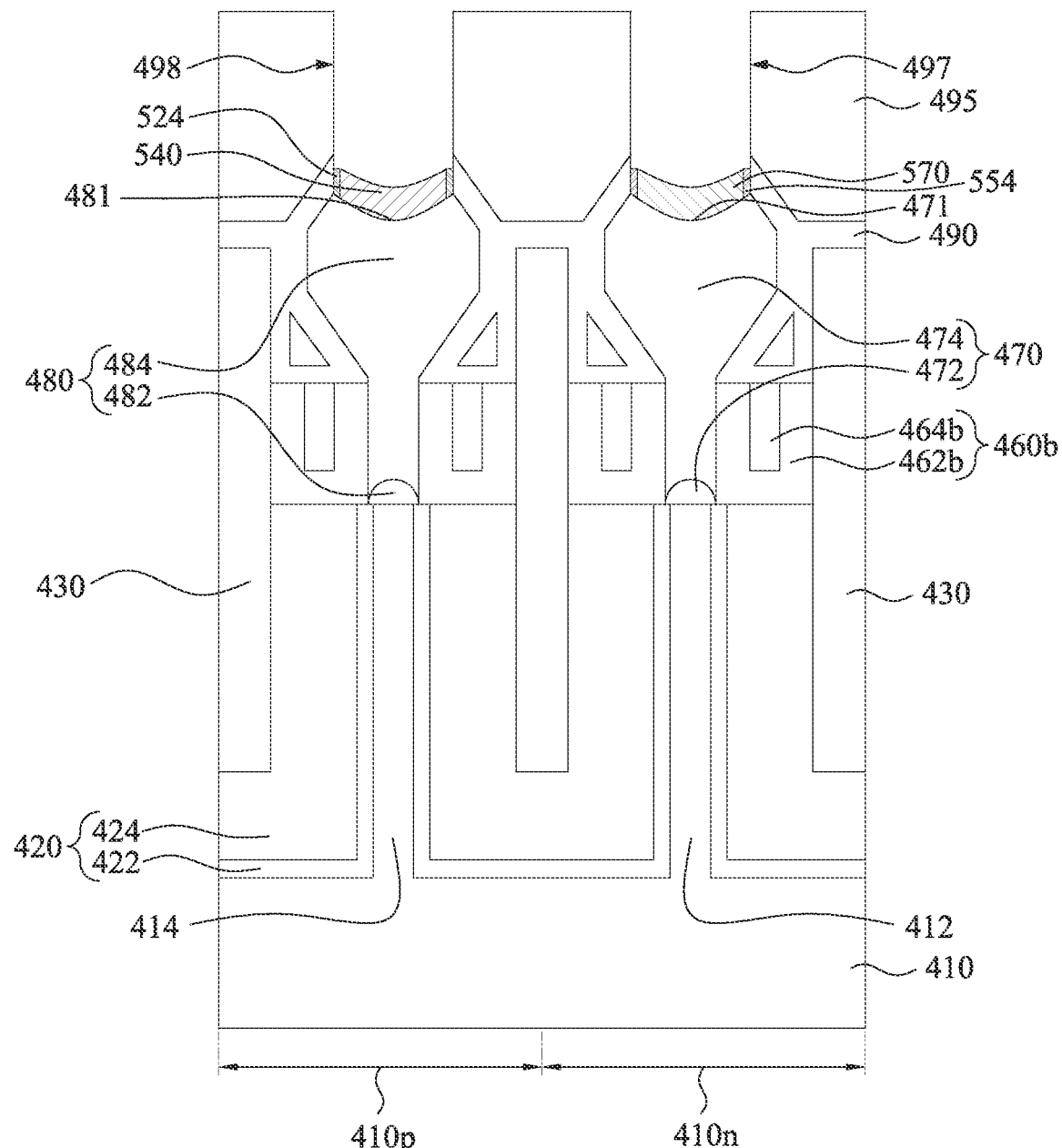

Reference is made to FIG. 35. An epitaxial layer 570 is formed above the top surface 471 of the epitaxial structure 470. In some embodiments, the formation of the epitaxial layer 570 is similar to the formation of the epitaxial layer 270 shown in FIG. 21. For example, similar to FIGS. 17-21, a third mask layer and a fourth mask layer are formed in the openings 497 and 498. The fourth mask layer is patterned to form third spacers on sidewalls of the opening 497. The third mask layer is patterned using the third spacers as etching masks to form fourth spacers on the sidewalls of the opening 497, such that the top surface 471 of the epitaxial structure 470 is exposed. The third spacers are removed, and the epitaxial layer 570 is formed above the epitaxial structure 470. The fourth spacers are then removed. In some embodiments, residues 554 are formed between the epitaxial layers 570 and the isolation structure (i.e., the CESL 190 and/or the ILD 195) as shown in FIG. 35. In some other embodiments, the fourth spacers are completely removed, such that top air gaps are formed between the epitaxial layers 570 and the isolation structure (i.e., the CESL 190 and/or the ILD 195) similar to the structure shown in FIG. 24. In still some other embodiments, top air gaps are formed above the residues 554 similar to the structure shown in FIG. 25. Materials, configurations, dimensions, processes and/or operations regarding the epitaxial layer 570 are similar to or the same as the epitaxial layer 270 of FIG. 21.

Figure 36A:
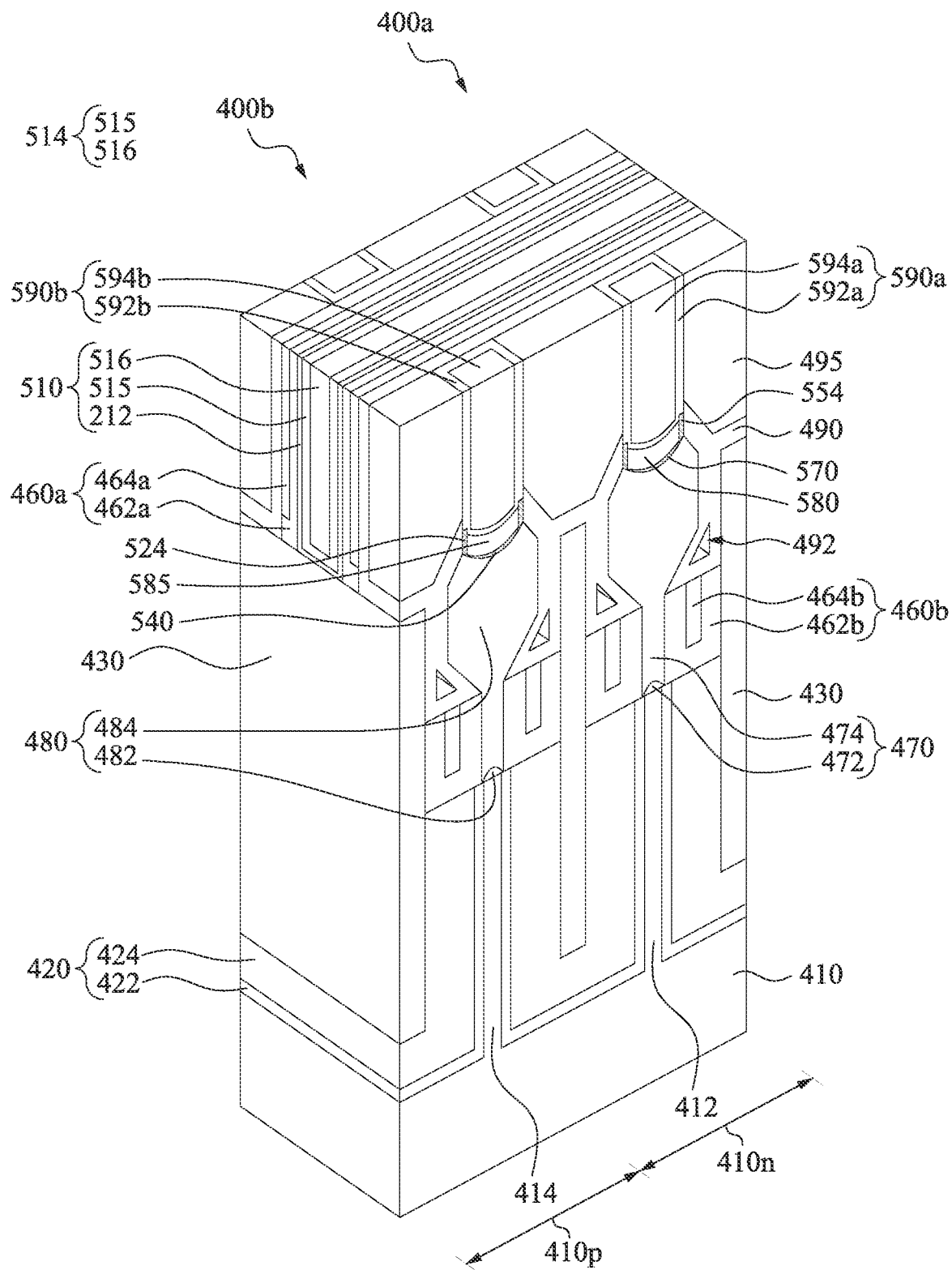
Figure 36B:
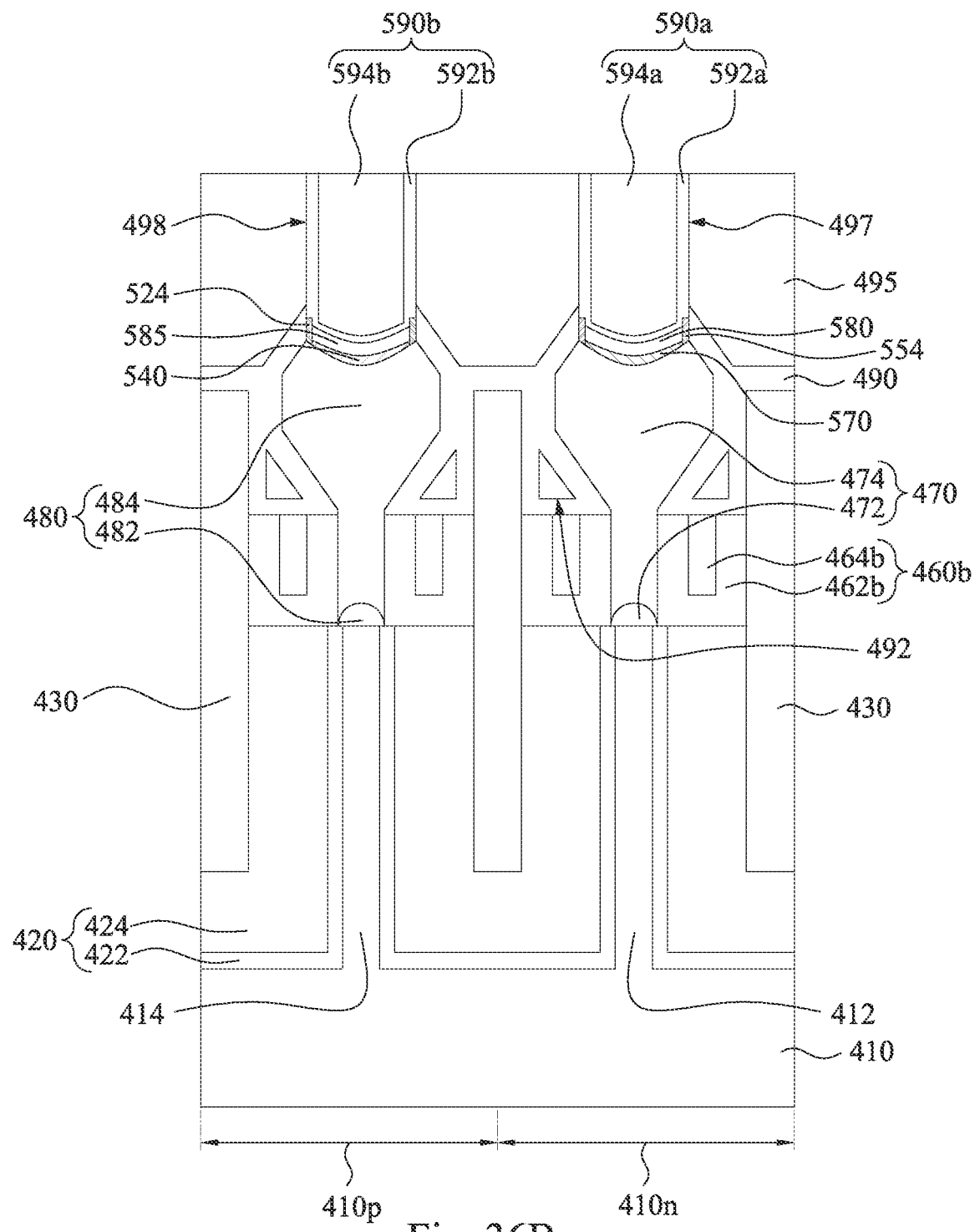

Reference is made to FIGS. 36A and 36B, where FIG. 36B is a side view of the semiconductor device in FIG. 36A. A first metal alloy layer 580 and a second metal alloy layer 585 are respectively formed above the epitaxial layer 570 and the epitaxial layer 540. The manufacturing processes of the first metal alloy layer 580 and the second metal alloy layer 585 are similar to or the same as the first metal alloy layer 280 and the second metal alloy layer 285 shown in FIG. 22, and, therefore, a description in this regard will not be repeated hereinafter.

Contacts 590a and 590b are then respectively formed above the first metal alloy layer 580 and the second metal alloy layer 585. The contact 590a includes a barrier layer 292a and a filling material 294a, and the contact 590b includes a barrier layer 292b and a filling material 294b. As such, the semiconductor device includes (HGAA) transistors 400a and 400b. The manufacturing processes of the contacts 590a and 590b are similar to or the same as the contacts 290a and 290b shown in FIGS. 23A and 23B, and, therefore, a description in this regard will not be repeated hereinafter.

Figure 37:
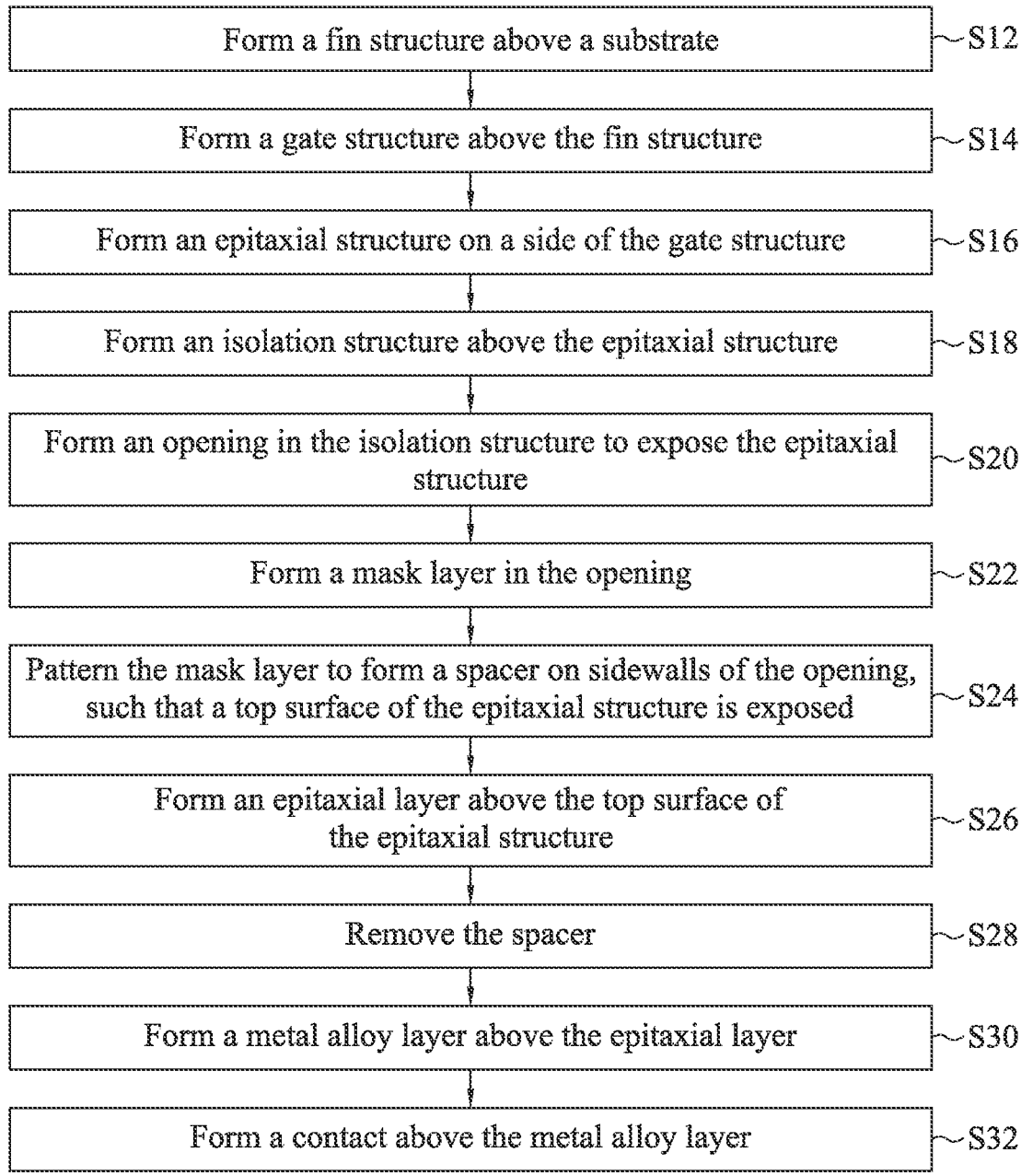
FIG. 37 is a flow chart of a method M for forming a semiconductor device in accordance with some embodiments of the present disclosure.

FIG. 37 is a flow chart of a method M for forming a semiconductor device in accordance with some embodiments of the present disclosure. Although the method M is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At block S12, a fin structure is formed above a substrate. In some embodiments, the fin structure is a semiconductor fin as shown in FIG. 1. In some other embodiments, the fin structure includes first and second semiconductor layers alternately stacked as shown in FIG. 27. FIGS. 1 and 27 illustrate perspective views of some embodiments corresponding to act in block S12. At block S14, a gate structure is formed above the fin structure. FIGS. 5 and 28 illustrate perspective views of some embodiments corresponding to act in block S14. At block S16, an epitaxial structure is formed on a side of the gate structure. FIGS. 8 and 32 illustrate perspective views of some embodiments corresponding to act in block S16. At block S18, an isolation structure is formed above the epitaxial structure. In some embodiments, the isolation structure includes a CESL and/or an ILD. FIGS. 9 and 32 illustrate perspective views of some embodiments corresponding to act in block S18. At block S20, an opening is formed in the isolation structure to expose the epitaxial structure. FIGS. 11A and 33A illustrate perspective views of some embodiments corresponding to act in block S20. At block S22, a mask layer is formed in the opening. FIGS. 12 and 17 illustrate side views of some embodiments corresponding to act in block S22. At block S24, the mask layer is patterned to form a spacer on sidewalls of the opening, such that a top surface of the epitaxial structure is exposed. FIGS. 14 and 19 illustrate side views of some embodiments corresponding to act in block S24. At block S26, an epitaxial layer is form above the top surface of the epitaxial structure. FIGS. 15 and 20 illustrate side views of some embodiments corresponding to act in block S26. At block S28, the spacer is removed. FIGS. 16 and 21 illustrate side views of some embodiments corresponding to act in block S28. At block S30, a metal alloy layer is formed above the epitaxial layer. FIG. 22 illustrates a side view of some embodiments corresponding to act in block S30. At block S32, a contact is formed above the metal alloy layer. FIGS. 23A, 23B, 36A, and 36B illustrate perspective views and side views of some embodiments corresponding to act in block S32.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the epitaxial layers 240 and 270 remain high activations and have high doping concentrations, such that the contact resistance between the contact and the epitaxial structure can be improved. Another advantage is that the mask layer has high etch selectivity with respect to the ILD and CESL, the patterning process of the mask layer does not damage the ILD and CESL.

According to some embodiments, a device includes an active region, a gate structure, an epitaxial structure, an epitaxial layer, a metal alloy layer, a contact, and a contact etch stop layer. The gate structure is across the active region. The epitaxial structure is above the active region and adjacent the gate structure. The epitaxial layer is above the epitaxial structure. The metal alloy layer is above the epitaxial layer. The contact is above the metal alloy layer. The contact etch stop layer lines sidewalls of the epitaxial structure. The metal alloy layer is spaced apart from the contact etch stop layer.

According to some embodiments, a device includes a fin structure, a gate structure, an epitaxial structure, a metal alloy layer, a contact etch stop layer, and a residue. The gate structure is above the fin structure. The epitaxial structure is above the fin structure. The metal alloy layer is above the epitaxial structure. The contact etch stop layer is conformal to sidewalls of the epitaxial structure. The residue is above the epitaxial structure and between the metal alloy layer and the contact etch stop layer.

According to some embodiments, a method includes forming a gate structure above an active region. An epitaxial structure is formed above the active region and adjacent the gate structure. An isolation structure is formed above the epitaxial structure. An opening is formed in the isolation structure to expose the epitaxial structure. A first mask layer is formed to line inner sidewalls of the isolation structure and a top surface of the epitaxial structure. The first mask layer is patterned to form a first spacer layer on the inner sidewalls of the isolation structure. An epitaxial layer is formed above the epitaxial structure. The first spacer layer is removed. A metal alloy layer is formed above the epitaxial layer. A contact is formed above the metal alloy layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   an active region;
   a gate structure across the active region and extending in a first direction;
   a source/drain epitaxial structure over the active region and adjacent the gate structure;
   an epitaxial layer over the source/drain epitaxial structure, wherein a maximal width of the epitaxial layer is less than a maximal width of the source/drain epitaxial structure in the first direction;
   a metal alloy layer over the epitaxial layer;
   a contact over the metal alloy layer; and
   a contact etch stop layer lining sidewalls of the source/drain epitaxial structure, wherein the metal alloy layer is spaced apart from the contact etch stop layer.

2. The device of claim 1, wherein the epitaxial layer is spaced apart from the contact etch stop layer.

3. The device of claim 1, wherein an air gap is defined by the contact etch stop layer, the contact, the metal alloy layer, and the source/drain epitaxial structure.

4. The device of claim 1, wherein a width of the contact is greater than a width of the epitaxial layer in the first direction.

5. The device of claim 1, wherein a width of the contact is greater than a width of the metal alloy layer in the first direction.

6. The device of claim 1, wherein the contact etch stop layer is in contact with the contact.

7. The device of claim 1, further comprising an interlayer dielectric over the contact etch stop layer and laterally surrounding the contact.

8. The device of claim 1, wherein a top surface of the source/drain epitaxial structure is wider than a bottom surface of the epitaxial layer.

9. A device comprising:
   a fin structure;
   a gate structure over the fin structure;
   a source/drain epitaxial structure above the fin structure;
   a metal alloy layer over the source/drain epitaxial structure;
   a contact etch stop layer conformal to sidewalls of the source/drain epitaxial structure; and
   a residue over the source/drain epitaxial structure and between the metal alloy layer and the contact etch stop layer, wherein a top surface of the residue is lower than a top surface of the contact etch stop layer.

10. The device of claim 9, wherein the residue is in direct contact with a top surface of the source/drain epitaxial structure.

11. The device of claim 9, wherein a top surface of the residue is higher than a top surface of the metal alloy layer.

12. The device of claim 9, further comprising a contact over the metal alloy layer.

13. The device of claim 12, wherein the contact comprises:
   a barrier layer; and
   a filling material over the barrier layer, wherein a portion of the residue is embedded in the barrier layer.

14. The device of claim 12, wherein an air gap is defined by the contact, the contact etch stop layer, the metal alloy layer, and the residue.

15. A device comprising:
- a semiconductive layer over a substrate;
- a gate structure over the substrate, surrounding the semiconductive layer and extending in a first direction;
- a source/drain epitaxial structure connected to the semiconductive layer;
- a contact over the source/drain epitaxial structure; and
- an epitaxial layer directly between the source/drain epitaxial structure and the contact, wherein a width of the contact is greater than a width of the epitaxial layer, and a maximal width of the epitaxial layer is less than a maximal width of the source/drain epitaxial structure in the first direction.

16. The device of claim 15, wherein a top surface of the source/drain epitaxial structure is concave.

17. The device of claim 15, wherein a bottom surface of the epitaxial layer is convex.

18. The device of claim 15, wherein the source/drain epitaxial structure and the epitaxial layer comprise substantially the same materials.

19. The device of claim 15, further comprising a metal alloy layer directly between the epitaxial layer and the contact.

20. The device of claim 15, further comprising a contact etch stop layer covering a sidewall of the source/drain epitaxial structure but spaced apart from the epitaxial layer.

* * * * *